United States Patent
Yun

(10) Patent No.: US 11,289,879 B2
(45) Date of Patent: Mar. 29, 2022

(54) SYSTEM AND METHOD FOR MICRO LASER PARTICLES

(71) Applicant: THE GENERAL HOSPITAL CORPORATION, Boston, MA (US)

(72) Inventor: Seok Hyun Yun, Belmont, MA (US)

(73) Assignee: THE GENERAL HOSPITAL CORPORATION, Boston, MA (US)

( * ) Notice: Subject to any disclaimer, the term of this patent is extended or adjusted under 35 U.S.C. 154(b) by 104 days.

(21) Appl. No.: 16/895,914

(22) Filed: Jun. 8, 2020

(65) Prior Publication Data
US 2020/0303900 A1    Sep. 24, 2020

Related U.S. Application Data

(63) Continuation of application No. 16/306,278, filed as application No. PCT/US2017/035923 on Jun. 5, 2017, now Pat. No. 10,707,649.
(Continued)

(51) Int. Cl.
*H01S 3/06* (2006.01)
*H01S 5/10* (2021.01)
(Continued)

(52) U.S. Cl.
CPC .......... *H01S 5/1067* (2013.01); *H01S 3/0604* (2013.01); *H01S 3/169* (2013.01);
(Continued)

(58) Field of Classification Search
CPC .......... H01S 5/1067; H01S 5/041; H01S 5/40; H01S 5/1075; H01S 5/36; H01S 3/169; H01S 3/213; H01S 3/0604; H01S 3/091
See application file for complete search history.

(56) References Cited

U.S. PATENT DOCUMENTS 5,248,772 A     9/1993  Siiman
9,502,227 B2 *  11/2016 Masujima .............. G01N 27/62
(Continued)

OTHER PUBLICATIONS

China National Intellectual Property Administration, Second Office Action and Search Report, Application No. 201780046509.1, dated Aug. 3, 2021, 30 pages.
(Continued)

*Primary Examiner* — Kinam Park
(74) *Attorney, Agent, or Firm* — Quarles & Brady LLP

(57) ABSTRACT

Disclosed are photonic particles and methods of using particles in biological samples. The particles are configured to emit laser light when energetically stimulated by, e.g., a pump source. The particles may include a gain medium with inorganic materials, an optical cavity with high refractive index, and a coating with organic materials. The particles may be smaller than 3 microns along their longest axes. The particles may attach to each other to form, e.g., doublets and triplets. The particles may be injection-locked by coupling an injection beam into a particle while pumping so that an injection seed is amplified to develop into laser oscillation. A microscopy system may include a pump source, beam scanner, spectrometer with resolution of less than 1 nanometer and acquisition rate of more than 1 kilohertz, and spectral analyzer configured to distinguish spectral peaks of laser output from broadband background.

30 Claims, 29 Drawing Sheets

Related U.S. Application Data

(60) Provisional application No. 62/345,070, filed on Jun. 3, 2016.

(51) Int. Cl.
  H01S 3/16 (2006.01)
  H01S 3/213 (2006.01)
  H01S 5/04 (2006.01)
  H01S 5/40 (2006.01)
  H01S 5/36 (2006.01)
  G01J 3/28 (2006.01)
  G01N 21/64 (2006.01)
  G01N 15/10 (2006.01)
  H01S 3/091 (2006.01)

(52) U.S. Cl.
  CPC .............. *H01S 3/213* (2013.01); *H01S 5/041* (2013.01); *H01S 5/1025* (2013.01); *H01S 5/1075* (2013.01); *H01S 5/36* (2013.01); *H01S 5/40* (2013.01); *G01J 2003/2826* (2013.01); *G01N 21/648* (2013.01); *G01N 2015/1006* (2013.01); *G01N 2021/6439* (2013.01); *H01S 3/091* (2013.01)

(56) References Cited

U.S. PATENT DOCUMENTS

| | | |
|---|---|---|
| 2006/0046312 A1 | 3/2006 | Kiesel |
| 2006/0123900 A1 | 6/2006 | Sugita |
| 2008/0159351 A1* | 7/2008 | Li ........................... H01S 3/213 372/53 |
| 2008/0204709 A1 | 8/2008 | Kiesel |
| 2008/0241262 A1* | 10/2008 | Lee ....................... B22F 1/0018 424/490 |
| 2009/0114273 A1 | 5/2009 | Kamat |
| 2011/0253909 A1 | 10/2011 | Himmelhaus et al. |
| 2011/0256577 A1 | 10/2011 | Himmelhaus |
| 2011/0266470 A1 | 11/2011 | Yun |
| 2012/0013909 A1* | 1/2012 | Podoleanu ......... G01B 9/02027 356/451 |
| 2013/0009119 A1 | 1/2013 | Natan |
| 2015/0076408 A1 | 3/2015 | Nurmikko |

OTHER PUBLICATIONS

Japan Patent Office, Notification of Reasons for Refusal, Application No. 2018-562936, dated Jul. 6, 2021, 6 pages.

Diaz, Jr, et al., The Molecular Evolution of Acquired Resistance to Targeted EGFR Blockade in Colorectal Cancers, Nature, 2012, 486(7404):537-540.

Dutta, et al., Myocardial Infarction Accelerates Atherosclerosis, Nature, 2012,487(7407):325-329.

European Patent Office, Extended European Search Report, Application No. 17807653.5, dated Jan. 14, 2020, 13 pages.

Hill, et al., Advances in Small Lasers, Nature Photonics, 2014, 8(12):908-918.

Hobson et al., Silicon Nitride Encapsulation of Sulfide Passivated GaAs/AlGaAs Microdisk Lasers, Journal of Vacuum Science & Technology A, 1995, 13(3):642-645.

Humar, et al., Intracellular Microlasers, Nature Photonics, 2015, 9(9):572-576.

Meacham, et al., Tumour Heterogeneity and Cancer Cell Plasticity, Nature, 2013, 501(7467):328-337.

Noginov, et al., Demonstration of a Spaser-Based Nanolaser, Nature, 2009, 460(7259):1110-1112.

Oulton, et al., Plasmon Lasers at Deep Subwavelength Scale, Nature, 2009, 461(7264):629-632.

PCT International Search Report and Written Opinion, PCT/US2017/035923, dated Oct. 2, 2017, 16 pages.

Waclaw, et al., A Spatial Model Predicts that Dispersal and Cell Turnover Limit Intratumour Heterogeneity, Nature, 2015, 525(7568):261-264.

Wagenblast, et al., A Model of Breast Cancer Heterogeneity Reveals Vascular Mimicry as a Driver of Metastasis, Nature, 2015, 520(7547):358-362.

Zhang, et al., Visible Submicron Microdisk Lasers, Applied Physics Letters, 2007, 90(11):111119, 3 pages.

China National Intellectual Property Administration. Notice of First Office Action for application 201780046509.1. dated Nov. 25, 2020 With translation 30 pages.

Schubert, M., et al. "Lasing within live cells containing intracellular optical microresonators for barcode-type cell tagging and tracking." Nano letters 15.8 (2015): 5647-5652.

European Patent Office, Office Action for Application No. 17807653.5. dated Dec. 12, 2021. 10 pages.

* cited by examiner

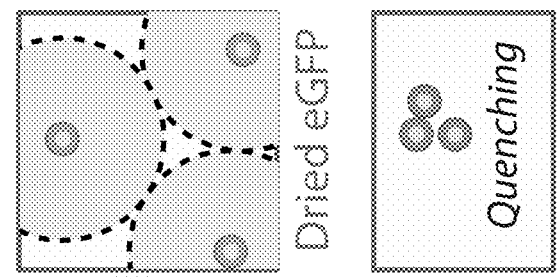
FIG. 7B
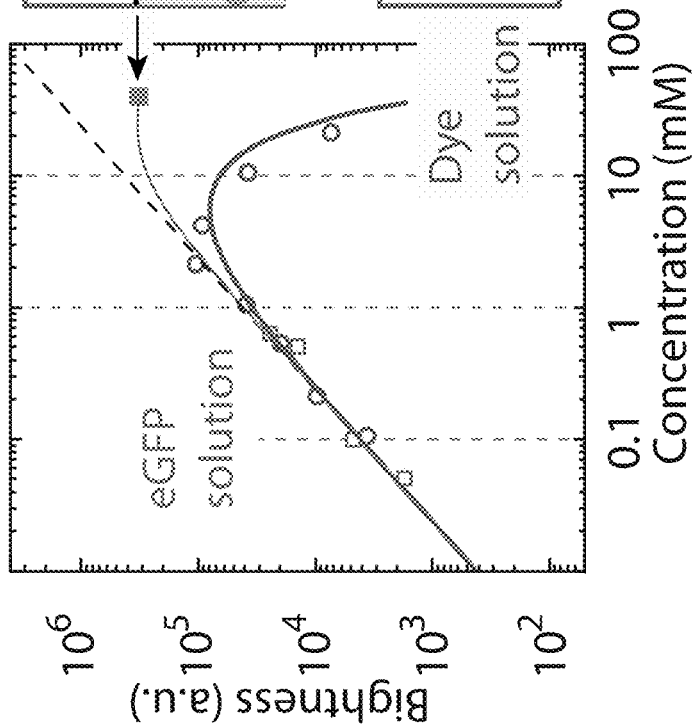
FIG. 7A
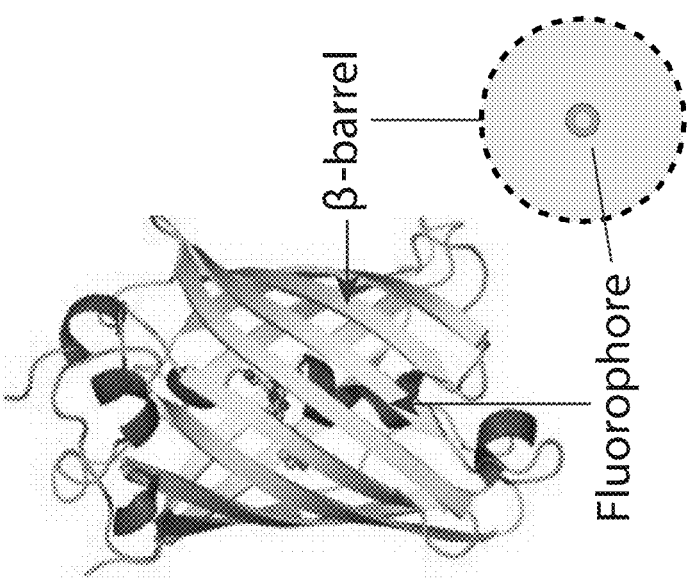

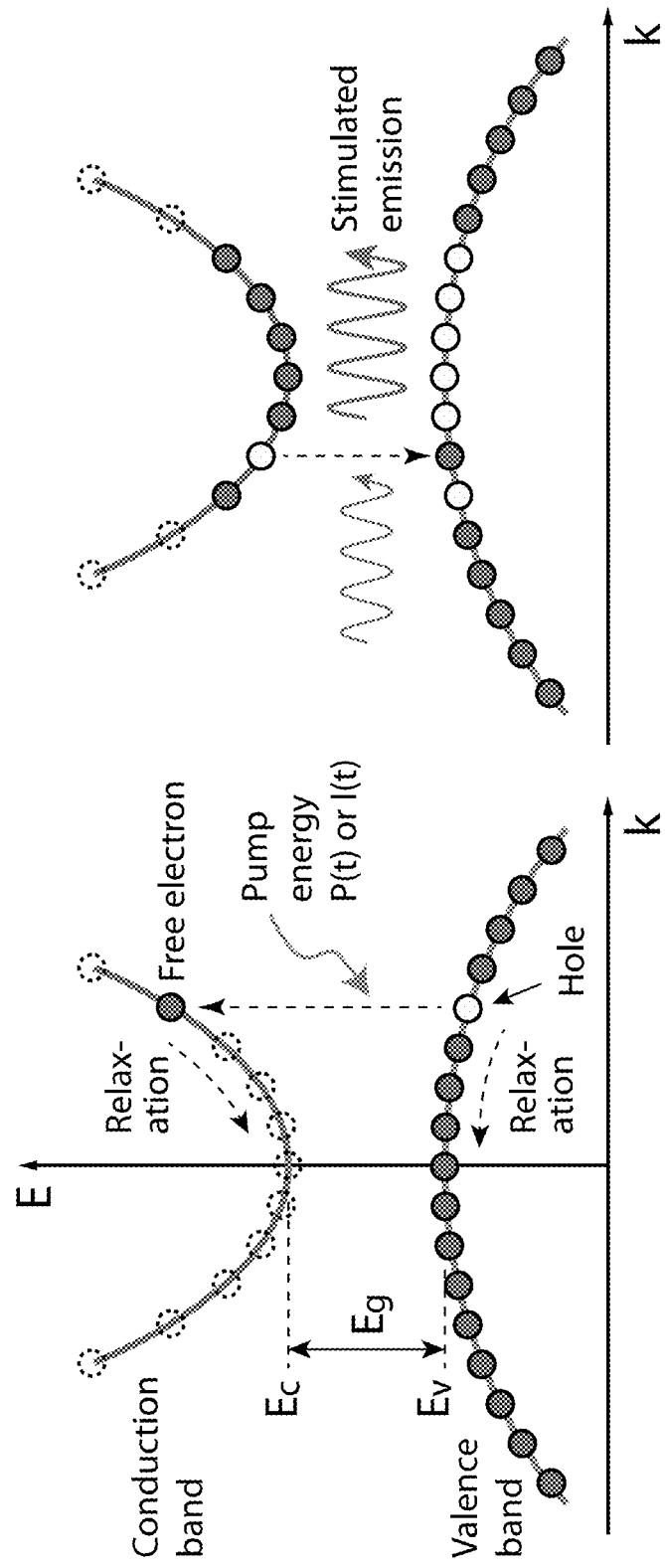

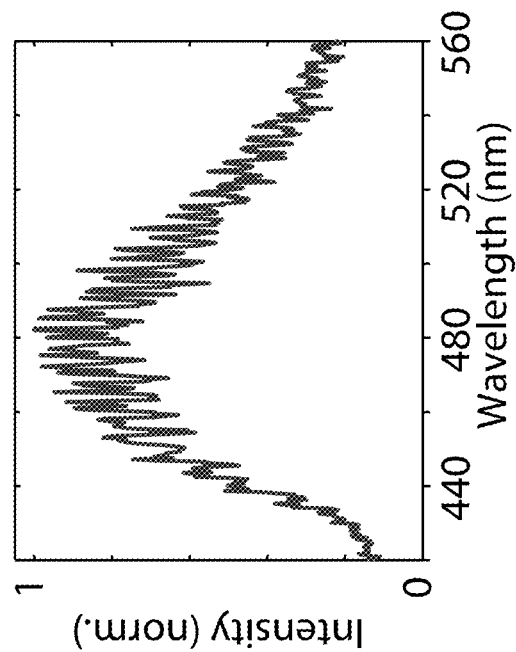
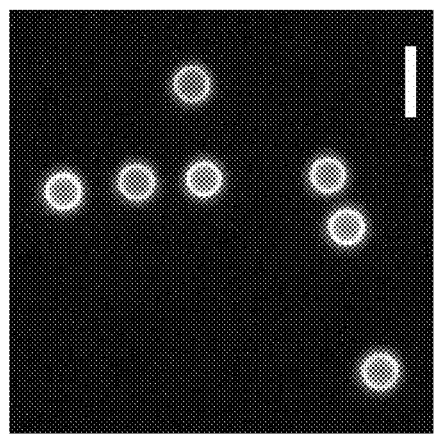
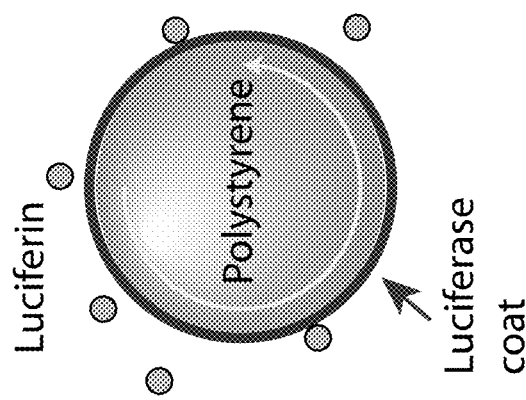
FIG. 13

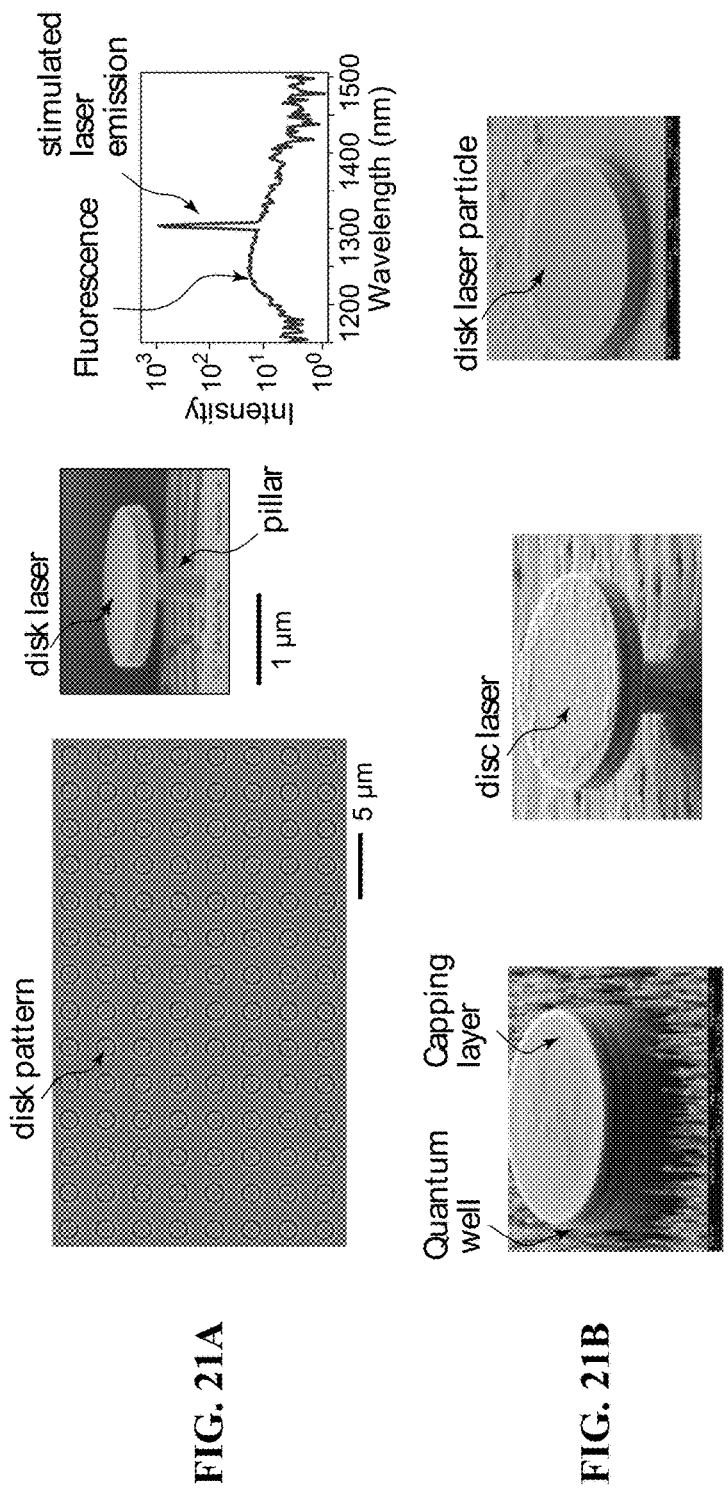
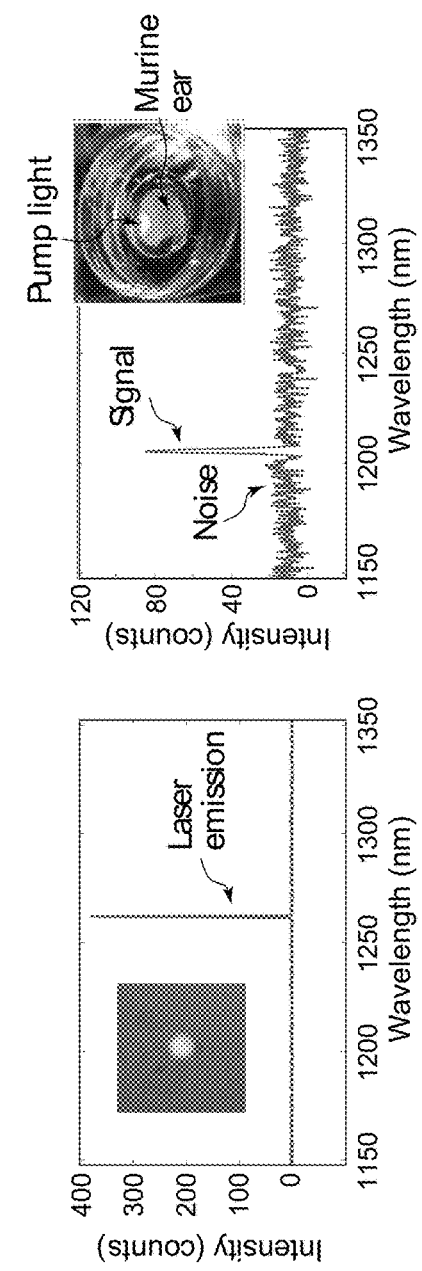
FIG. 21A
FIG. 21B
FIG. 21C

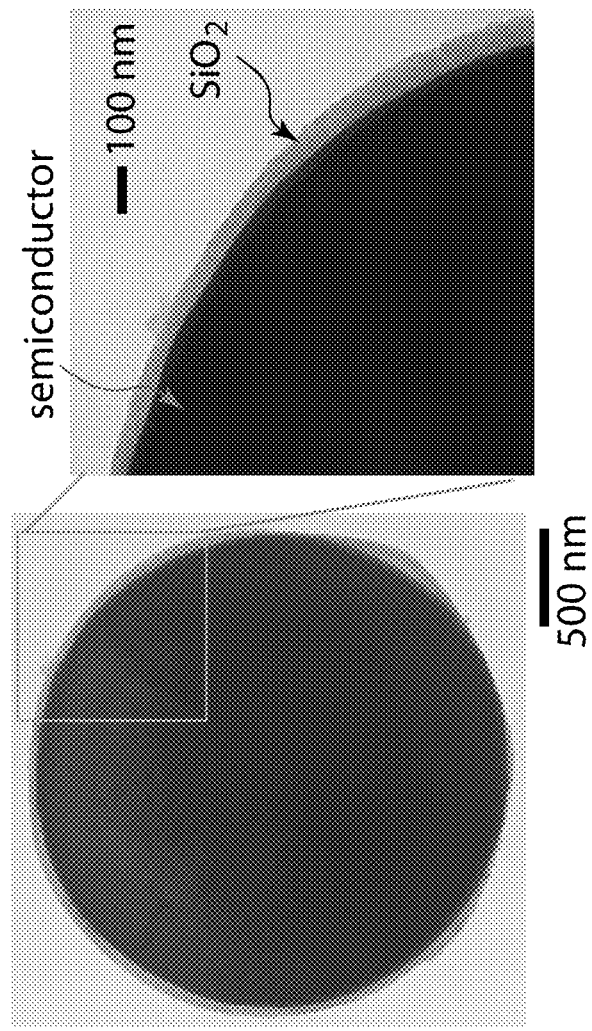
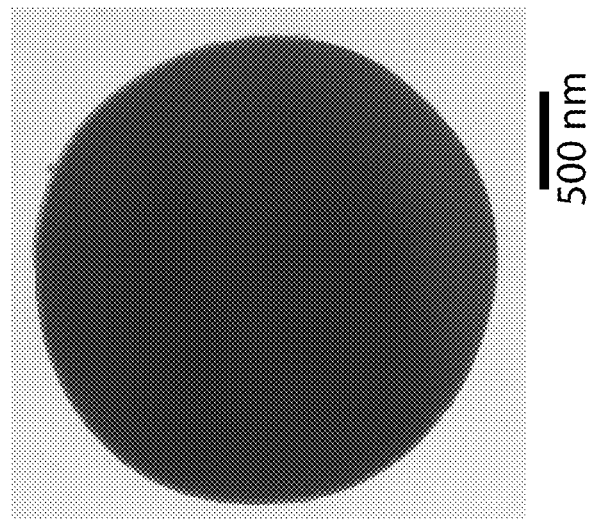
FIG. 25

SYSTEM AND METHOD FOR MICRO LASER PARTICLES

CROSS-REFERENCE TO RELATED APPLICATIONS

This application is a continuation of U.S. application Ser. No. 16/306,278 filed Nov. 30, 2018 which is a U.S. National Phase application of PCT/US2017/035923 filed Jun. 5, 2017 which is based on, claims priority to, and incorporates herein by reference in its entirety U.S. Provisional Application Ser. No. 62/345,070, filed Jun. 3, 2016, and entitled, "Laser Micro-Particles." The references cited in the above provisional patent application are also hereby incorporated by reference.

STATEMENT REGARDING FEDERALLY SPONSORED RESEARCH

This invention was made with government support under ECCS-1505569 awarded by the National Science Foundation, and under DP1-DB024242 awarded by the National Institutes of Health. The government has certain rights in the invention.

FIELD OF THE INVENTION

This document concerns an invention relating generally to miniature lasers that can be embedded, implanted, or injected into samples such as biological cells and tissues, and more specifically, to optically excitable laser particles made of organic and inorganic materials, and the fabrication, functionalization, delivery, and imaging of the laser particles, and their use as probes for massively parallel imaging, sensors, and assays.

BACKGROUND

Fluorescent probes, such as dyes, fluorescent proteins and quantum dots, have become indispensable tools in biomedical imaging, cell sorting, immuno-histology, high-throughput screening, and numerous other biochemical measurements. Although these luminescent probes are immensely useful, their relatively broad emission spectra, typically 30-100 nm, limit the number of probes that can be simultaneously used without ambiguity and often make their spectra indistinguishable from the background emission of endogenous molecules in tissues. Conventional fluorescence microscopes are equipped to resolve 3 to 4 dyes, and state-of-the-art cytometry is limited to eleven channels. Multiplexing four different dyes can give 16 ($=2^4$) combinations. Simultaneous expression of three genes encoding blue, green, and red fluorescent proteins at different ratios in cells, as in Brainbow and RGB marking, can generate hundreds of colors. However, the transfection is stochastic, and the fidelity of color reading is prone to noise. To date, the number of fluorescence colors for imaging has been limited to less than a dozen.

It is fundamentally challenging to engineer fluorophores for much narrower emission linewidth because of the quantum-mechanical broadening of the electronic levels in molecules. The irregular shapes and thermodynamic fluctuations resulted in spectral broadening of emission from semiconductor quantum dots. The attenuation of plasmonic electron oscillations in metallic nanoparticles resulted in emission widths of >50-100 nm. By comparison to these electronic resonance, optical resonance offers effective approaches to generate narrow emission lines. A laser is a great example. By placing fluorophores and semiconductor materials inside an optical cavity, an extremely narrow spectral line can be produced. The output of a single-frequency laser can be a millionth of nanometer in wavelength, tunable over the entire gain width by changing the cavity resonance.

SUMMARY OF THE PRESENT DISCLOSURE

The present disclosure provides example photonic particles comprising at least one gain medium and at least one optical cavity, and having their largest dimension not substantially greater than 3 µm in preferred implementations, or no greater than 2 µm in other preferred implementations. The gain medium contains a sufficient number of gain elements, such as fluorophores and electron-hole pairs, and the cavity has a sufficiently low optical loss so that when the gain medium is excited or stimulated by pump light at sufficiently strong intensity levels, the gain elements emit light that exhibit spectral characteristics defined by the optical resonance modes of the cavity. The particles may be made of semiconductor materials with appropriate shapes and structures, such as quantum well structures, spherical shapes, or multiplayer Bragg reflectors. Alternatively, the particles may be configured with fluorescent gain molecules, high reflective-index dielectric resonators, and potentially metals.

Example laser particles have an output emission spectra with one or plural peaks with each linewidth narrower than 5 nm in preferred implementations, and typically less than 1 nm or even 0.3 nm in other preferred implementations. The peaks are primarily determined by the resonance of the optical cavity in the particles. The center wavelength of the output spectra may cover the entire visible and near-IR range, for example, from 400 to 1900 nm.

In one aspect, the present disclosure provides an optical system comprising at least one pump light source to excite the laser particles and at least one detection arrangement. The detection arrangement comprises spectral resolving elements, such as diffraction granting and dichroic filters. The pump source includes pulsed lasers with pulse widths in the range from 100 fs to 10 ns.

A specific preferred embodiment for laser particles includes quantum-well micro disk lasers, standalone surface emitting Bragg reflector semiconductor lasers, semiconductor spheres, all with diameters or lengths in the range of 500 nm to 3 µm.

The foregoing and other advantages of the disclosure will appear from the following description. In the description, reference is made to the accompanying drawings, which form a part hereof, and in which there is shown by way of illustration a preferred embodiment of the disclosure. Such embodiment does not necessarily represent the full scope of the disclosure, however, and reference is made therefore to the claims and herein for interpreting the scope of the disclosure.

The foregoing and other aspects and advantages of the present disclosure will appear from the following description. In the description, reference is made to the accompanying drawings that form a part hereof, and in which there is shown by way of illustration one or more exemplary versions. These versions do not necessarily represent the full scope of the invention.

BRIEF DESCRIPTION OF THE DRAWINGS

The present disclosure will hereafter be described with reference to the accompanying drawings, wherein like reference numerals denote like elements.

FIG. 7A relates to fluorescent proteins, illustrating the chemical structure of GFP. The fluorophore (inset) is protected within the beta barrel providing many desirable properties such as stability against environment.

FIG. 7B illustrates fluorescence intensity of aqueous eGFP solutions (□) with different concentrations and of a thin film of solid-state eGFP (at 40 mM, ■). Fluorescence of a synthetic pyrromethene dye (○). All data normalized to sample thickness and corrected for excitation depletion. Black dashed line, linear fit at low concentration (with no concentration quenching). Green and pink lines, Forster-type quenching model for eGFP and aggregation-induced quenching model for pyrromethene dye, respectively.

FIG. 8A illustrates an energy-momentum diagram (or E-k diagram), which relates the potential energy and momentum of the carrier, for a direct semiconductor lattice. Excitation of an electron to the conduction band by pumping creates a hole in the valence band.

FIG. 8B illustrates stimulated emission by recombination of a free electron in the conduction band and a hole in the valence band.

FIG. 13 depicts bioluminescence powered microresonators. When luciferin reacts with the luciferase attached to the surface of the bead it generates light, part of which is coupled into the whispering gallery cavity modes (left). Light emission from luciferase coated beads is shown (middle). Optical modes are clearly observed in the spectrum of the emitted light (right).

FIG. 21A provides a scanning electron microscope (SEM) image of example near-infrared InGaAsP micro-lasers (200 nm×1.8 μm, on a partially removed sacrifice pillar) on the left, in accordance with one or more implementations; an example micro-laser wafer after partial etching, showing the feasibility of producing numerous laser particles from a single wafer, in accordance with one or more implementations; output spectra from a 200 nm×1.8 μm disk in water and in air, with threshold pump energy of ~5 pJ (10 ns, $\lambda_p$=980 nm) (right). In the right panel, the linewidth is only 1/1000 of the gain bandwidth. A thermal analysis predicts negligible heating by energy up to 10 nJ deposited in 10 μm², in accordance with one or more implementations.

FIG. 21B provides scanning electron micrographs of a microdisk laser with three InAlGaAs quantum well layers: after e-beam lithography and ion beam etching (left); after partial wet etching, leaving a pillar (middle); and after full etching (right), in accordance with one or more implementations. The isolated, disk laser particle displayed (right) has a thickness of 200 nm and a diameter of about 2.3 μm.

FIG. 21C illustrates, on the left, lasing from a separated disk on a plastic dish, in accordance with one or more embodiments. On the right is provided output spectrum from another disk laser collected through a murine ear skin (thickness of ~500 μm), in accordance with one or more implementations.

FIG. 25 provides SEM images of example two microdisks coated with silica layers of different thicknesses, in accordance with one or more implementations.

DETAILED DESCRIPTION OF THE PRESENT DISCLOSURE

Before the present invention is described in further detail, it is to be understood that the invention is not limited to the particular embodiments described. It is also to be understood that the terminology used herein is for the purpose of describing particular embodiments only, and is not intended to be limiting. The scope of the present invention will be limited only by the claims. As used herein, the singular forms "a", "an", and "the" include plural embodiments unless the context clearly dictates otherwise.

It should be apparent to those skilled in the art that many additional modifications beside those already described are possible without departing from the inventive concepts. In interpreting this disclosure, all terms should be interpreted in the broadest possible manner consistent with the context. Variations of the term "comprising" should be interpreted as referring to elements, components, or steps in a non-exclusive manner, so the referenced elements, components, or steps may be combined with other elements, components, or steps that are not expressly referenced. Embodiments referenced as "comprising" certain elements are also contemplated as "consisting essentially of" and "consisting of" those elements.

Figure 1:
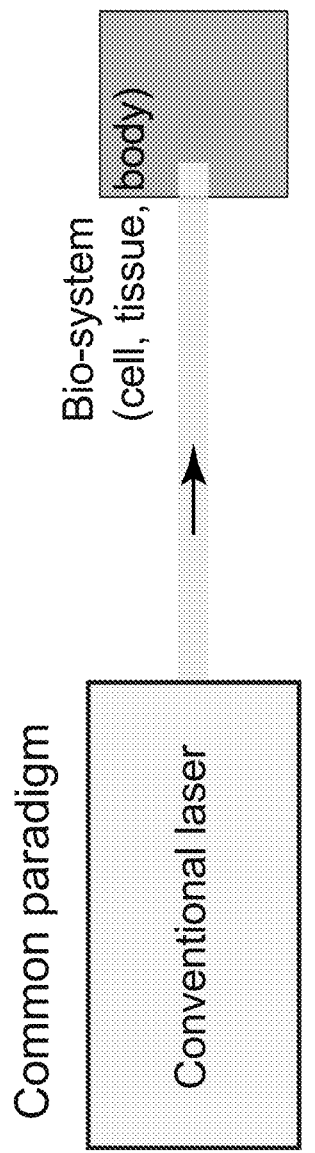
FIG. 1 is an illustration of conventional utilities of lasers, where a laser is placed outside the biological system.

The standard paradigm of using light to characterize or manipulate samples in biomedical applications, as depicted in FIG. 1, gives rise to several practical and conceptual limitations. For example, light undergoes scattering and absorption when propagating in biological tissues, so its 1/e penetration depth is no more than 3 mm in the visible and near-infrared ranges. This causes difficulties in the delivery of light into tissues beyond optical penetration and limits the clinical utilities of light. Also, when lasers are merely used as an illuminator, the interaction between the light source and biological system is one-way; the laser affects the sample, but not vice versa.

Figure 2:
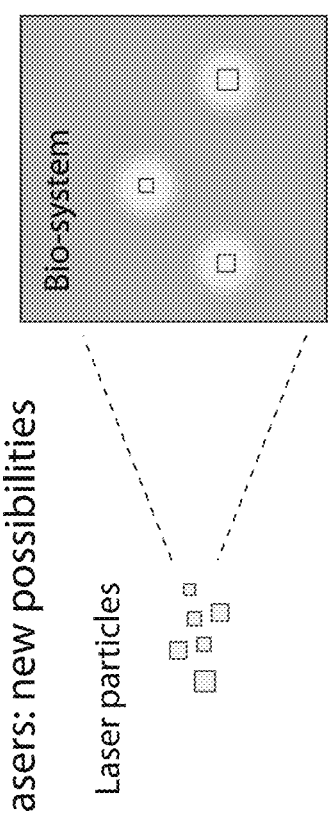
FIG. 2 is an illustration of biomedical use of laser particles. Small biocompatible laser particles are injected in a system. Such lasers can allow new approaches in imaging, diagnosis, and therapies, and allow two-way interactions with the biological system. As extended concepts, a biological sample may be incorporated into a laser so that changes in the specimen are reflected in the output emission of the laser. Further, lasers may be made entirely of biological matters to realize "living" lasers that are self-powered, operated, and maintained.

Lasers that are biocompatible and miniaturized to the size of a cell (or smaller) can be used inside a living system by being implanted in the body for certain duration, or injected into tissues and remotely operated. This new paradigm involves delivering light sources physically to the target. Referring to FIG. 2, such laser "particles" could serve as internal light sources that can solve at least some of the practical problems of lasers used for external light delivery, such as penetration depths, and enables new ways of using light for phototherapy. Moreover, laser particles embedded in tissues can be made to interact with their local environment in various ways, allowing for two-way interactions.

Not only can laser light influence the biomedical environment, but the living system can also affect the laser, changing its output characteristics. This capability may be harnessed to improve diagnosis and health monitoring.

A laser is comprised of three elements: a gain medium, a cavity, and pump energy source. Optical amplification in the gain medium is essential to generate stimulated emission. An amplifier with sufficient gain and long propagation length can generate amplified spontaneous emission. Although this process can generate output with laser-like characteristics, such as spectral narrowing, a narrow definition of laser requires optical feedback by a cavity. The cavity confines and makes resonance of light.

In addition to optical or photonic cavities, other type of cavities for quasiparticles, such as polaritons and plasmons, may be used to enable lasers. Polariton lasers based on exciton polaritons is a representative example of "non-photonic" lasers. The mechanism of polariton lasers is typically described in the context of the Bose-Einstein condensation of polariton. Surface plasmon amplification by stimulated emission of radiation or "spaser" commonly involves a metallic cavity for free electrons or plasmonic resonance.

Figure 3A:
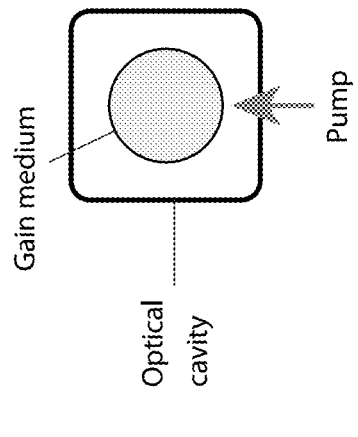
FIG. 3A illustrates fluorescence emission from a pumped gain medium of a laser particle. Red arrows indicate fluorescence light.
Figure 3B:
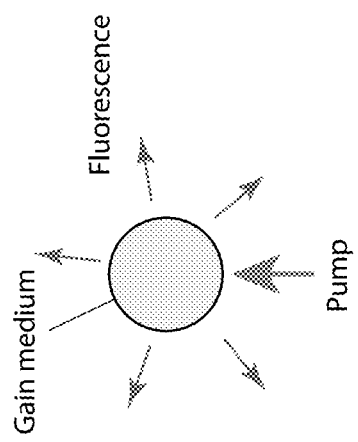
FIG. 3B illustrates the gain medium of FIG. 3A situated in an optical cavity in forming a laser particle.
Figure 3C:
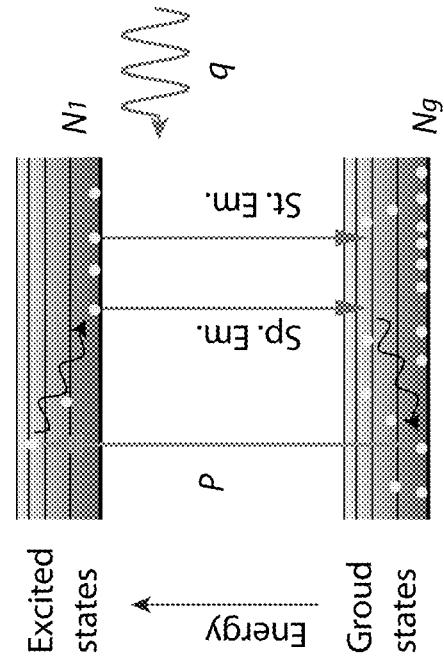
FIG. 3C illustrates spontaneous and stimulated light emission from the gain medium in the cavity illustrated in FIG. 3B. The red line in the cavity represents an intracavity cavity mode.

Consider a gain medium containing active gain elements, such as dye molecules in aqueous solution or semiconductor atoms assembled in a solid-state crystal. FIG. 3A illustrates a gain medium where the gain elements are excited by a pump source, such as an excitation laser, to higher-energy states, from which they emit fluorescence while returning to the original ground states. In FIGS. 3B and 3C, the same gain medium is now placed inside an optical cavity, and with pumping at a rate of P, part of the fluorescence light is captured in the cavity and the intracavity light is amplified by stimulated emission. Provided there is sufficient single-pass gain and sufficient passage through the gain medium, the intracavity light develops into laser emission. Whereas spontaneous fluorescence emission is radiated in all directions, the laser emission exits the cavity with specific intensity patterns determined by the cavity. For small cavities with sizes comparable to the optical wavelength, however, the directionality in the output coupling is less pronounced, and the laser would behave like a point source for both spontaneous and stimulated emission.

Figure 3D:
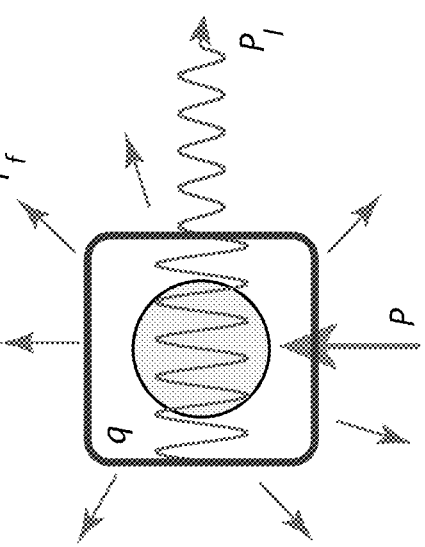
FIG. 3D depicts an exemplary energy diagram of gain elements (yellow circles) with two groups of energy levels or bands. Pumping excites gain elements to higher electronic states, from which the gain elements relax to the ground states, emitting either spontaneous or stimulated emission. Although two electronic states are depicted in this diagram, considering the non-radiative transitions within each band of electronic states this gain medium forms a quasi-four level system.

FIG. 3D depicts the pumping and emission processes in the gain medium using an energy diagram of the electronic states of the gain elements, such as fluorophores, electrons in semiconductors, or ions in crystals. Gain elements are initially populated in the ground states, which typically consist of many vibrational states that are either discrete or in continuum. The gain elements that absorb pump energy are excited to the excited states, then accumulated in the lower energy levels of the excited states through non-radiative intra-band transitions, and then undergo either spontaneous emission or stimulated emission upon interacting with intracavity photons.

Simplified rate equations describing a laser particle in this type of four-level gain medium can be written as:

$$\frac{dN_1(t)}{dt} = P(t) - \frac{\beta N_1(t)q(t)}{\tau_s} - \frac{N_1(t)}{\tau_s} \tag{1}$$

$$\frac{dq(t)}{dt} = \frac{\beta N_1(t)q(t)}{\tau_s} + \frac{\beta N_1(t)}{\tau_s} - \frac{q(t)}{\tau_c} \tag{2}$$

Here, $N_1(t)$ is the number of excited fluorophores in the gain medium, q(t) the number of photons in laser cavity modes, P(t) the pump rate, $\tau_s$ the spontaneous emission (fluorescence) lifetime of the gain molecules, and $\beta$ the spontaneous emission factor that describes the fraction of spontaneous emission captured by laser modes. $1/\tau_s$ corresponds to the spontaneous emission rate for all possible radiation modes in all frequencies and directions; thus, $\beta/\tau_s$ represents the rate of spontaneous emission coupled into the laser modes. The stimulated transition rate is proportional to the number of cavity modes, and equal to the spontaneous transition rate of the cavity modes multiplied by the number of photons: $\beta N_1(t)q(t)/\tau_s$.

For optical pumping, the pump rate can be expressed as:

$$P(t) = QY \cdot \frac{\sigma_a I_p(t)}{h\nu_p} N_g(t) \quad (3)$$

where QY is the quantum yield that specifies the probability of one absorbed photon to generate one photon via either spontaneous or stimulated emission, $\sigma_a$ is the absorption cross-section of the gain elements, and $N_g(t)$ is the number of gain elements in the ground state. In most cases including the situation in FIG. 3D, the sum of $N_g(t)$ and $N_1(t)$ is equal to the total number of gain elements $N_{tot}(t)$, which can be either constant or vary in time.

In Eq. (3), the intensity of pump light was assumed to be space invariant. This assumption is valid for laser particles with sizes much smaller than the size of the pump beam. For larger lasers with non-uniform pump, the pump rate is not solely determined by the peak pump power but also an overlap between the pump intensity profile and the laser mode profiles.

The output emission rate of the cavity modes $P_l(t)$ and spontaneous fluorescence emission $P_f(t)$ are given by:

$$P_l(t) = \frac{dq_l(t)}{dt} = \frac{q(t)}{\tau_c} \quad (4)$$

$$P_f(t) = \frac{dq_f(t)}{dt} = \frac{(1-\beta)N_1(t)}{\tau_s} \quad (5)$$

where $q_l(t)$ and $q_f(t)$ are the numbers of emitted photons of the laser modes and fluorescence emission, respectively. It follows that at $P(t)=P_l(t)+P_f(t)$, which states the conservation of the number of photons (given by the definition of P(t)).

Steady state ($t \gg \tau_s$): When the laser is in the steady-state state, (i.e. $dN_1/dt=dq_l/dt=0$), we obtain $$P_l(t) = \frac{P_{th}}{2} \cdot \left\{ \frac{P(t)}{P_{th}} - 1 + \sqrt{\left(\frac{P(t)}{P_{th}} - 1\right)^2 + 4\beta \frac{P(t)}{P_{th}}} \right\} \quad (6)$$

$$P_f(t) = 2(1-\beta)P(t) \cdot \left\{ \frac{P(t)}{P_{th}} + 1 + \sqrt{\left(\frac{P(t)}{P_{th}} - 1\right)^2 + 4\beta \frac{P(t)}{P_{th}}} \right\}^{-1} \quad (7)$$

where $$P_{th} = (\beta\tau_c)^{-1}. \quad (8)$$

Figure 4B:
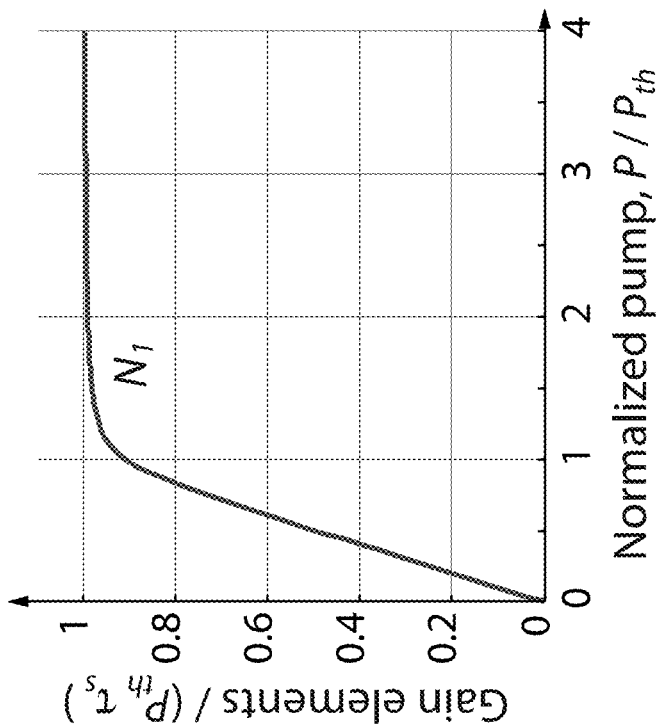
FIG. 4B illustrates the number of gain elements, which is expressed as $N_1=P_{th} \tau_s \cdot q/(1+q)$ according to Eq. (2) below, or equivalently, $N_1=P_f \tau_s \cdot /(1-\beta)$ from Eq. (5).
Figure 4A:
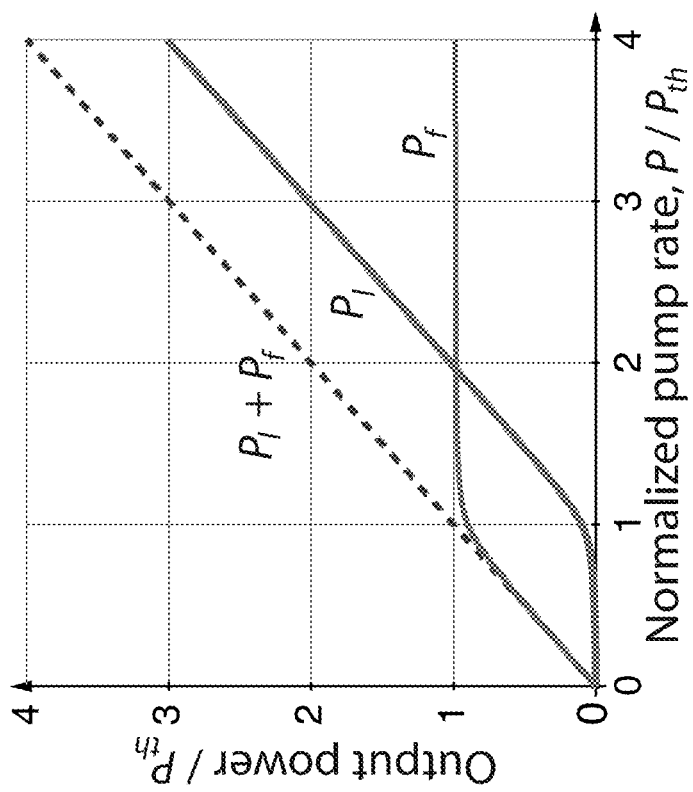
FIG. 4A depicts the numerically calculated output rates of laser modes, $P_l$, and spontaneous emission, $P_f$, in the steady state, for $\beta=0.01$. The laser output increases nonlinear near the threshold; the sharpness of the threshold increases with decreasing $\beta$. Numerical calculation for the steady state. (a) The output rates of laser modes, $P_l$, and spontaneous emission, $P_f$, in the steady state, for $\beta=0.01$. The laser output increases nonlinear near the threshold; the sharpness of the threshold increases with decreasing $\beta$.

FIGS. 4A and 4B show the plot of the stimulated and spontaneous output emission rates as a function of the pump rate. From the graphs, it is apparent that $P_{th}$ corresponds to the pump rate at the threshold of laser modes.

Laser oscillation enhances the "recycling" rate of the gain elements. Below the laser threshold, the number of excited elements $N_1$ increases linearly with the pump rate, unless gain saturation occurs; i.e. $N_1$ becomes comparable to $N_{tot}$ (FIG. 4B). Above the threshold, $N_1$ is clamped to a constant level, regardless of the pump rate, so that the optical gain is equal to the cavity loss; i.e. the net gain of the laser is unity. As the pump increases, the intensity of intracavity light increases and so does the rate of stimulated emission. This process brings the excited gain elements to the ground states at the increased rate. This enhanced relaxation rate balances with the pump rate, resulting in a constant number of gain elements in the excited state and constant optical gain. As a result, the effective lifetime of the excited states is reduced as the pump rate increases above the threshold.

Transient Build-Up State:

The governing equations, (1) and (2), describe the dynamics of laser oscillation. A necessary condition for the build-up of laser modes is $dq(t)/dt>0$ (at t=0; q=0), from which the minimum number of gain elements in the excited state should satisfy:

$$N_1(t) > \tau_s/\beta\tau_c \quad (9)$$

Consider situations where the pump energy is provided for duration of $\tau_p$ with a uniform rate. For q=0 (below threshold) and the square-profile pump pulses, the solution of Eq. (1) is:

$$N_1(t=0) = P\tau_s[1-\exp(-\tau_p/\tau_s)] \quad (10)$$

The pump rate required to reach the threshold condition in Eq. (9) is:

$$P_{th,\tau_p} = (\beta\tau_c)^{-1} \cdot [1 - \exp(-\tau_p/\tau_s)]^{-1} \quad (11)$$

For the case of quasi-continuous pumping ($\tau_p \gg \tau_s$), we confirm Eq. (8): $P_{th}=(\beta\tau_c)^{-1}$; the pump power at the lasing threshold is independent of the pulse duration, and the threshold pulse energy is proportional to the pulse duration. On the other hand, for the case of short-pulse pumping ($\tau_p \ll \tau_s$), we find $P_{th}=(\beta\tau_c)^{-1}\cdot\tau_s/\tau_p$; the pump power increases as the pulse width decreases, and the threshold pump energy, $P_{th}\tau_p$, is independent of the pump pulse duration.

Figures 5A, 5B:
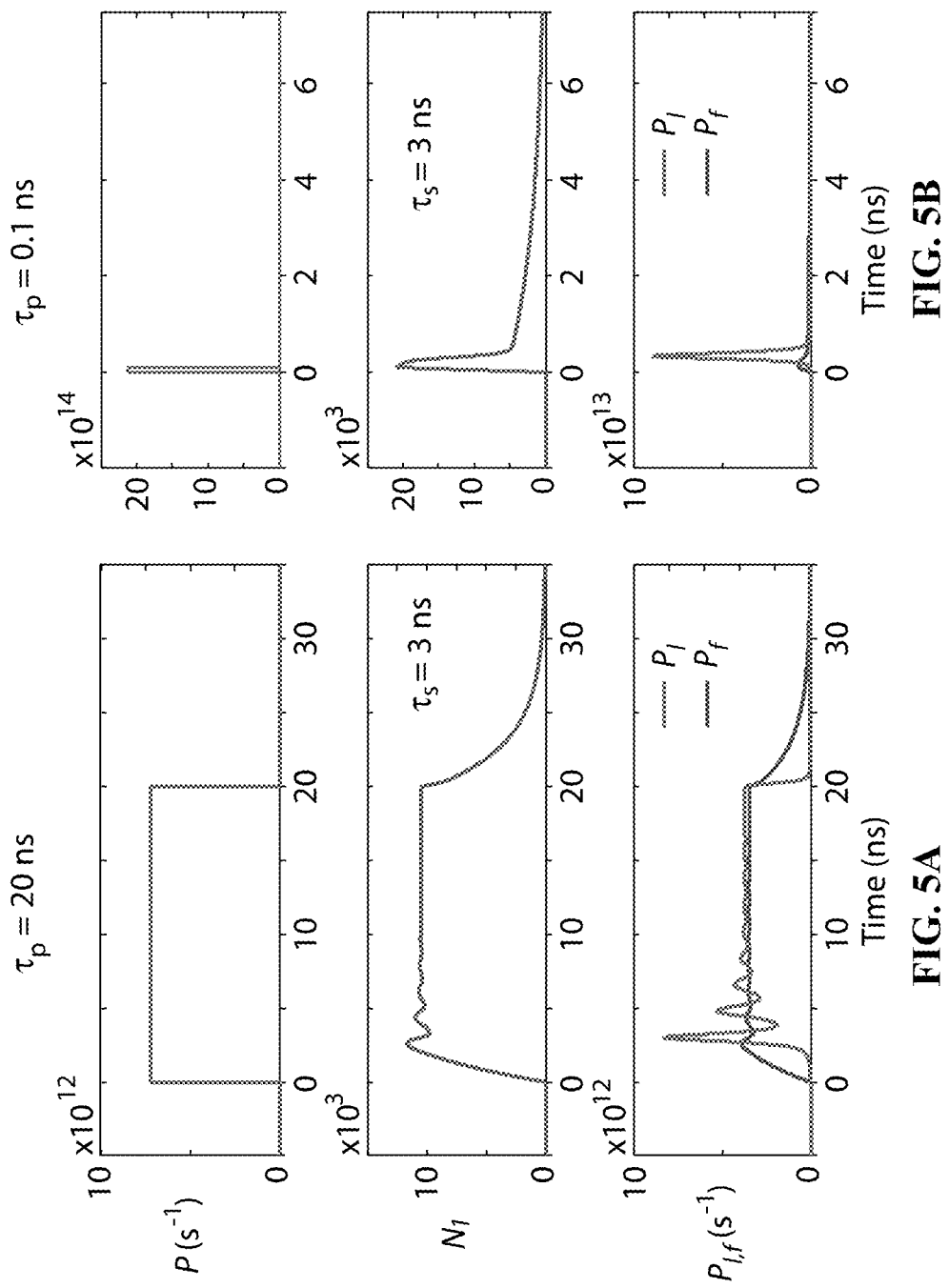
FIG. 5A shows numerical simulations for pump duration of 20 ns. The simulation parameters were $\tau_s=3$ ns, $\tau_c=30$ ps, $\beta=0.01$, and $P_{th}=3.54\times10^{12}$ s$^{-1}$. The pulse rate is set at twice the threshold rate according to Eq. (11).
FIG. 5B shows numerical simulations for pump durations of 100 ps. The simulation parameters were $\tau_s=3$ ns, $\tau_c=30$ ps, $\beta=0.01$, and $P_{th}=3.54\times10^{12}$ s$^{-1}$. The pulse rate is set at twice the threshold rate according to Eq. (11).

FIGS. 5A and 5B show numerical results for the two regimes: in FIG. 5A, $\tau_p > \tau_s$, and in FIG. 5B, $\tau_p < \tau_s$, where $\tau_s=3$ ns and $\tau_c=30$ ps. First, for $\tau_p=20$ ns, following the onset of the pumping at t=0 the number of excited gain elements $N_1$ and the fluorescence emission rate $P_f$ increase (FIG. 5A). The initial overshoot and rapid ringing is known as relaxation oscillations, which are typical for square pulses but less pronounced with Gaussian pulses. At $t > \tau_s$, the laser reaches a steady state. In this simulation, the pump rate was set to twice the threshold according to Eq. (11). Following the end of pumping at t=20 ns, the fluorescence emission decays exponentially with a relaxation time equal to $\tau_s=3$ ns, whereas the stimulated emission decreases exponentially with a cavity lifetime1 of $\tau_c=30$ ps. When short pump pulses with $\tau_p=100$ ps are used, short laser pulses are generated (FIG. 5B). The output pulse duration is in the same order as the peak width of relaxation oscillation. The number of excited-state gain elements peaks at the end of the pump pulse, decays rapidly as the laser pulse is emitted, and is followed by an exponential decay once dropped below the threshold level.

From Eq. (9), the minimum number of excited gain elements in the laser should be greater than $\tau_s/(\beta\tau_c)$. To have this many elements in the gain medium with a volume V, the absolute minimum concentration is greater than $\tau_s/(\beta\tau_c V)$. For example, with $\tau_s$=3 ns, $\tau_c$=300 fs, and $\beta$=0.05, the gain medium should have at least $2\times10^5$ gain elements. For V=10 $\mu m^2$, the theoretical minimum concentration is 330 nM, and V=1 $\mu m^2$, a much higher concentration greater than 330 $\mu$M is necessary. In practice, most lasers require $N_{tot}$ much greater than $N_1$ because of the finite absorption of pump energy (further discussed below). Therefore, the minimum concentration of gain elements is considerably higher, by one or two orders of magnitude, than is estimated above.

Semiconductor and solid-state lasers are more compact and easier to maintain than dye lasers. However, for biomedical laser particles, fluorescent dyes are important, viable choices as gain materials. A variety of fluorescent dyes, with improved brightness and photo-stability and optimized bio-sensitivity over earlier laser dyes, may be used for fluorescence-based bio-imaging and biochemical assays.

Figures 6A, 6B, 6C:
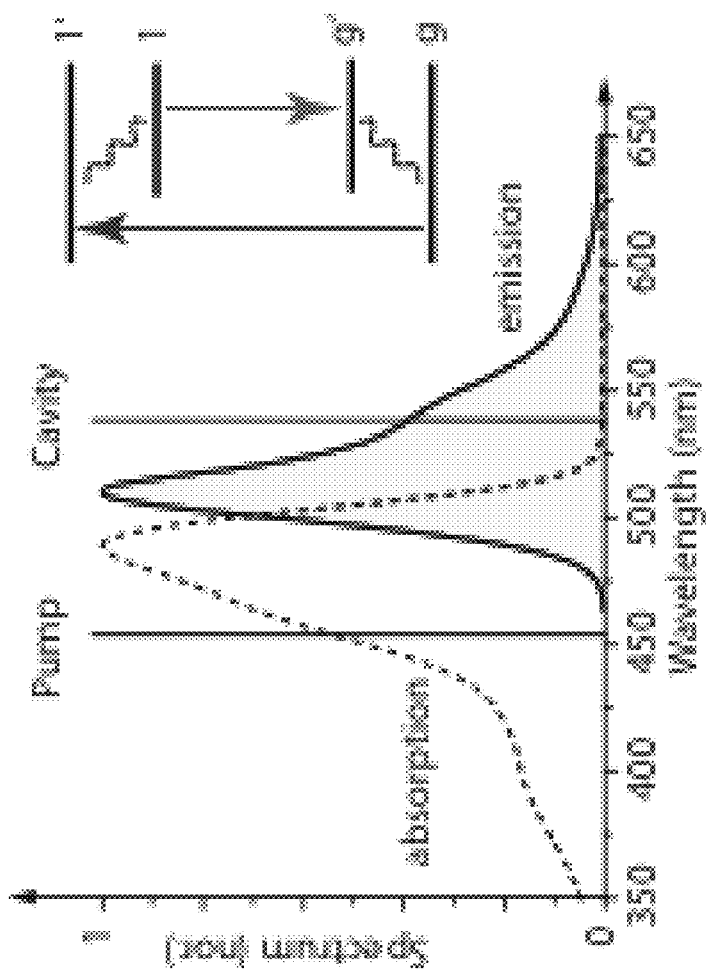
FIG. 6A relates to the molecular energy levels of a dye laser, illustrating the Franck-Condon principle energy diagram of a fluorophore dye. Since electronic transitions are very fast compared with nuclear motions, transitions occur between vibrational levels in the same nuclear coordinates.
FIG. 6B illustrates absorption (dotted line) and spontaneous fluorescence (solid line) spectra of an organic fluorescent dye molecule.
FIG. 6C illustrates the 4-level energy level diagram for the pump and signal wavelengths indicated.

FIG. 6A depicts the electronic and vibrational energy levels of a typical fluorophore molecule as a function of atomic separation in the molecular structure. Upon absorption of a pump photon, the molecule undergoes an electronic transition from a ground state (g) in the highest energy occupied molecular orbit or HOMO band to an excited state (1') in the lowest energy unoccupied molecular orbit or LUMO band. The initially excited electron migrates to the lowest energy level (1) in LUMO by non-radiative (vibrational) relaxation, from which the electron decays to a ground state (g') in HOMO, emitting light. This energy diagram applies to any molecules, in general, including isolated fluorescent dyes, fluorescent probes in solution (at low concentration so that dyes are weakly interacting with each other), and protected fluorophore units inside protein structures (i.e. fluorescent proteins).

FIG. 6B shows the typical absorption and emission spectra of a fluorophore. The absorption and emission spectra partially overlap with each other, which can be understood from the energy diagram in FIG. 6A. In this example, the molecule forms an effective 4-level system for laser operation when pumped by blue light ($\lambda\approx$430-490 nm), where the fluorescence emission is negligible. The 4-level system is comprised the ground level, g; pump level, 1'; meta-stable upper laser level, 1; and lower laser level, g' (FIG. 6C). The lifetime $\tau_s$ of this upper state is typically 1-10 ns for most organic molecules but can be shorter by external perturbation such as quenching or Förster resonant energy transfer (FRET). The transition from the upper to the lower laser level can be both by either spontaneous or stimulated emission.

The peak extinction coefficient ($\epsilon$) of typical dye molecules ranges 10,000-100,000 $M^{-1}$ $cm^{-1}$. For example, let us consider molecules with $\epsilon$=56,000 $M^{-1}$ $cm^{-1}$ and a fluorescence QY of 0.6. If a half of the molecules in the gain medium were excited to the upper level at a given time, we could obtain stimulated emission (gain) of up to 16,800 $M^{-1}$ $cm^{-1}$ (neglecting signal-induced gain depletion). A solution of these molecules at a concentration of 1 $\mu$M inside a 1-cm-long cuvette can produce a single-pass optical gain of $10^{0.0168}$=1.039; that is, the optical intensity is amplified by 3.9% or 0.168 dB. The same amount of single-pass gain is achieved by a single mammalian cell containing the molecules at a concentration of 1 mM in the cytoplasm with a diameter of 10 $\mu$m.

Fluorescent proteins are proteins capable emitting fluorescence. The green fluorescent protein (GFP) is the first type found in the jellyfish, *Aequorea victoria*. The increasing popularity of fluorescent proteins in biomedical sciences has led to the continuing discovery of new wild-type proteins from various organisms and to the development of mutant variants with improved fluorescence characteristics. Several efficient fluorescent proteins have been derived from the jellyfish (eGFP, mCFP, eYFP, etc.), coral reef (DsRed, tdTomoto), and bubble-tip anemone (TurboRFP). FPs have high QY and large absorption and emission cross-sections, comparable to or even better than typical fluorescent dyes, and may be well-suited for use as the gain-medium of biological lasers. Compared to small-molecule organic dyes, the most unique, significant advantage of FPs is that they can be genetically encoded. This allows FPs to be expressed in specific target cell types by genetic targeting. This property of FPs may be used to achieve genetic specificity for the applications of laser particles based on FPs as gain materials.

Referring to FIG. 7A, a FP has a common can-type cylindrical shape with a fluorophore at the center. The GFP has eleven strands of regular β-barrels that surround the actual fluorophore, 4-(p-hydroxybenzylidene)-imidazolidin-5-one, at the center of the molecule. The β-can structure is essential for the fluorescence of GFP as it forces the Ser-Tyr-Gly sequence into its emissive conformation. The unique protective molecular shell prevents concentration quenching of the fluorescence. GFP remains brightly fluorescent. This is in contrast to small synthetic fluorescent dyes, which lose their fluorescence at high concentrations by quenching at high concentration (see FIG. 7B). The low quenching of GFP at high concentration resulted in a very high gain coefficient of 96 dB $cm^{-1}$ for dried enhanced GFP films.

Inorganic semiconductors may be used as gain materials for lasers. Semiconductors are crystalline or amorphous solids with filled valence bands and empty conduction bands. Semiconductors differ from insulators in that the band energy gap, $E_g$, is typically less than 4 eV so that some electrons can transition to the empty conduction band by optical or thermal excitation, and the materials can be doped with impurities to alter their electronic properties. Most known semiconductor materials are crystalline inorganic solids. They include group IV materials, such as silicon (Si) and germanium (Ge), III-V compounds, such as GaAs and InP, and their alloys such as AlGaAs and InGaAsP, and II-VI compounds, such as CdS and ZnO. Oxides, such as $TiO_2$, and 2-dimensional two-dimensional (2D) transition metal dichalcogenides, such as $MoS_2$ and as $WS_2$, are also semiconductors. Since laser action relies on efficient radiative processes, indirect-gap materials like silicon and germanium may not be suitable, and direct-gap III-V and II-VI compound semiconductors are preferred.

With respect to the physics of laser action in these systems, FIGS. 8A and 8B illustrate a simple energy diagram of an intrinsic semiconductor material with a direct band gap. Since the valence band is completely filled without pumping, this semiconductor laser behaves similarly to a three-level laser system. A finite population in the excited state is necessary to obtain a net gain in the material; the carrier density at which such a condition is reached is called transparency population and is typically on the order of $10^{18}$ $cm^{-3}$. Stimulated emission of photons in these materials comes from radiative recombination of free charge carriers (i.e., an electron in the conduction band and a hole in the valence band)

To achieve a finite gain, population inversion is required, although schemes for laser without inversion exist. The number of electronic states in the conduction and valence bands is readily calculated from density of states of the carriers, $\rho_c$, which is:

$$\rho_c(E - E_c) = \frac{1}{2\pi^2}\left(\frac{2m^*}{\hbar^2}\right)^{3/2} \sqrt{E - E_c}, \quad (12)$$

for bulk (3D) semiconductor, where m* is the effective mass of the carrier. The number of electrons, $N_1$, to fill up the conduction band of bulk semiconductor with volume V, up to energy $\Delta E$ above $E_c$ is given by:

$$\frac{N_1}{V} = \int_0^{\Delta E} \frac{\rho_c(E)}{\exp(E/kT)+1} dE = \frac{1}{3\pi^2}\left(\frac{2m_e^* \Delta E}{\hbar^2}\right)^{3/2}\bigg|_{at\ T\to 0} \quad (13)$$

For example, for bulk GaAs the effective electron mass is $m_e^* = 0.61 \times 10^{-31}$ kg; at T=0 K and $\Delta E$=0.1 eV, we get $N_1/V = 2.5 \times 10^{18}$ electrons/cm$^3$, which is 4.15 mM in terms of an electron concentration, comparable to the highest density of organic fluorophores without quenching (see FIG. 7B). Semiconductor can achieve a very large gain of ~1% per μm in practice.

Semiconductors efficiently absorb light at all wavelengths shorter than their band edge. The absorption coefficients ($\alpha$, natural log basis) are ~$10^4$ cm$^{-1}$ in the optical frequency just above the band gap. The radiative lifetime $\tau_s$ of emission transition (electron-hole combination) is proportional to the population density of holes and the radiative recombination coefficient B (B≈$10^{-10}$ cm$^3$ s$^{-1}$): approximately, $$\tau_s = (BN_1/V)^{-1}. \quad (14)$$

For typical population density at lasing ($N_1/V \approx 10^{18}$-$10^{19}$ cm$^{-3}$), the radiative lifetime is 1-10 ns, same order of magnitude as fluorescence lifetimes of dyes.

Earlier semiconductor lasers exploited population inversion obtained at the interfacial region of a p-n homojunction. Due to diffusion of minority carriers, the actual active region is relatively thick (~1 μm), requiring high threshold pump energy. A more efficient design is a double hetero-structure, where the active region is delimited as a thin layer (~100 nm) of a different semiconductor with lower band gap and higher refractive index. With this architecture, charge carriers are confined in the thin active layer, increasing population density. Higher $N_1$ can be achieved by further confining the charges to a dimension of <<100 nm at which quantum effects become predominant, such as quantum wells (QW) with confinement in one dimension, quantum wires with 2D confinements, and quantum dots (QD) in 3D confinements. The density of states for QW is modified to $\rho_c (E-E_c) = m^*/\pi \hbar^2$.

The gain spectral range of semiconductors can be tuned to some degree by varying adjusting the stoichiometry of the compound and inducing mechanical stresses. The emission spectra of 720-850 nm for AlGaAs and 900-1100 nm for InGaAs are relevant to biomedical applications as they match well with the optical window for light penetration in tissues. For emission in the visible, the InGaAlP system works in the red (630-700 nm), while for the blue-green region (400-530 nm) group-III nitrides (like GaN and InGaN) are commonly used.

The semiconductor materials may be grown via epitaxial processes on wafers from which the final devices are fabricated via lithographic processes. Nanoscale inorganic semiconductors may also be grown in the form of colloidal nanocrystals by chemical synthesis in solution. Various colloidal nanocrystals are extensively used in biological applications, mainly as fluorescent tags for bioimaging and biosensing. Due to the high quantum confinement in nanoscale dimensions, the band gap and thus the emission wavelength can be easily tuned by controlling the size of the particle. Typical nanocrystals are in the shape of spherical core/shell quantum dots, in which the core is the emissive material, while the shell usually serves as a passivation layer to reduce non-radiative recombination from surface defects. Moreover, the core/shell architecture has been shown to be important to obtain optical gain with these materials. More complex shapes have been also developed, like rods or branched nanocrystals, with advantages of increased lifetimes of radiative transition, controlled polarization and multiple emission bands.

Organic semiconductors are formed in condensed states incorporating fluorescent small molecules, oligomers or polymers, at a very high concentration so that the individual elements are coupled and collectively form a π-conjugated system with delocalized electrons. The π-conjugated system confers them strong electronic transition in the visible and the capability of conducting charges. The typical structure of an organic semiconductor is composed of a central conjugated backbone that determines the main optoelectronic properties, decorated with side groups that can be tailored to confer particular functionalities to the molecule, like for example alkyl chains to improve solubility. Organic semiconductors usually have quite broad gain spectra, especially in the case of macromolecular conjugated polymers, which allow a fine-tuning of their emission without changing material. Lasing from these material generally occur in the visible range. Conjugated polymers with band-gaps in the near-IR generally do not have efficient luminescence emission.

Lasing in organic materials involves radiative recombination of singlet exciton. The lifetime of exciton is a few hundreds of picoseconds to nanoseconds. As in the case of fluorescent dyes and proteins, this short lifetime requires high pump rates to reach laser threshold, and organic semiconductor lasers have been demonstrated only in pulsed regimes. Organic semiconductors have lower charge mobility compared to crystalline inorganic semiconductors, and polarons (electron-phonon coupled charge carriers) have significant absorption, leading to high loss at high carrier densities. For these reasons, electrical pumping of organic semiconductors has not been successful to date.

The stability of organic semiconductors is an important factor to consider for use in biological environment. These materials are usually very sensitive to physico-chemical interactions with oxygen and water, which can be particularly detrimental for both charge transport and fluorescence emission. Nonetheless, organic semiconductors offer several properties that are potentially attractive for laser particles in biological environments. One is generally superior biocompatibility compared to inorganic materials due to their organic compositions, more compliant mechanical properties, and cell-friendly surface roughness. Some organic materials also allow both ionic and electronic conduction, making them suitable to interface with biological tissues where electrical signal are generally conveyed by ion movements. Moreover, the organic materials can be chemically tailored with functional groups sensitive to specific analytes.

Chemical and biological sensing based on fluorescence modulation and even laser emission from conjugated materials has been reported.

Ions of rare-earth or transition metals included as impurities in transparent solid-state hosts are well established gain elements for lasers. The first laser demonstrated in 1960 by T. H. Maiman used a ruby which has $Cr^{3+}$ ions doped in a $Al_2O_3$ crystal. The host materials may be an oxide crystal (e.g. $Al_2O_3$ and $Y_3Al_5O_{12}$ or YAG), fluoride crystal ($YLiF_4$ or YLF), glass ($SiO_2$ or silica), or polymer (polystyrene). Compared to crystalline hosts, amorphous materials can be more easily manufactured into micron sizes, and their optical attenuation and thermal resistance, which are typically higher than crystals, are desirable for small lasers. The most common dopant ions used for gain elements include trivalent lanthanides neodymium ($Nd^{3+}$), erbium ($Er^{3+}$) and ytterbium ($Yr^{3+}$), as well as the transition metal titanium ($Ti^{3+}$) and chromium ($Cr^{2+}$, $Cr^{3+}$, $Cr^{4+}$). They usually have multiple electronic transitions that can support laser action and their emission properties also depend on the particular host material. In most cases lasing is in the near-IR region between 0.9 and 1.6 μm, but some systems at shorter (like ruby at 694 nm) and longer (like Er:YAG at 2.9 μm) wavelength are also present. A common characteristic of ion-doped solid state lasers is that the electronic transitions from the upper to ground states are much weaker so that the relaxation time, $\tau_s$, can be quite long, in the order of μs to 10 ms. The long relaxation time is well suited for continuous operation.

Given long lifetimes, rare earths are suited for upconversion to generate emission at higher energy than pump photons. The process involves the absorption of two photons in sequence to promote an electron to metastable state and then an excited state, from which the electron decays to the ground state, emitting a single photon with about twice the pump photon energy. Since the intermediate state has a long lifetime, the process is quite efficient. Upconversion is distinct from typical nonlinear two-photon absorption, where the intermediate state (and also the final upper state) is a virtual state with a lifetime of only a few femtoseconds, and thus efficient excitation can be achieved only with ultrafast pulses with high peak intensity. The detailed photophysical pathways are extensively reviewed elsewhere. The first laser based on upconversion was demonstrated in 1971, and the process attracted significant interest because it allows to obtain visible emission using near-IR pumping, particularly for biomedical applications as luminescent nanoparticles. This material is an attractive candidate for laser particles, with main advantages of near-IR pump light, which has deeper penetration depths and is less harmful than visible light in tissues.

An optical resonator, or laser cavity, provides phase-coherent optical feedback, allowing for regenerative amplification in the gain medium. Various optical elements, including the gain medium, may be incorporated into a laser cavity to control and condition the optical characteristics of intracavity light and the output laser properties.

Cavity modes are particular spatial (transverse) and spectral (longitudinal) optical waves that that can resonantly oscillate in the cavity. Transverse modes are determined by the shape and size of the cavity along the dimension parallel to the axis of optical oscillation. Longitudinal modes are a set of frequency components that satisfy that the total optical phase accumulated in one round trip propagation is equal to an integer multiple of $2\pi$. This resonance condition is expressed as:

$$\frac{n \cdot v_l}{c} L_c = l \tag{15}$$

where l is a positive integer, is the optical frequency of the l-th longitudinal resonance mode, $L_c$ is the round-trip length of the cavity (e.g. twice the length of a linear cavity or $2\pi$ times the radius of a ring cavity), and n is the (effective) refractive index of the l-th mode with a frequency of $v_l$. Since the minimum l is 1, the smallest length scale for a resonator is equal to the free-space wavelength λ divided by the effective refractive index n of the resonator.

High n is beneficial for small lasers as it allows small $L_c$. Semiconductor materials are therefore attractive materials to realize resonators (as well as gain media). Plasmonic polariton resonators made of metals are another attractive approach that takes an advantage of the fact that the real part of the refractive index is enhanced by the coupling of light with the plasmonic, collective motion of free electrons confined in the cavity.

The number of cavity modes is proportional to the volume of the cavity. As the cavity size becomes comparable to the optical wavelength, the total number of radiation modes decreases, and the spontaneous emission factor β increases (see Eq. 1). As β approaches to 1, the majority of absorbed pump energy goes to the cavity modes. At an extreme case, when the size is less than half the optical wavelength, the number of modes becomes one, a situation known yield a "threshold-less" laser.

The optical cavity can affect the spontaneous emission rate of the gain element in the gain medium through coupling to the cavity modes. The enhancement of spontaneous decay rates of confined modes, called the Purcell effect, is a factor that may be taken into advantage in micro and nano-scale lasers.

When the size is comparable or less than the optical vacuum wavelength λ, the laser behaves similarly to a point source, emitting light over a broad solid angle. Then, the so-called "directionality" of the laser output becomes less pronounced. As the size approaches to the minimum possible size (i.e. $L_c=\lambda/n$), the laser output emitted out of the cavity would radiate in all directions. The laser output is emitted in all directions, just like the fluorescence light from a single molecule. However, some additional features such as asymmetry may be incorporated into a laser cavity to enhance directionality.

In terms of the geometrical shape and optical resonance axis, laser cavities can be categorized into various types. Examples are illustrated in FIGS. 9A-D.

The cavity lifetime $\tau_c$, a reciprocal of the cavity loss rate, is related to the Q-factor of the cavity, which is defined by:

$$Q = 2\pi v \tau_c, \tag{16}$$

where v is optical frequency. Different cavity modes may experience different cavity losses and, therefore, have different Q-factors. In small cavities, the cavity lifetime is typically much shorter than optical lifetime of spontaneous emission, $\tau_s$. For example, for λ=532 nm, $\tau_c$=0.28 ns when Q-factor is $10^6$, and $\tau_c$=280 fs when Q-factor is $10^3$.

From Eq. (8), the threshold pump rate is inversely proportional to the Q-factor:

$$P_{th} = \frac{2\pi v}{\beta Q}. \tag{17}$$

The spectral linewidth of passive cavity (below threshold) is given by $$\Delta v_{cavity} = \frac{v}{Q}. \quad (18)$$

Above threshold, the linewidth of laser modes can be reduced because the cavity loss is compensated by the gain. According to the Schawlow and Townes limit, the fundamental limit of laser linewidth can be expressed as:

$$\Delta v_{laser} = \frac{\Delta v_{cavity}}{q} = \frac{v}{Q \cdot q}. \quad (19)$$

In practice, several factors contribute to broaden the laser linewidth. Thermal heating during laser operation changes the refractive index $n_{eff}$ of the cavity, leading to linewidth broadening. In semiconductor lasers, carrier-induced index modulation is an important linewidth broadening factor.

In general, pulsed pumping results in broader spectral widths than continuous wave pumping. The modulation of the temperature and refractive index of the cavity causes the resonance frequencies of lasing modes to be chirped over time, broadening the output spectrum. Relaxation oscillations during the laser build up enhance the modulation. In miniature lasers operated at a pulsed regime, actual laser spectral widths can be several orders of magnitude greater than the theoretical limit in Eq. (18). In these many practical cases, the cavity Q is not a direct deciding factor of the laser linewidth, although it is important to reach lasing threshold (Eq. 17).

Consider a linear or concentric resonator that is formed by a pair flat or spherical mirrors with reflectivity of $R_1$ and $R_2$, and separated by a distance L ($L_c/2$) The cavity lifetime is expressed as:

$$\tau_c = \frac{2nL}{c \cdot \ln[R_1 R_2(1-\eta)^2]} \quad (20)$$

where n is the refractive index of the medium in the cavity, and η is fraction internal loss per pass, which can occur due to absorption or scattering loss in the cavity.

Consider a Fabry-Perot resonator (FIG. 9A) filled with a medium with a refractive index of n=1.6, contains fluorescent dye for emission at λ=600 nm, and has silver mirrors at $R_{1,2}(1-\eta)=0.98$. From Eq. (16), Q=1,000 is obtained when L=3.2λ/n=1.2 μm. The smallest resonator is given by L=λ/2n. For cavity with this minimum length of 375 nm for n=1.6 and $R_{1,2}=0.98$, we get Q=155.5 and $\Delta v_{cavity}$=3.86 nm.

A photonic crystal cavity has a periodic structure and defects. By having laser gain in the defects and high enough Q-factor, lasing can be achieved. The periodic structure can be either in 1D, 2D or 3D (FIG. 9C). For 1D and 2D photonic crystals, the light confinement in the other dimensions is achieved by total internal reflection. Lasers with linear grating structures include distributed feedback lasers (DFBs) and vertical-cavity surface-emitting lasers (VCSELs). 2D lasers are typically implemented on thin slabs with internal band gap structures. 3D photonic crystal lasers are more difficult to fabricate but successful lasers have been reported. Using self-assembly of liquid crystals, radial Bragg micro-cavity lasers (1D periodicity on a 3D object) with a diameter of 15 μm were demonstrated. The output emission pattern is radial, uniform in all directions.

Consider a periodic slab of m double layers of two alternating quarter-wave-thick materials, with refractive indices $n_1$ and $n_2$, respectively. The Bragg wavelength $\lambda_B$ is given by $$\lambda_B = 2(n_1+n_2)\Lambda, \quad (21)$$

where Λ is the periodicity of the double layer structure. The reflectivity at the Bragg wavelength is: $R_{1,2}=(n_1^{2m}-n_2^{2m})^2/(n_1^{2m}+n_2^{2m})^2$. For example, at least 4 double layers of a semiconductor material with $n_1$=3.5 and a low-index interspace with $n_2$=1.33 are needed to achieve 99% reflectivity. Two such stacks on each side of the optical cavity would have a total thickness (8Λ) equal to about 1.6 μm. This would be small enough to be used inside cells.

Figure 9A:
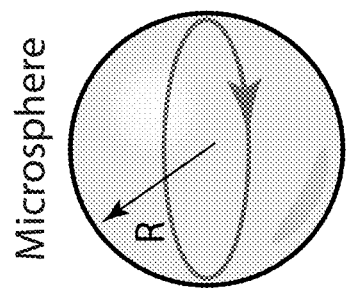
FIG. 9A shows an optical resonator for stand-alone laser particles in the form of a Fabry-Perot cavity with end reflection.
Figure 9B:
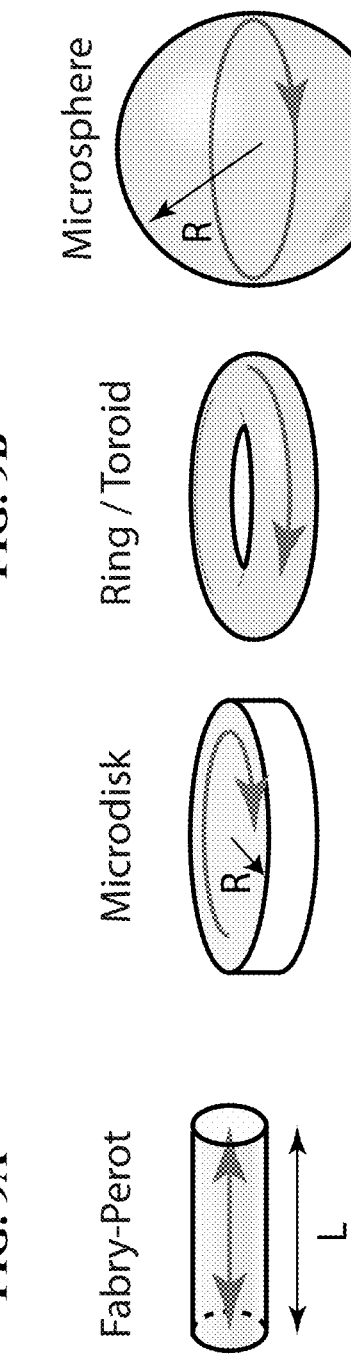
FIG. 9B shows whispering gallery mode (WGM) resonators in disk, ring, and spherical shapes, respectively.
Figure 9C:
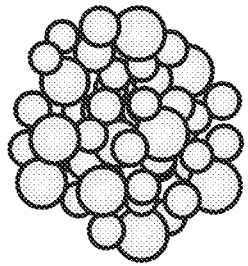
FIG. 9C shows photonic crystal resonators with linear, planar, and radial grating structures, respectively.

Whispering-gallery modes (WGMs) are supported in round-shape resonators, such as a sphere, toroid, cylinder, and ring (FIGS. 9A-B). The refractive index must be larger than that of the surrounding medium, so that the modes are confined in the cavity by total internal reflection at the external interfaces and circulate the cavity. The optical field of the intracavity light can be evanescently extended out of the cavity. This evanescent field allows the gain medium to be placed physically outside the cavity and is critical in certain applications, such as sensing molecules in the surrounding environment.

WGMs can be designated by the radial mode number q, polar mode number l, azimuthal mode number m, and polarization p. For a sphere the frequencies of WGMs can be approximated (for l>>1) using an asymptotic expansion:

$$\frac{2\pi n_1 a}{\lambda} = l - \alpha_q\left(\frac{l}{2}\right)^{1/3} - \frac{\chi n_1}{\sqrt{n_1^2-n_2^2}} + \frac{3\alpha_q^2}{20}\left(\frac{l}{2}\right)^{-1/3} - \frac{\alpha_q \chi n_1(2\chi^2 n_2^2 - 3n_1^2)}{6(n_1^2-n_2^2)^{3/2}}\left(\frac{l}{2}\right)^{-2/3} \quad (22)$$

where $n_1$ is the refractive index of the sphere, $n_2$ is the index of the surrounding medium, χ=1 for TE modes and χ=$n_2/n_1$ for TM modes, a is the sphere radius, and $\alpha_q$ are negative q-th zeroes (−2.3381, −4.0879 . . . ) of the Airy function. The above formula can be further approximated to $2\pi n_1 a/\lambda$=l, which is consistent with Eq. (15) where $L_c$=2πa.

When the size of an WGM resonator approaches to the optical wavelength, its Q-factor is limited by radiative (curvature) loss:

$$Q \approx \frac{1}{2}(l+\frac{1}{2})n_r^{1-2k}(n_r^2-1)^{1/2}e^{(2l+1)(\eta-\tanh\eta)} \quad (23)$$

where $$\cosh\eta = n_r\left[1 - \frac{1}{l+1/2}\left(\alpha_q\left\{\frac{1}{2}\left(l+\frac{1}{2}\right)\right\}^{1/3} + \frac{n_r^{1-2k}}{\sqrt{n_r^2-1}}\right)\right]^{-1}, \text{ and}$$

$$n_r = n_1/n_2$$

is the relative refractive index, and k=0 for TE modes and k=1 for TM modes. For a sphere containing few mM of a typical organic fluorescent dye and nanosecond pumping, the minimum Q-factor required to achieve lasing is ~10,000.

From the above equations, the following approximate formula can be obtained:

$$2a \approx \frac{\lambda}{4} \frac{\log_e(Q)}{(n_1 - n_2)^{3/2}} \quad (24)$$

For a given Q-factor, high $n_1$ is required to reduce the resonator size. For example, to achieve $Q=10^4$ with $2a<1$ μm in the cytoplasm ($n_2=1.37$) at $\lambda=0.6$ μm, the resonator material should have $n_1>2.61$.

In cavities made of dielectric materials, optical energy is stored in photonic modes, in length scales equal to or greater than the optical wavelength. Better confinement can be achieved with metals by, for example, coating thin metal layers on sub-wavelength dielectric resonators. This configuration can support two distinct types of resonance modes: purely reflective cavity modes and plasmonic-based resonance modes.

In the first case, the intracavity energy is stored in optical waves, just like in dielectric cavities. The metallic layer acts as a mirror that confines the mode inside the cavity by high reflection at the metal surface. The efficient confinement provided by the reflective surface allows high Q factors even for dimensions at the size of optical wavelength.

The second type of modes is based on plasmonic effects that arise at the metal-dielectric interface. The intracavity energy is stored in a plasmonic mode that is strongly confined at the interface between the dielectric medium and metal with a wavelength much shorter than optical wavelength. Therefore, the plasmonic mode resonance can be achieved with cavities much smaller than the optical wavelength. The plasmonic modes are generally divided into long-range surface-plasmon-polaritons (LR-SPP's) and localized surface plasmons (LSP's).

Long-range polaritons are electromagnetic waves that propagate along interfaces between metals and dielectric materials. They are evanescently confined in the direction perpendicular to the surface. Typical structures include metal/insulator/semiconductor/insulator/metal waveguides and metal-insulator/semiconductor nanowires. The plasmonic mode is confined in one or two dimensions mainly in the insulating regions, while the cavity is delimited along the propagation direction by the end facets of the structure, still on the order of (at least) several wavelengths. It should however be noted that the strong coupling of the electromagnetic mode with the electron in the metal leads to higher resistor-type (ohmic) losses that are intrinsic of the plasmonic modes and thus difficult to minimize. Therefore, their Q factors are lower than similar structures based on photonic modes. Lasing has thus far been achieved only at cryogenic temperatures.

Localized plasmons are collective oscillations of electrons at the surface of metallic nanoparticles by coupling with an intense electromagnetic field. The surface plasmons act as resonant electric dipoles, with resonance frequencies determined by the shape of the nanoparticle and the permittivity of the metal and surrounding dielectric medium. Plasmonic lasers have been demonstrated by coating a metallic nanosphere with a dye-doped dielectric shell. Upon optical pumping of the dye, the optical energy is readily transferred to spectrum-matched plasmonic resonance of the metallic core via FRET. The excitation of the surface plasmons produces a strong local field that stimulates an increased coupling of emission from the dyes into the plasmonic modes. This feedback mechanism is referred to as surface plasmon amplification by stimulated emission of radiation, and the device operated based on the mechanism is known as a spaser.

Despite some experimental observations, stable realizations of spaser have been difficult due to a low Q-factor and metallic heating, as well as the limited number of gain elements in the nano-scale volume. For example, a 40-nm sphere can contain only 40 dye molecules even at a high concentration of 2 mM ($1.2\times10^{18}$ cm$^{-3}$). To date, no convincing evidence for the experimental realization of a spaser at a single particle level has been reported. All experimentally demonstrated spasers have dimensions greater then several μm including substrates.

Figure 9D:
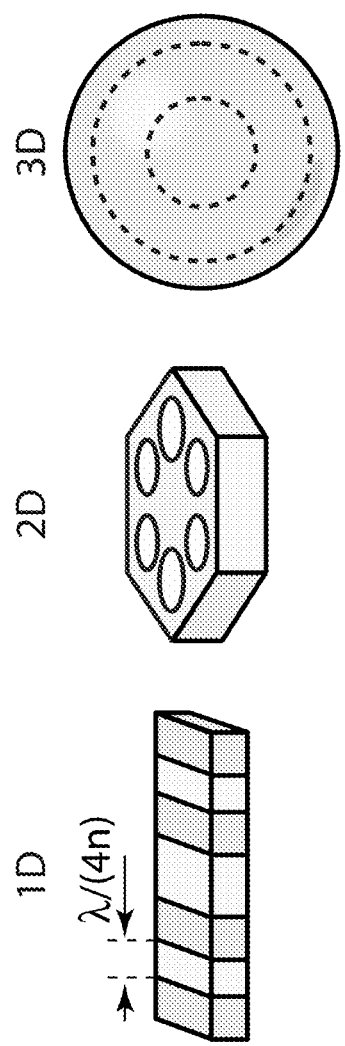
FIG. 9D shows a random micro-resonator formed by a cluster of scattering particles.
Figure 10A:
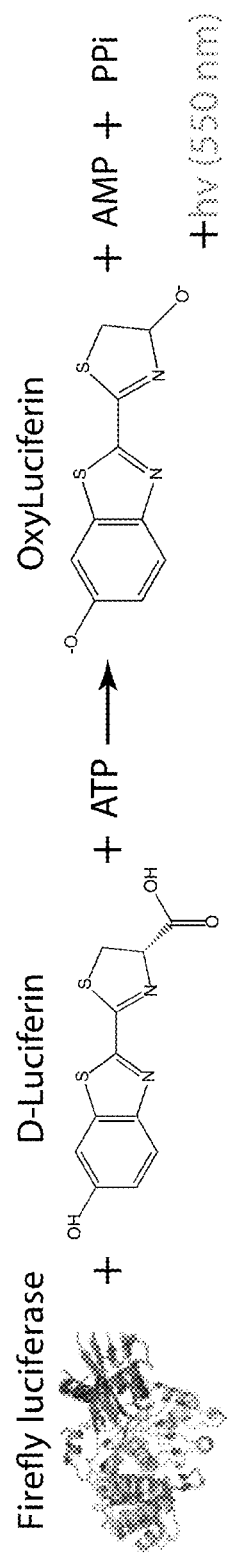
FIG. 10A provides the firefly luciferase-luciferin chemically initiated electron exchange luminescence (CIEEL) reaction.
Figure 10B:
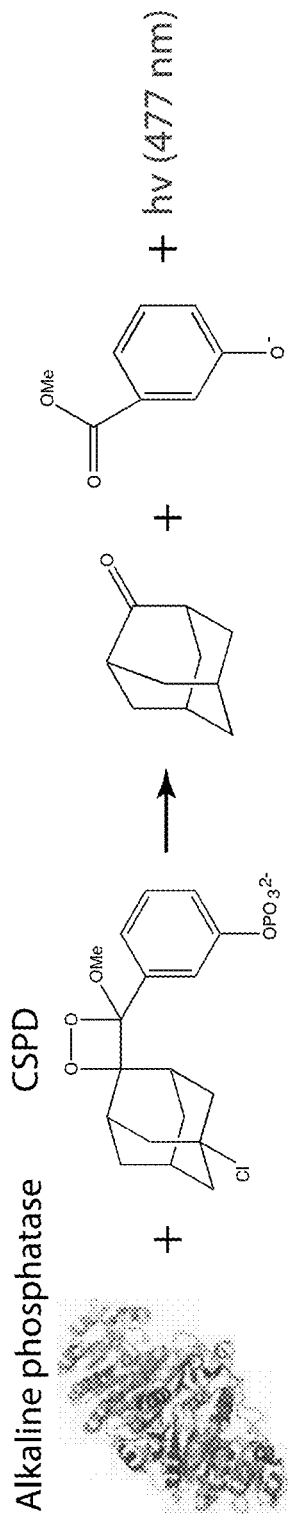
FIG. 10B provides alkaline phosphatase (AP)-chloro-5-substituted adamantyl-1,2-dioxetane phosphate (CSPD) CIEEL reaction.
Figure 10C:
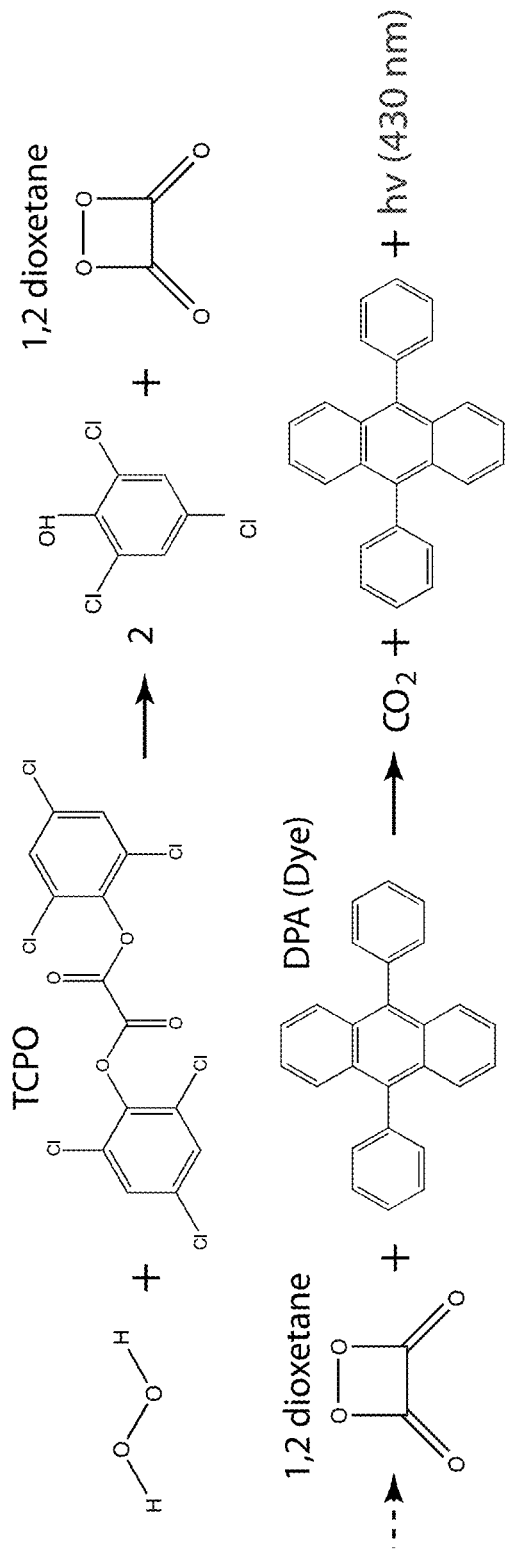
FIG. 10C provides peroxyoxalate-dye CIEEL reaction. Here, bis(2,4,6-trichlorophenyl)oxalate and 9,10-diphenylanthracene (DPA) are used as an example of a peroxyoxalate and light-emitting dye, respectively.
Figure 10D:
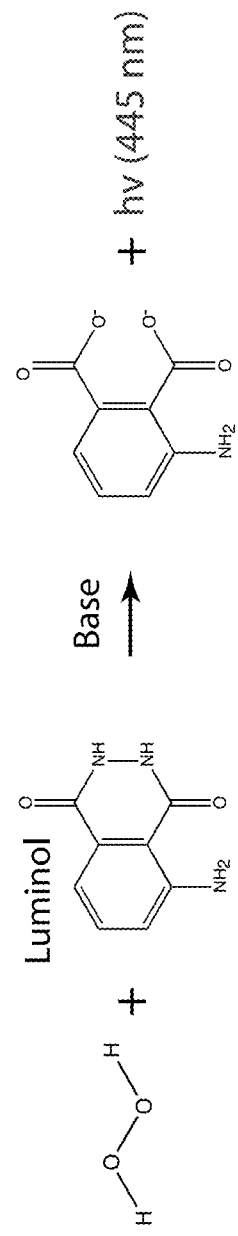
FIG. 10D provides a peroxidase-luminol CIEEL reaction.

Conventional cavities described so far offer well-defined optical resonant paths. In the case of random lasers, light is trapped in a gain region in a disordered media by multiple scattering (FIG. 9D). For this medium, a transport mean free path $l_t$ is defined the distance after which the propagation direction of light is randomized, and $l_g$ denotes a gain length defined as the distance over which light is amplified by a factor of e (i.e. 4.34 dB). The scattering medium should have a critical minimum volume to have sufficient gain and scattering feedback. From this condition, the minimum size of a random laser $L_c$ is given by $$L_c \approx (l_t l_g/3)^{1/2} \quad (25)$$

Consider, for example, a medium containing TiO$_2$ nanoparticles as scatterers and rhodamine 6G as gain dye. TiO$_2$ nanoparticles with a diameter of 200 nm at a high concentration of $5.6\times10^{10}$ cm$^{-3}$ have $l_t=35$ μm. The gain length of rhodamine 6G solution at a high concentration of 10 mM is ~10 μm. Such a random laser cavity offers a critical size of $L_c \approx 10$ μm. That is, when a volume greater than $10\times10\times10$ μm$^3$ is illuminated with a strong pump light, laser emission in principle can be generated. A typical skin tissue has $l_t=50$ μm, and an administration of 10 mM rhodamine 6G into the tissue can give $L_c=13$ μm.

The emission spectrum of a random laser usually contains several narrowband peaks at irregular wavelengths with different intensities. The spatial profile of the output emission is quite complex, resembling speckle patterns. In principle, the laser spectrum and spatial profile are deterministic from the specific distribution of scatterers. However, light scattering from multiple scatterers is difficult to analyze. Nonetheless, the sensitivity of the laser output to the scattering medium may be useful for sensing.

For a laser to operate and generate light, energy in some form needs to be supplied. The input energy absorbed by the gain medium should be sufficient to produce population inversion in the gain medium and generate sufficient amplification to overcome the loss in the cavity. There are a number of different ways to pump laser particles. Optical pumping offers the most convenient way and well suited for situations where the laser particles are readily accessible with light; for example, for laser particles placed in cells in culture or implanted in a tissue at shallow depths.

Current injection is an established method for driving conventional semiconductor lasers. When semiconductor particles are embedded in biological systems, electrical pumping may be possible but requires a clever way to draw sufficient electrical current and voltage across the semiconductor medium to produce net gain. Wireless electrical energy transfer is one option, which has shown to be able to drive millimeter-sized light emitting diodes (LED's) embedded in animals. As the devices are to be further miniaturized, corresponding antennas get smaller, increasing the resonance frequency required for efficient wireless transfer.

When the size approaches to micron or submicron scales, the optimal frequency range approaches to the optical frequency. This makes wireless pumping equivalent to optical pumping. In this section, we describe the fundamental of different pump methods. Furthermore, we discuss the exciting, yet elusive, potential to operate laser particles using bio-energy drawn from living systems.

Optical pumping is a convenient way to provide energy to operate laser particles. Let $\varepsilon$ the absorption coefficient of a gain medium. It is related to an absorption cross-section $\sigma_a$: $\varepsilon = \ln(10)^{-1} \sigma_a N_g / V$ [see Eq. (3)]. The absorption efficiency $\eta_{abs}$, or the fraction of incident pump energy absorbed by a laser particle, is determined approximately by $\varepsilon$ times the diameter, 2a, of the particle:

$$\eta_{abs} = 1 - 10^{-\varepsilon(v_p) 2a}, \quad (26)$$

where $v_p$ is the optical frequency of the pump light. For example, consider fluorescent dyes with a molar extinction coefficient of 65,000 $M^{-1}$ $cm^{-1}$. A gain medium comprising the dye at a concentration of 1 mM has $\varepsilon=65$ $cm^{-1}$. A film of the dye with a thickness of 10 µm can absorb 14% of the pump beam ($\eta_{abs}=0.86$).

The absorption of a semiconductor is proportional to the carrier density, $\rho_c$. The absorption coefficient of a bulk semiconductors with direct band gap is expressed as $\varepsilon = A (v_p/v_g - 1)^{0.5}$, where $A = 10^4 \text{-} 10^5$ $cm^{-1}$ in most bulk semiconductors and $v_g$ is the band gap frequency. For example, $\varepsilon$ is $1.5 \times 10^4$ $cm^{-1}$ for GaAs ($hv_g = 1.42$ eV) at $v_p/v_g = 1.2$. A thin GaAs slab with a thickness of 250 nm can absorb 58% of the pump energy ($\eta_{abs} = 10^{-1.5*0.25} = 0.42$).

Consider a pump pulse with energy of $E_p$ and a beam size. The absorbed energy is then given by $E_{abs} = \eta_{abs} E_p * \eta_{area}$, where an overlap parameter $\eta_{area}$ is equal to the ratio of the size of a laser particle to the beam size and 1 when the beam size is smaller than the size of the gain medium. Part of the total absorbed energy is radiated out of cavity in the form of light via spontaneous and stimulated emission; the rest is converted to heat and other forms of energy.

As the pump intensity increases, more and more gain elements are excited to the upper states. From Eq. (1) and (3) and $N_{tot}(t) = N_g(t) + N_1(t)$, the fraction of gain elements in the emission-ready upper level in the steady state can be shown to be:

$$\frac{N_1}{N_{tot}} = QY \frac{\sigma_a I_p \tau_S}{h v_p} / \left\{ 1 + QY \frac{\sigma_a I_p \tau_S}{h v_p} + \beta q \right\} \quad (27)$$

When signal-induced gain saturation (i.e. the last term in the denominator) is neglected ($\beta q \ll 1$, near and below threshold), a 50% inversion ($N_1 = 0.5$, $N_{tot} = N_g$) is reached at pump intensity equal to $$I_{p,50\%} = \frac{h v_p}{\sigma_a \tau_s} \frac{1}{QY} \quad (28)$$

The 50% pump intensity corresponds to one photon per absorption cross-section per upper-level lifetime, divided by the quantum yield. The 50% population inversion can be achieved by optical pumping for highly efficient gain medium. For example, the absorption cross-section of eGFP is $\sigma_a = 2.1 \times 10^{-16}$ $cm^2$ and $QY = 0.8$ for pump pulses at $\lambda = 488$ nm ($hv_p = 4.1 \times 10^{-19}$ J). When the pulse duration is equal to the lifetime ($\tau_s = \tau_p$), the pump flux, $I_{p,50\%} \tau_p$, required to excite a half of molecules upper level is about 2.4 $mJ/cm^2$ or 24 $pJ/µm^2$. This fluence level is lower than the typical safety limits for human skin tissues in terms of photothermal damages, by 1 to 3 orders of magnitude depending on the pulse width.

Chemical energy can be employed to create population inversion. One known example is found in hydrogen fluoride lasers, which utilizes the rotational-vibrational excitation of hydrogen fluoride by an elementary reaction of $F + H_2 \rightarrow H + HF^*$. This reaction releases a free energy of $\Delta G = -31.6$ kcal/mol. Part of this chemical energy is converted to photons in a spectral range of 2.7-2.9 µm (9.8-10.6 kcal/mol). Typical exothermal chemical reactions based on rotational-vibrational excitations, however, produce $\Delta G$ of only 1-10 kcal/mol. This is much smaller than the energy of visible photons (e.g. 40-70 kcal/mol for at 400-700 nm). As a result, all conventional chemical lasers based on such chemical energy operate in the infrared region.

Chemical reactions that involve electronic, instead of vibrational, transitions may be suitable for pumping visible or near-IR lasers. Electronic transition is relatively rare in chemical reactions, and so-called "chemically initiated electron exchange luminescence" (CIEEL) reactions uniquely support electronic transitions. CIEEL can be categorized into two types. Type-1 is intramolecular CIEEL and utilizes energy transfer in the solvent cage and direct light emission from the reaction product: symbolically $A + B \rightarrow [C + D^*]$ and $C + D^* \rightarrow C + D + hv$. Type 2 is intermolecular and uses a fluorescent dye to emit light: $A + B \rightarrow C + D^*$; $D^* + E \rightarrow E^* + D$; and $E^* \rightarrow E + hv$, where E represents a dye.

FIGS. 10A-D depict various examples of CIEEL reactions: namely, firefly luciferase-luciferin reaction, alkaline phosphatase (AP) and chloro-5-substituted adamantyl-1,2-dioxetane phosphate (CSPD) reaction, peroxyoxalate-dye reaction (also known as glow stick reaction), and peroxidase-luminol reaction. Although different in starting reactants, all of these reactions have a similar high energy intermediate, 1,2-dioxetane. There are unique advantages of 1,2-dioxetane as a chemiluminescent reaction intermediate. Decomposition of 1,2-dioxetane is a reverse process of $\pi 2$-$\pi 2$ photocycloaddition, which is forbidden for thermal excitation, so most of its energy is released by photonic, instead of thermal, energy. The energy difference between 1,2-dioxetane and its two carbonyl products is ~72.5 kcal/mol so that electronic transitions for visible light emission is possible.

The bioluminescent and chemiluminescent reactions are potential candidates for pumping laser particles. The high-energy intermediate state can emit light as electromagnetic radiation (type 1) or transfer the photonic energy to a nearby luminescent particle, such as dye, via near-field FRET (type 2). When FRET occurs from bioluminescent molecules, it is often referred to as 'bioluminescence resonant energy transfer' or BRET.

The kinetic condition demands that the pumping reaction rate should be much faster than the decay rate. To achieve a high reaction rate, conventional chemical laser employs gas phase reactions. For instance, rate-determining step of pumping reaction of hydrogen fluoride laser is $H + F_2 \rightarrow F + HF^*$. The kinetic constant of this reaction is $1.6 \times 10^{10}$ $M^{-1}$ $s^{-1}$, similar to the typical kinetic constant of $10^9$ to $10^{10}$ $M^{-1}$ $s^{-1}$ for diffusion-controlled bimolecular reaction at room temperature. Comparing to this, liquid phase chemiluminescent reactions have lower kinetic rates. For example, the typical kinetic rate constant of luciferase-luciferin is only 10 $s^{-1}$. The kinetic rate constant can be higher, $10^5$ $s^{-1}$ for the peroxioxalate-rubrene dye reaction, and $10^7$ $s^{-1}$ for the luminol-peroxidase reaction with a phenol enhancer. The latter is only 1,000 times slower than the reaction in a hydrogen fluoride laser.

The oxidation of glucose releases a large amount of Gibbs free energy: $C_6H_{12}O_6$ (s)+$6O_2$ (g)→$6CO_2$ (g)+$6H_2O$ (l), $\Delta G$=−685.7 kcal/mol. This chemical energy can theoretically be used to generate light, for example, via subsequent chemiluminescent reactions. The metabolic energy is consumed to produce adenosine triphosphate (ATP) molecules, which are known as the energy currency of cells. This process involves adding a third phosphate group to adenosine diphosphate (ADP). A total of 30 or 32 ATP molecules are generated from one glucose molecule. At any given time, about 1 gram of ATP is present in our body. When cells require energy, ATP molecules are hydrolyzed to dissociate into ADP and phosphate. On average, in a typical cell, 1-2 million ATP molecules are hydrolyzed each second and make free energy available for various cellular functions, via a process: ATP (aq)+$H_2O$ (l)→ADP (aq)+Pi (aq), $\Delta G$=−7.3 kcal/mol. This energy is not enough to generate photons in the visible and near-IR range directly. Some bioluminescent organisms, such as fireflies and quorum-sensing bacteria, require ATP as a co-factor to overcome the activation barrier in the chemiluminescent reaction. Harnessing metabolic energy as pump source for laser particles may be an option.

Possible methods for electrical pumping include electro-chemiluminescence, current injection into semiconductors, and electric discharges in gases. Gas lasers, such as He—Ne laser and $CO_2$ laser, use electric current that is discharged through a gas. Electrons are accelerated by high voltage (300-1400 V), and their collision with gas molecules generating plasma. The excited molecular ions emit light directly or transfer energy to other gain molecules.

The general mechanism of electro-chemiluminescence involve electron transfer reactions at the surface of electrodes and annihilation of radical intermediates: (1) A→$A.^+$+$e^-$ (oxidation at electrode); (2) B+$e^-$→$B.^-$ (reduction at electrode); (3) $A.^+$+$B.^-$→A.+B (excited state formation); and (4) A.→A+light. The reaction occurs near the diffusion-controlled limit when ion annihilation is the rate-determining step. The kinetic rate of the ion-annihilation step of 9,10-diphenylanthrascene (DPA) is $2\times10^{10}$ $M^{-1}$ $s^{-1}$. An electro-chemiluminescence pumped DPA laser has been demonstrated by using mirror electrodes with 10 V.

In electrically pumped semiconductor lasers, the p-n junction is forward biased with a voltage (typically at 1.5 to 2.5 V). When forward biased, electrons injected into the n-type side flow to the p-type side where electrons in the conduction band are recombined with holes in the valence band. This radiative recombination process can be described with the following simplified rate equations:

$$\frac{dN_1}{dt} = \frac{\eta I}{e} - g(N_1 - N_0)q - \frac{N_1}{\tau_s} \quad (29)$$

$$\frac{dq}{dt} = g(N_1 - N_0)q + \frac{\beta N_1(t)}{\tau_s} - \frac{q}{\tau_c} \quad (30)$$

Here, $N_1$ is the number of carriers in the gain region, $N_0$ is the carrier population at optical transparency, q is the number of photons in the cavity, I is the injection current, $\eta$ is the coupling efficiency (equivalent to quantum yield), e is the electron charge, g is a gain coefficient ($\approx\beta/\tau_s$). Typical semiconductor materials have $N_0/V$=$\sim10^{18}$ $cm^{-3}$, so for a micron-size laser with V=$10^{-12}$ $cm^3$, $N_0$=$10^6$. Using $\eta$=0.4, $\tau_c$=1 ps, $\tau_s$=3 ns, the threshold current in the steady state is given by $I_{th}\approx eN_0/(\eta\tau_s)$=$\sim$130 µA.

Although electrical pumping is commonly employed in semiconductor lasers, the conventional device architecture may not be directly applicable for stand-alone laser particles. We may consider both wire and wireless approaches. It is relatively straightforward to employ some types of narrow electrical wires to supply the necessary bias voltage and current. Wireless power transfer is more attractive for in vivo applications. A radio frequency transmission delivered an electrical power of 4.1 mW to drive semiconductor LEDs at a distance of 1 m, generating an optical power of 7 mW/$mm^2$. Nevertheless, both wired and wireless methods are unlikely to be feasible for standalone micron-sized laser particles. As the size of the lasers decreases, the efficiency of antenna decreases unless the wavelength of the electrical signal decreases proportionally. This demands frequency in the optical frequency, making the wireless transfer equivalent to optical pumping.

Given this challenge, one may consider the potential of harvesting electrical current and voltage from surrounding biological matters. One relevant example is bio-fuel cells, which convert chemical energy into electricity. For example, generations of 0.5-0.8 V of open circuit potential were achieved in mitochondria-based anode using pyruvate and live clam-based anode using glucose. Electrical eels are capable of generating 600 V. Artificial battery inspired from electric eel may enable electrical pumping of laser particles.

Other types of energy include kinetic energy generated by muscles and body movement, which can be converted to electrical energy by having piezoelectric materials, and sono-luminescence.

When a pump pulse is absorbed, part of its energy is converted to heat and increases the temperature of the gain medium. For pump pulses shorter than <10 ns, heat dissipation to the surrounding aqueous medium is negligible during the pulse duration. In this case, the peak temperature increase $\Delta T$ immediately after the absorption of pump energy $E_{abs}$ is given by:

$$\rho V c_V \Delta T = (1-QY) \cdot E_{abs} \quad (31)$$

where $\rho$ is the mass density, V is volume, $c_V$ is specific heat capacity. The factor (1−QY) represents the fraction of absorbed energy converted into heat.

Let us consider three examples. Case I: for an oil droplet with a size of 20 µm (3.8 ng) and a specific heat ($c_p$) of 1.8 J $g^{-1}$ $K^{-1}$, pump energy of 10 nJ on the droplet (i.e. 3.1 mJ/$cm^2$ in fluence) produces heat energy of 4.5 nJ and causes a temperature increase of $\Delta T$=0.7° C. Case II: for a polystyrene bead with a size of 10 µm (0.52 ng) and $c_p$=1.4 J $g^{-1}$ $K^{-1}$, pump energy of 1 nJ on the bead (i.e. 1.3 mJ/$cm^2$ in fluence) generates heat energy of 0.45 nJ and a temperature rise of $\Delta T$=0.6° C. Case III: for a GaAs disk with a diameter of 1 µm and thickness of 250 nm (~1.1 pg=5.8 kg/$m^3$ ($\rho$)*$0.2\times10^{-12}$ $cm^3$) and $c_p$=0.33 J $g^{-1}$ $K^{-1}$, a pump energy of 5 pJ on the disk (0.6 mJ/$cm^2$ in fluence) generates heat of 2.2 pJ and $\Delta T$=6.1° C.

Excessive temperature increase can cause harmful effects to the surrounding medium. A representative effect is protein denaturation, which induces unfolding of protein structure and leads to the loss of protein activity. The free energy change on unfolding of a typical protein in water is 10-20 kcal $mol^{-1}$. This corresponds to activation energy Ea of 0.4-0.9 eV per molecule. According to the Arrhenius model, the rate of degradation is proportional to $e^{-E_a/k_BT}$.

For pulsed heating, the magnitude of thermal injury, represented by protein denaturation, depends on not only temperature, but also the duration of the exposure to the elevated temperature. When the temperature increases for duration of $\tau_e$, the amount of denaturation or the magnitude of thermal damage is given by:

$$\text{Damage} \propto \int_0^{\tau_e} \exp\left(\frac{-\Delta E}{k_B T(t)}\right) dt \approx \tau_e \exp\left(\frac{-\Delta E}{k_B \Delta T}\right) \tag{32}$$

If the heating time is reduced, considerably higher temperatures are required for denaturation. For example, protein denaturation occurs at a peak temperature of 90° C. ($\Delta T=53°$ C.) when exposed to heat with a short duration of 10 ns, whereas protein denaturation is induced at temperature of 60° C. ($\Delta T=23°$ C.) for a long exposure of 1 s.

The internal pressure change due to the temperature rise is given by $$p_1 - p_0 = \alpha_V K_B (T_1 - T_\infty) \tag{33}$$

where $\alpha_V$ is the coefficient of thermal expansion ($2.1 \times 10^{-4}$ K$^{-1}$ for water, $\sim 4 \times 10^{-4}$ K$^{-1}$ for soft tissues, and $\sim 1.7 \times 10^{-5}$ K$^{-1}$ for GaAs), $K_B$ is (isothermal) bulk modulus ($2.2 \times 10^9$ Pa for water, and $8.6 \times 10^{10}$ Pa for GaAs), $p_0$ and $p_1$ are pressure before and after the pump pulse. A temperature increase by 1° C. gives rise to 0.4 to 1.5 MPa for incompressible solids and liquids.

The pressure and thermal expansion produces work. Part of this energy gives rise to mechanical (acoustic) waves. The acoustic energy is expressed as:

$$\frac{(p_1-p_0)^2}{K_B} = \alpha_V^2 K_B (T_1 - T_\infty)^2. \tag{34}$$

The efficiency of photoacoustic generation, defined as the ratio of the acoustic energy to the absorbed heat energy, is given by:

$$\text{Efficiency} = \frac{\alpha_V^2 K_B (T_1 - T_\infty)^2}{\rho c_v (T_1 - T_\infty)} = \Gamma \alpha_V (T_1 - T_\infty) \tag{35}$$

Here, $\Gamma = \alpha_V K_B /(\rho c_V)$ is Grüneisen parameter. Its value is $\sim 0.11$ for water and cells, and 0.7-0.8 for soft tissues. The coefficient $\Gamma \alpha_V$ is $2.3 \times 10^{-5}$ for water ($1.3 \times 10^{-5}$ for GaAs). In biomedical applications, $T_1 - T_\infty$ is typically limited to $<10°$ C., so only a small fraction ($<10^{-4}$) of the absorbed energy is radiated as acoustic waves.

Figure 11:
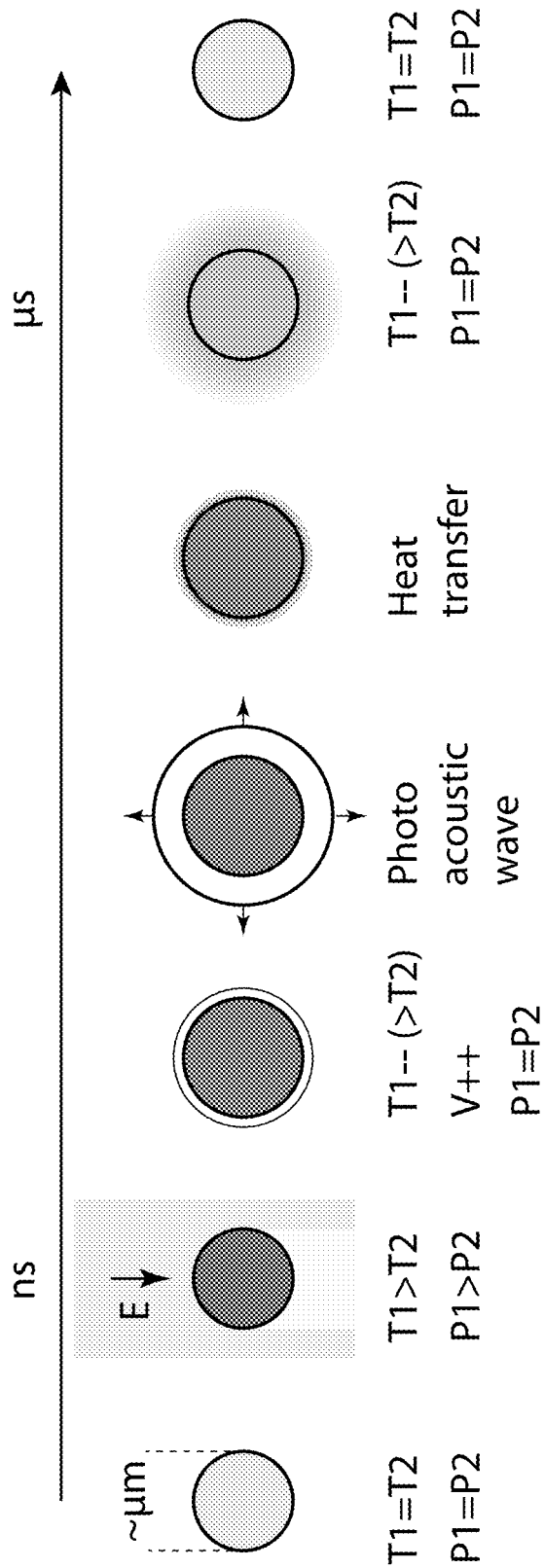
FIG. 11 illustrates thermodynamic processes during the pulsed operation of a laser particle.

The conversion efficiency is not constant but proportional to the temperature rise. It is interesting to recognize that the acoustic energy is proportional to the square of the absorbed energy, rather than linearly proportional to the input energy itself. This relationship may seem counterintuitive but is due to the fact that the initial pressure increase, given in Eq. (34), actually decreases over time during subsequent (adiabatic) volume expansion (FIG. 11). The photoacoustic generation can be viewed as a heat engine. In solids or liquids, the efficiency is low. In gases, $\alpha_V \sim 1/T_1$ (where T is given in K) and we get the familiar expression for a Carnot heat engine: Efficiency $\approx (T_1 - T_\infty)/T_1$. In this case, higher photoacoustic conversion efficiencies can be obtained.

The heat conduction in radially symmetric geometry is described by:

$$\rho c_p \frac{\partial T}{\partial t} = k \nabla^2 T + \dot{q}, \tag{36}$$

where k is heat conductivity and $\dot{q}$ is the rate of heat generation per unit volume. The blackbody radiation of heat has been neglected.

Case I: Short-Pulsed Pumping:

Let us consider a spherical particle with a radius R that is initially in thermal equilibrium with the medium at $T=T_\infty$. The particle is then pumped by a short optical pulse at $t<0$ and was heated to a temperature of $T_1$ at $t=0$. For simplicity, we assume that the particle and medium have identical material properties including heat conductivity. Convection, which originates from the motion of molecules in the surrounding medium, is neglected during the short time scale. The boundary condition can be rewritten as:

$$\frac{\partial F}{\partial t} = \alpha \frac{\partial^2 F}{\partial r^2}, t > 0 \tag{37}$$

$$F(r, t=0) = \begin{cases} r(T_1 - T_\infty) & r \leq R \\ 0 & r > R \end{cases} \tag{38}$$

The Green function of the differential equation is $$G(r, t) = \frac{1}{(4\pi\alpha t)^{3/2}} \exp\left(-\frac{r^2}{4\alpha t}\right) \tag{39}$$

where $\alpha = k/\rho c_p$ is the thermal diffusivity of the medium. At a given t, the Green function has a 1/e half-width at $r = (4\alpha t)^{1/2}$.

Therefore, the time that takes for the heat to diffuse across the sphere with a diameter of 2R becomes:

$$\tau = R^2/\alpha \tag{40}$$

This time $\tau$ is called the thermal relaxation time of the sphere particle.

Figure 12:
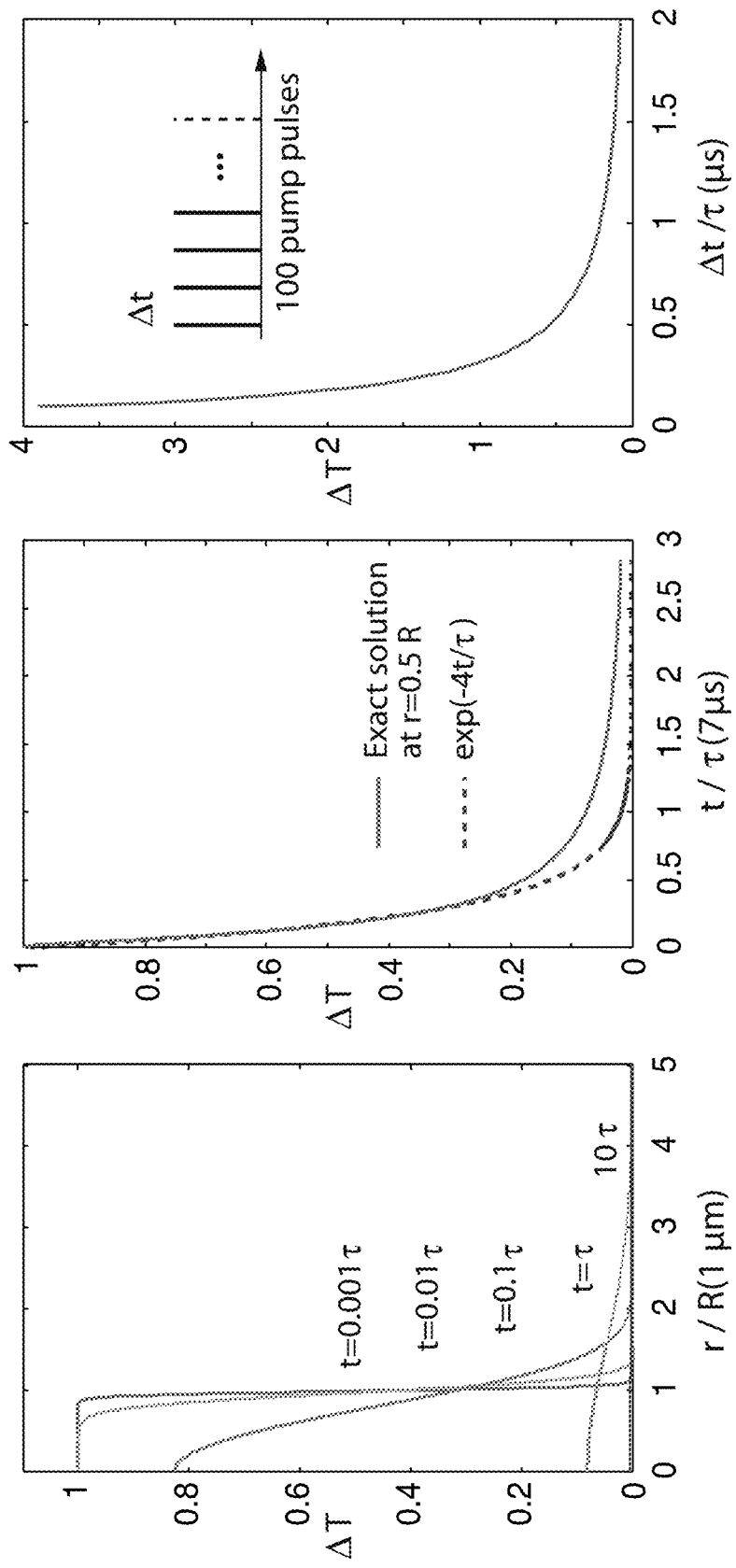
FIG. 12 shows the temperature profile for a sphere with a radius R in a medium with a relaxation time τ, temperature distribution at various times (left), the time-profile of the temperature inside the sphere at r=0.5*R (middle), and accumulated temperature rise after 100 pump pulses as a function of the pulse repetition period (right).
Figure 14:
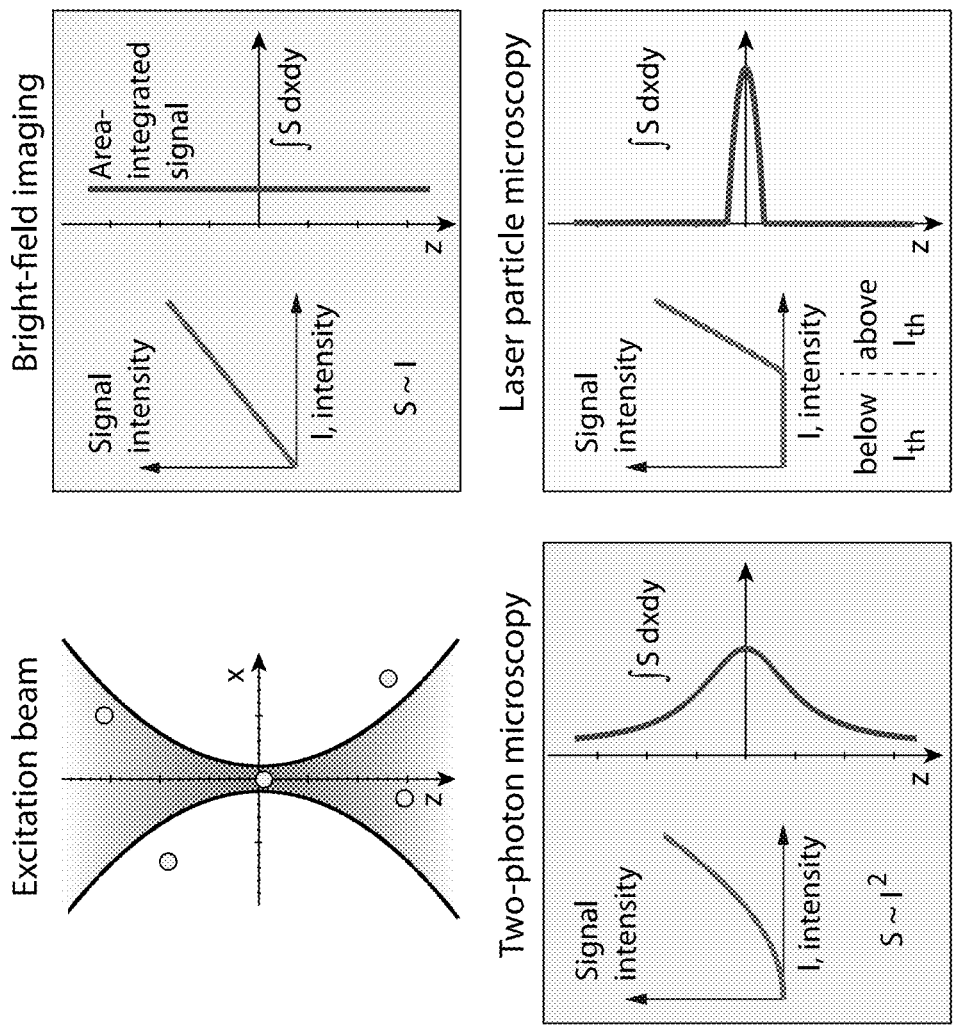
FIG. 14 illustrates the principle of high-resolution optical sectioning by detecting stimulated emission from laser particles. At top left, miniature laser particles (circles) excited by a tightly focused optical pump beam (gray). Comparison of different modalities: bright field imaging (top right); two-photon microscopy (bottom left); laser particle stimulated emission (LASE) microscopy (bottom right).

Using the Green function and the above boundary condition, the solution can be shown to be:

$$\Delta T_{nor}\left(r' \equiv \frac{r}{R}, t' \equiv \frac{t}{\tau}\right) = \tag{41}$$

$$\frac{1}{2}\left\{\text{erfc}\left(\frac{r'-1}{2\sqrt{t'}}\right) - \text{erfc}\left(\frac{r'+1}{2\sqrt{t'}}\right)\right\} + \frac{1}{\pi^{1/2}} r' \sqrt{t'} \left\{e^{-\frac{(r'-1)^2}{4t'}} - e^{-\frac{(r'+1)^2}{4t'}}\right\}$$

where $\Delta T_{nor} \equiv (T(r,t) - T_\infty)/(T_1 - T_\infty)$ is the normalized temperature profile, and erfc=1−erf denotes the complementary error function. In FIG. 12 left panel, we plot $\Delta T_{nor}$ at several time delays. The temperature gradient within the particle is due to the finite thermal conductivity and diffusivity of the particle. FIG. 12, in the middle panel, shows how the particle temperature at $r=0.5R$ decreases with time. It follows an exponential decay with a 1/e time of $4\tau$ when $t<0.2\tau$ and $T \propto t^{-3/2}$ when $t>\tau$. The finite relaxation time has implication on the heating due to repetitive pumping. FIG. 12 in the right panel plots the cumulative temperature rise after 100 pulses with a uniform period, $\Delta t$, between pulses. With $\Delta t = 0.3\tau$, the steady-state temperature increase is about twice the temperature rise by a single pulse. This sets the limit to the maximum repetition rate for pumping, say to 500 kHz in this example.

When the pulse width is shorter than the heat relaxation time, all the heat accumulated in the particle cannot be diffused out to the medium during the pulse absorption. When the medium is tissue or cells, its thermal properties are similar to those of water: So, we may use $k=0.6$ Wm$^{-1}$K$^{-1}$ and $\alpha=0.14\times10^{-6}$ m$^2$ s$^{-1}$. The relaxation time $\tau$ is the fundamental time constant that governs the cooling of particles by heat dissipation to the medium. The time constant is proportional to the inverse of thermal diffusivity. The aqueous medium, such as cytoplasm and tissues, is a better thermal conductor than the air, but more insulating than semiconductors. So, heat dissipation in the biological medium is usually slower than that in on-chip semiconductor lasers. It should be noted that $\tau$ is proportional to R$^2$ or the surface area of the particle. The larger (smaller) the particle, the longer (shorter) the heat relaxation time is; For R=10 μm, $\tau$=700 μs; for R=1 μm, $\tau$=7 μs; and R=100 nm, $\tau$=70 ns.

The analysis above is valid for homogeneous materials and a reasonable approximation for particles that have high water contents or are composed of liquids and polymers, such as oil (k=0.15 Wm$^{-1}$K$^{-1}$), polystyrene (k=0.14 Wm$^{-1}$K$^{-1}$), and silica (k=1.4 Wm$^{-1}$K$^{-1}$).

Laser particles made of semiconductors and metals have thermal conductivities 2-3 orders of magnitude greater than those of dielectrics: for example, GaAs (k=52 Wm$^{-1}$K$^{-1}$), silicon (k=150 Wm$^{-1}$K$^{-1}$), silver (k=410 Wm$^{-1}$K$^{-1}$), and diamond (k=~1000 Wm$^{-1}$K$^{-1}$). In this case, the temperature within the particles is nearly constant. This condition is often described in terms of the Biot number, Bi=hR/k$_1$, where h is the thermal transfer coefficient and k$_1$ is the thermal conductivity of the particle. For a short time scale comparable to the characteristic time, e.g. t<0.2$\tau$, h is time varying but may be approximated to h≈k$_2$/R, where k$_2$ is the thermal conductivity of the medium, and, thus, Bi≈k$_2$/k$_1$. The Biot number corresponds to the ratio of the convection at the surface of the particle to the conduction within the body. Small Biot numbers represent small resistance to heat conduction and small temperature gradients within the particle.

Case II: Continuous Pumping:

We now consider that the pump energy is continuously supplied to a particle at a rate of $\dot{q}_p$ and calculate the temperature of the particle when it reaches the steady state. From the thermal equation in the medium, i.e. $\nabla^2 T=0$ and boundary condition of $-k(\partial T/\partial r)_{r=R}=\dot{q}R/3$, the surface temperature T$_1$ of the particle is:

$$T - T_\infty = \frac{\dot{q}_p R^2}{3k} = \frac{\dot{q}_p \tau}{3\rho c_p}, \quad (42)$$

where the energy rate $\dot{q}_p$ per unit volume is given by $\dot{q}_p V = \eta_{abs} P_p^* \eta_{area}$. The temperature rise is proportional to the relaxation time of the medium.

The requirement on optical radiation is quantified in terms of maximum permissible exposure (MPE), which is defined approximately as one tenth of the damage threshold of harmful photothermal and photochemical effects. The ANSI Z136.1 standard classifies lasers according to the biohazard to the retina and skin. According to the standard guideline, the laser exposure limits of the skin are given by $0.02*C_A$ J/cm$^2$ for $\tau_p$=1-100 ns and $1.1*C_A \tau_p^{0.25}$ J/cm$^2$ for $\tau_p$=100 ns to 10 s, where $C_A$ is a wavelength-dependent empirical coefficient: $C_A=1$ for a spectral range of 400-700 nm, $C_A=10^{0.002(\lambda-700)}$ for 700-1050 nm, and $C_A=5$ for 1050-1400 nm. For long exposure $\tau_p$>10 s, the MPE level is $2*C_A$ W/cm$^2$, which is given in terms of optical intensity rather than fluence because the thermal equilibrium between laser-induced heating and conductive cooling is reached during the long exposure. For long optical exposure of collimated near-IR light at 750-1050 nm to the eye, the MPE level for retinal safety is $C_A$ mW/cm$^2$, where the intensity is measured at the cornea.

Integration of a laser source into biological tissues or living cells requires a standalone and compact device with micrometric dimensions (a typical mammalian cell like a HeLa has a diameter of about 20 μm), a pumping energy source and a good biocompatibility. At the present, there are only a couple of examples of successful integration of lasing structures with a size of typically larger than 8 μm in its largest dimension into cells.

Miniaturization of laser sources has been actively pursued in the past decades with the aim of realizing integrated optoelectronic devices with fast switching times and/or low power consumption. One of the most widespread choices to fabricate small compact lasers is to exploit the whispering gallery modes (WGM) that arise in small structures with a sufficiently high refractive index with respect to the external environment. WGM resonators have been realized in a number of different shapes and materials; the gain medium can be used to make up the cavity itself, or its emission may be coupled to WGMs in a resonator made from an inert material. Polystyrene microspheres doped with dyes have shown to generate lasers upon optical pumping. The smallest microsphere lasers reported to date were about 8 μm, which are limited by the decreasing Q-factor with decreasing sizes. Spontaneous emission from dye-doped microspheres with sizes as small as about 3.5 μm have been reported, but only operation below laser threshold was demonstrated due to the limited cavity Q-factor, gain, and pump energy.

Microdisks are common examples of compact lasers made with semiconductors as the gain media, since these structures can be obtained via lithographic processes from epitaxially grown wafers. They are characterized by lateral dimensions of few to tens of microns, but their thickness can be shrunk down to about 100 nm (corresponding to a limit on the order of λ/4n). Given their high refractive index, which is about 3-3.5 for the most commonly used III-V compounds, the smallest cavities have been demonstrated with inorganic semiconductors. For example, structures with diameter of 2-4 μm, thickness of 100-200 nm and Q-factor up to 12,000-17,000 have been realized for lasing around 900-1000 nm. While much higher quality factors (in excess of 10$^8$) can actually be reached with proper engineering of the device shape and surface roughness, such structures have generally considerably bigger diameters (few tens of microns). On the other end, devices as small as ≈600 nm have been demonstrated, albeit with lower Q factors (on the order of 10$^3$). However, it is noted that these disk lasers are fabricated on substrates, which have a size much larger than the size of the disks. Certainly, no attempts to coat such disks or to insert disk lasers into cells have been reported.

Several pairs of bioluminescence enzymes and substrates with high transfection efficiency and high brightness in the visible range are known. The spectral bandwidth of bioluminescence is typically 50-100 nm, similar to that of fluorescence. The lifetime of bioluminescence is also similar to typical organic fluorophores, in the order of nanoseconds. The typical bioluminescence reaction rate in biological environments is 0.1-10 photon/s per enzyme molecule.

Although this rate is insufficient to generate stimulated emission, bioluminescence can be coupled with optical cavities.

Figure 15:
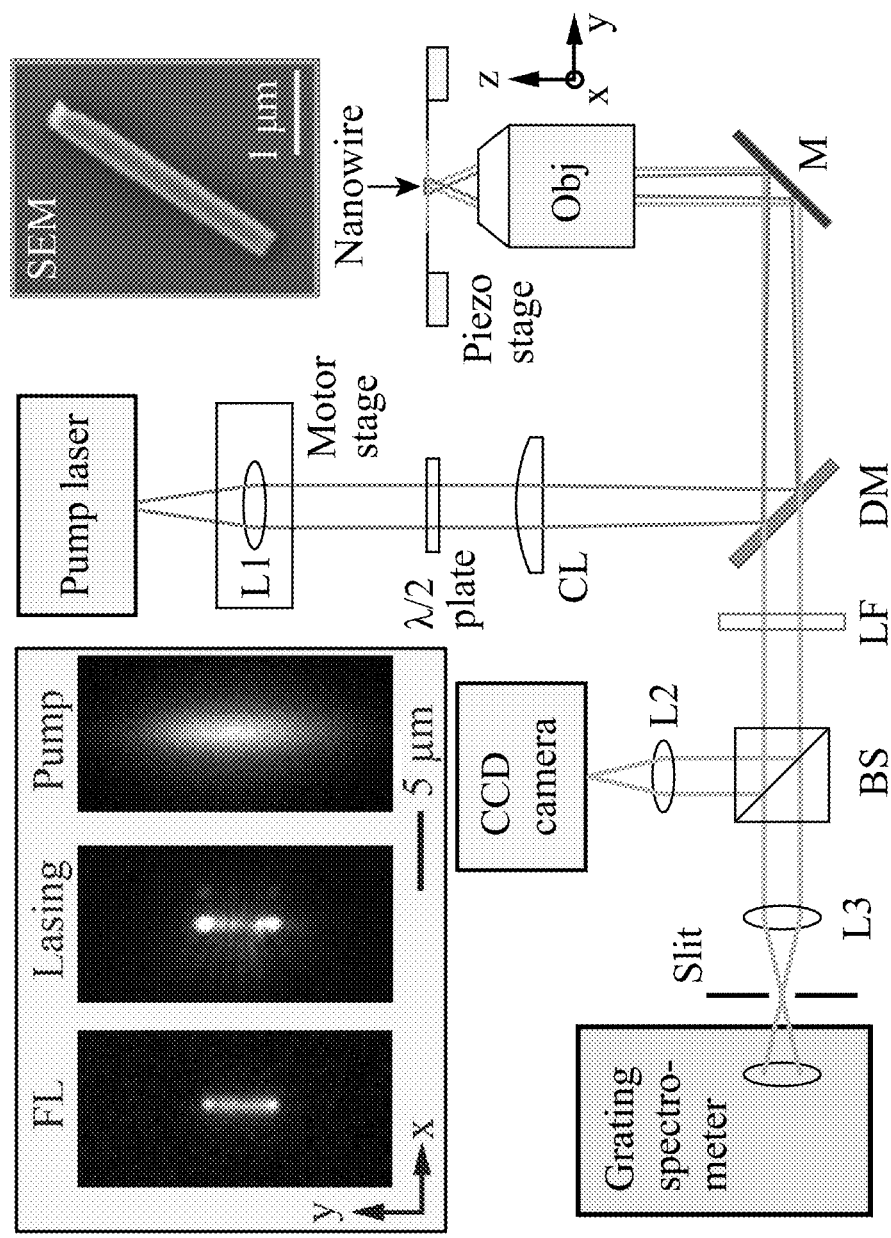
FIG. 15 illustrates a schematic of the setup. L1, L2, L3: spherical lenses, λ/2: half-wave plate, CL: cylindrical lens, DM: dichroic mirror, M: mirror, Obj: objective lens (NA=0.8, water immersion), LF: long pass filter, and BS: Beam splitter. SEM: a scanning-electron-microscope image of a typical lead iodide perovskite nanowire. Insets (from left to right): a typical fluorescence image of a perovskite nanowire below threshold, a stimulated emission image above threshold of the nanowire, and a pump beam profile recorded in the charge-coupled-device camera.

For example, as a preferred embodiment, we have fabricated un-doped polystyrene beads that are coated with luciferases can generate bioluminescence with emission spectra modulated by the cavity modes. Biotinylated *Gaussia* luciferase (GLuc, 19.9 kDa) was coated on the streptavidin-coated surface of polystyrene micro-beads. The Gluc on the bead's surface oxidizes coelenterazine (CTZ, 423.46 Da) to generate bioluminescence light that is evanescently coupled to the WGMs of the bead (FIG. 15, left panel). When CTZ (25 µM) was added to a medium containing dispersed GLuc-coated beads, bright bioluminescence emission was generated from the beads' surface (FIG. 15, middle panel). A representative output spectrum acquired from 23 to 28 s after the addition of CTZ shows a well distinguishable WGM structure (FIG. 15, right panel). The mode structures in the output emission are distinct from standard broad emission of bioluminescence. Compared to optically pumped fluorescent particles, the bioluminescence particles can be excited in tissues at depth and almost anywhere in an organism by administering substrate molecules, for example, via intravenous injection, without the limitation imposed by the penetration depth of optical pumps.

Stand-alone laser particles, once injected into biological systems such as soft tissues, may be detected and localized by an optical imaging instrument such as fluorescence microscope. However, a novel microscope configuration may be devised to detect the stimulated emission from the laser particles. Consider an excitation beam focused into a medium containing a uniform distribution of probes (FIG. 16, top left). With one-photon excitation, the total amount of signal integrated over a cross-sectional area at z is constant (FIG. 16, top right), and thus, bright-field imaging does not provide optical sectioning for thick samples. In two-photon microscopy, signal intensity is proportional to the intensity square of the excitation beam; this provides optical sectioning (FIG. 16, bottom left). In the case of laser particles, lasing can be achieved only at the focus where the intensity exceeds the lasing threshold (FIG. 16, bottom right); this provides optical sectioning with spatial resolution below the diffraction limit. This technique can be referred to as laser particle stimulated emission (LASE) microscopy.

Above threshold, the full-width half-maximum (FWHM) of the PSF, $\Delta_{LASE}$, can be derived from Eq. (6) for axial (z) and lateral (x, y) directions. An approximate form for the resolution enhancement factor is shown to be:

$$\frac{\Delta_{LASE}}{\Delta_0} = \sqrt{1 - \frac{2(1 - \sqrt{\beta})}{(1 + P/P_{th})}} \quad (43)$$

where $\Delta_0$ is the diffraction limit of Gaussian beams: $\Delta_{0,z} = 2z_R$; $\Delta_{0,x,y} = 1.67 z_R NA$, where $z_R$ and NA are the Rayleigh length and numerical aperture of the excitation beam, respectively. The resolution is always less than diffraction limit and smallest near the threshold $P_{th}$ at which $(\Delta_{LASE}/\Delta_0)_{min} = \beta^{1/4}$.

LASE microscopy uses single-photon absorption (although two-photon pumping is possible), generates stimulated emission only at the focal volume, and does not require a tight pinhole. In this sense, LASE microscopy has the advantageous features of confocal and two-photon microscopy to achieve efficient generation and collection of signals, with sub-diffraction limit resolution.

Another advantageous feature is low out-of-focus background. The narrow spectral features of the laser output are easily distinguished from auto-fluorescence from other fluorescence molecules that may be present around the laser particle. The decay time of stimulated emission is determined by the cavity lifetime, which is much shorter than fluorescence decay times. Therefore, lifetime measurement can differentiate laser modes from spontaneous background. The low background in LASE microscopy can offer enhanced imaging depths, greater than 500 µm or even 1-2 mm, in scattering tissues.

We constructed an inverted imaging setup (FIG. 15). The configuration of the setup is analogous to a line-confocal hyperspectral fluorescence microscope, but unlike typical hyperspectral microscopes, the apparatus uses a high-resolution (0.05-2 nm) spectrometer with a comprising a tunable entrance slit, a diffraction grating, and a charge-coupled device (CCD) camera with 1024-4096 pixels.

As laser particles, we used lead iodide perovskite ($CH_3NH_3PbI_3$) nanowires that were grown to typical widths of 300-500 nm and lengths of 3-7 µm. The samples were transferred to a slide glass and sealed from air with a cover glass optical epoxy to prevent degradation by moisture and oxygen.

Given the long shape of nanowires, the pump beam was shaped to have a matching elongated shape and measured scan profiles across the short axes of nanowires. The pump light source was a microchip laser emitting at 532 nm with a repetition rate of 5 kHz and a pulse duration of ~2.5 ns, slightly longer than the fluorescence lifetime ($\tau \approx 2$ ns) of perovskite. The objective lens was a 0.8-NA, 40× water immersion lens (Nikon). A cylindrical lens (CL; f=500 mm) was employed to make an elliptical pump beam profile at the focus, with a FWHM of 2.4 µm along the x-axis and 9.5 µm in the y-axis. The elliptical pump profile was employed to illuminate the whole length of the nanowire and therefore achieve efficient pumping. The nanowire on a sample stage was oriented parallel to the major (y) axis of the pump beam. The polarization axis of the pump beam was aligned orthogonal to the long (y) axis of the nanowire, at which the threshold intensity was the lowest. The pump beam was scanned along the x-axis by translating a collimation lens (L1) resulting to a 35-nm step resolution in the imaging plane. The output emission was directed to the camera and a polarization-independent, diffraction grating-based spectrometer. The entrance slit of the spectrometer was oriented along the long-axis (y) of the nanowire so that the emission from the entire nanowire was collected by the spectrometer. The spectral resolution was ~1 nm.

The inset of FIG. 15 shows a typical pump beam profile imaged on the CCD, and fluorescence and laser emission images from a 5-µm-long nanowire, collected through a long-pass filter (LF) on the CCD, at pump energy levels below and above threshold, respectively. The laser emission profile exhibits bright spots at both ends, indicating longitudinal laser oscillation, and characteristic interference patterns of coherent laser emission. The polarization states of the laser output at the detector plane were nearly parallel to the short (x) axis.

Figure 16A:
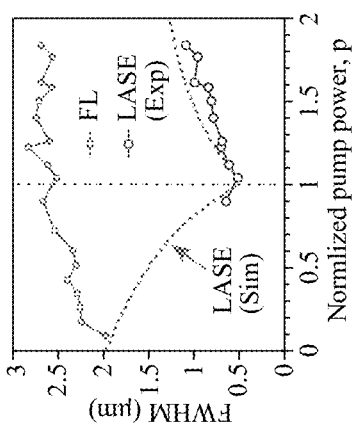
FIG. 16A shows a typical laser output spectrum (circles) from a perovskite nanowire. Curves: the curve fit for fluorescence background (gray) and the stimulated-emission laser output spectrum (magenta) calculated by subtracting the fluorescence background from the measured spectrum.
Figure 16B:
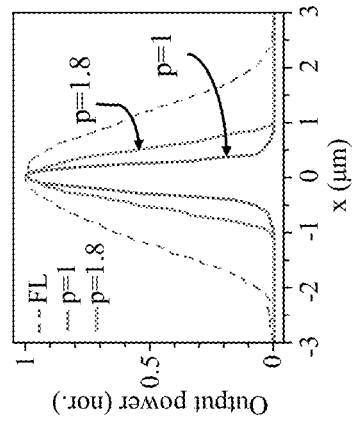
FIG. 16B shows the stimulated emission output power (squares) measured as a function of the pump pulse energy intensity level. Line: a curve fit based on Eq. (6). Inset: same plot in a log-log scale.

Experiments were performed to support the proof of concept of LASE imaging. FIG. 16A shows a typical output spectrum from the nanowire above threshold. The spectrum was decomposed into broadband fluorescence background (grey curve in FIG. 16A), which has the same profile as the fluorescence spectrum obtained at a low pump power, and a narrowband stimulated emission component (magenta curve). The laser power was measured by integrating the stimulated emission spectrum. FIG. 16B shows the measured output as a function of pump energy. The data reveals a well-defined lasing threshold at a pump pulse energy of 0.58 mJ/cm$^2$. The best curve fit based on Eq. (6) was obtained with $\beta=1.3\times10^{-3}$.

Figure 16C:
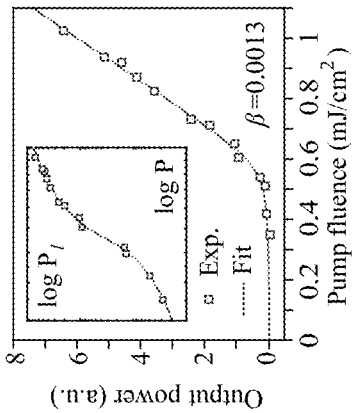
FIG. 16C shows three pump-beam scan profiles of the nanowire for fluorescence background at p $(=P/P_{th})<1$ (green dashed line) and stimulated emission at p=1 (gold) and p=1.8 (cyan), respectively.
Figure 16D:
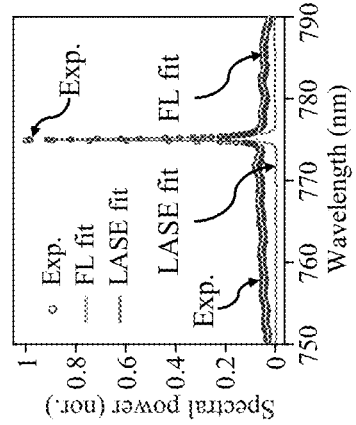
FIG. 16D shows the measured FWHM values of laser emission profiles (blue circles) and fluorescence profiles (green circles). Dashed curve: a simulation result.

FIG. 16C shows the x-scan profile of the nanowire at two different pump levels, p ($=P/P_{th}$)=1 and 1.8, respectively. The measured transverse (x-axis) resolution $\Delta_{LASE}$ is 520 nm at p=1, about 5 times lower than the resolution of fluorescence detection, measured from a scan profile of fluorescence background emission at p=1 (FWHM, ~2.5 μm). The FWHM of LASE microscopy had the minimum at p≈1 and increased with increasing pump pulse energy, as shown in FIG. 16D. A fit curve based on numerical simulation using the actual pump profile and an assumed nanowire size (5 μm×0.3 μm) showed good agreement with the experimental data. The slight increase of the fluorescence FWHM with increasing pump is presumably due to pump-induced fluorescence saturation or gain depletion (i.e. $N_0$ decreases with q).

Similar resolution enhancements by a factor ~5 were measured consistently from numerous different nanowires, with similar lengths and β values. The opening width of the confocal slit in front of the spectrometer affected resolution only modestly, through its influence on the laser output measurement leading to slightly different β values.

Figures 17A, 17B:
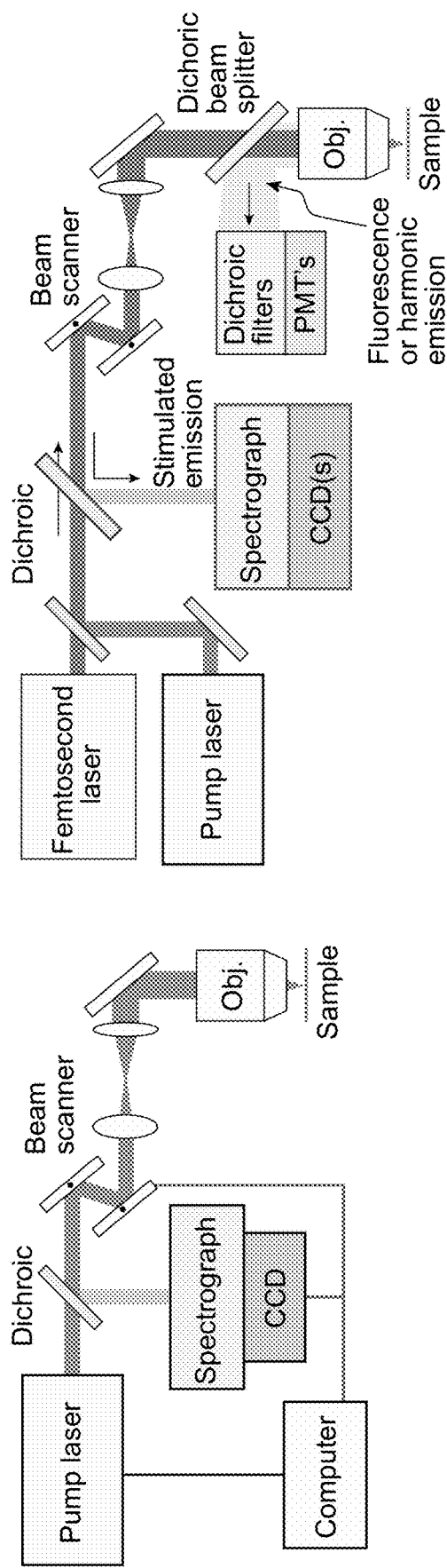
FIG. 17A depicts an example hyper-spectral microscope to measure laser emission from laser particles and thereby identify and localize them, in accordance with one or more implementations.
FIG. 17B depicts an example multimodal microscope combining hyper-spectral and multi-photon imaging, in accordance with one or more implementations.

A LASE microscope may be extended from the setup in FIG. 15 to a beam-scanning imaging setup by employing a beam scanner, as illustrated in FIG. 17A. Galvanometer mirror scanners and acousto-optic beam deflectors are among those well known.

A LASE microscope may be further combined with other imaging modalities, such as confocal fluorescence imaging, multiphoton imaging, reflection imaging, and optical coherence tomography (OCT). For example, the system can employ a femtosecond laser to generate and collect two-photon or three-photon excited fluorescence or harmonic generation signals from the structures, such as cells and tissues, surrounding the laser particles. An exemplary embodiment is illustrated in FIG. 17B. Appropriate dichroic filters and beam splitters, known in the art, may be used to manage the femtosecond excitation beam and a pump beam, as well as the fluorescence and harmonic signals and the stimulated emission from laser particles.

Instead of optical detection, laser particles may be detected and imaged by using photoacoustic microscopy. Laser particles can release a small fraction of absorbed pump energy as acoustic wave energy. This mechanism may allow the particles to be detected by acoustic transducers as in photoacoustic detection. The amplitude of the acoustic wave is proportional to the pump rate P(t). In an unsaturated regime that $N_g \approx N_{tot}$, the photoacoustic signal is simply proportional to the pump intensity.

However, the number of molecules in the excited state $N_1$ becomes comparable to $N_{tot}$, the depletion of the ground state limits pump absorption and, as a result, attenuates the photoacoustic signal compared to the unsaturated case for the same intensity. It is noted that above threshold, the laser oscillation clamps the number of excited molecules to a constant level because the stimulate emission brings down the excited-state molecules to the ground state. As the gain molecules are recycled more rapidly in lasers, this process can result in higher photoacoustic signals in laser particles compared to the same gain medium without cavity in the saturated regime.

Guide star is an astronomical technique to estimate wavefront distortion due to atmospheric turbulence. Since density of air becomes varied when turbulence exists, heterogeneity of refractive index deforms a wavefront of light, then telescope in ground observatory detects severely degrade star images. To solve this problem, a laser beam is illuminated directly to the sky and wavefront distortion is measured by comparing the difference between incoming light and returning light. The return light can be generated by Rayleigh scattering of laser light from the air molecules at 10 to 15 km altitude or laser-induced fluorescence of atomic sodium at 95 km altitude. After guide star-assisted wavefront measurement, blurred star image can be recovered via an adaptive optics device, such as an array of deformable mirrors to compensate wavefront distortion.

Using same principle in astronomy, guide star also plays an important role in biological imaging. Biological tissue causes scattering and distortion of wavefront due to its inhomogeneous optical properties, limiting imaging of specimen, especially placed at depths. Since transmission matrix provides the estimation of output field after scattering media at given arbitrary input field, it is possible to make a focused spot or correct degrade images of specimen in deep tissue by shaping wavefront of input light based on the information of transmission matrix. In this process, guide star is helpful to measure a transmission matrix of given tissue. The principle for guide star involves feedback and conjugation processes. First, a feedback method utilizes fluorescent particle placed in deep tissue and monitors fluorescence intensity and find out the maximum intensity. Second, a conjugation method collects light emitted from a target and synthetize a phase-conjugated beam that, when illuminated to the tissue, can trace back to the focus. This process is possible because scattering and propagation of light in tissue is time-reversible.

Rather than normal fluorescent label, laser particle can be a potential candidate that can show better performance as a guide star. For example, lasing threshold of laser particle can be a sensitive indicator in feedback guide star. Laser particles can be an ideal source for conjugation guide stars, since they can generate spatially and temporally coherent light. Combining with injection locking that gives temporal phase to emitted light from laser particle, laser particle can be implemented into various applications such as conjugation-based correction using coherence gating.

Figure 18A:
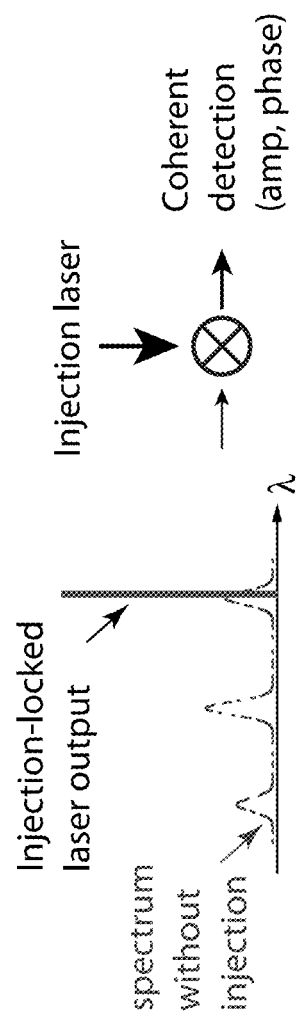
FIG. 18A depicts the principle and application of injection-locked laser particles, illustrating that injection locking requires the coupling of injection beam into a laser particle while pumping is on so that the injection seed is amplified and develop into laser oscillation.
Figure 18B:
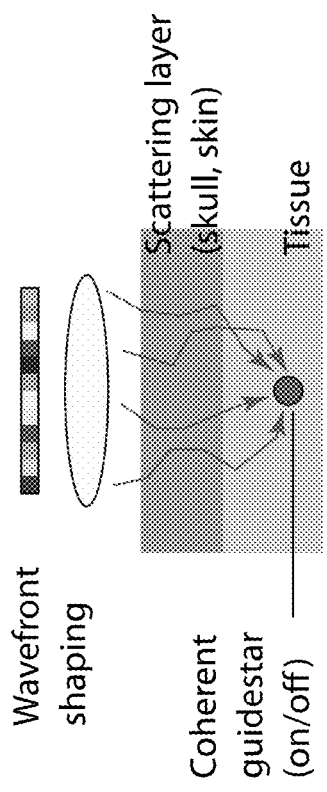
FIG. 18B illustrates the injection locked laser output, which is normally different from the output spectrum in a free running mode output without the injection seed light. The injection-locked output has a high degree of coherency with respect to the injection beam. The coherence allows the laser output to be detected by interference with the output of the injection laser.
Figure 18C:
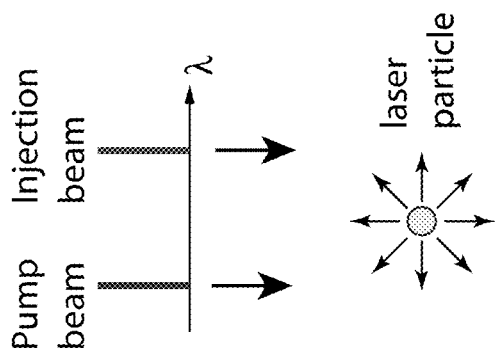
FIG. 18C is a schematic of wavefront shaping guided by the narrowband light from the laser particles embedded in a scattering medium such as biological tissue.

The coherency of the output can be extended to the optical phase level by using injection locking (FIG. 18A). Injection locking states that when a narrowband light enters the laser from outside, the light can be amplified in the cavity and lock the output so that the phase of the laser output is phase-locked to the injected beam. Injection locking establishes phase coherency with respect to the injection beam and should allow laser particles can be detected using coherent interferometry (FIG. 18B). Using this principle, we can measure the wavefront of the laser output outside the tissue via interference with the injection beam, while the pump is modulated on and off (blinking guide-star). When a conjugate beam of the same wavelength but with the conjugate wavefront is illuminated onto the tissue, it can trace back its way to where the laser particle is located (FIG. 18C). This technique can be useful for precision deep-tissue optical modulation. In addition, injection locked laser particles can in principle be detected with optical coherence tomography, potentially serving as contrast agents.

Laser particles may be incorporated into the cytoplasm of live cells. A variety of biological and cellular uptake processes exist, which includes endocytosis, phagocytosis, and macro pinocytosis. Cells may be incubated with a media containing laser particles for sufficient time so that cellular uptake of the particles occur.

For cells that do not uptake particles efficiently, physical insertion methods, such as robotic pipette-based injection, may be used.

More controlled uptake or laser loading process can be achieved by using a microfluidic droplet device. A couple of techniques to generate aqueous droplets encapsulating micro and nanoscale objects in oil using syringe pumps are well known in the art. FIG. 19A depicts a schematic of an exemplary microfluidic channel device, in which two droplets each containing laser particles or cells are configured to be merged into a single droplet, and the cell in the droplet subsequently internalize the laser particle (FIG. 19A).

Figure 19B:
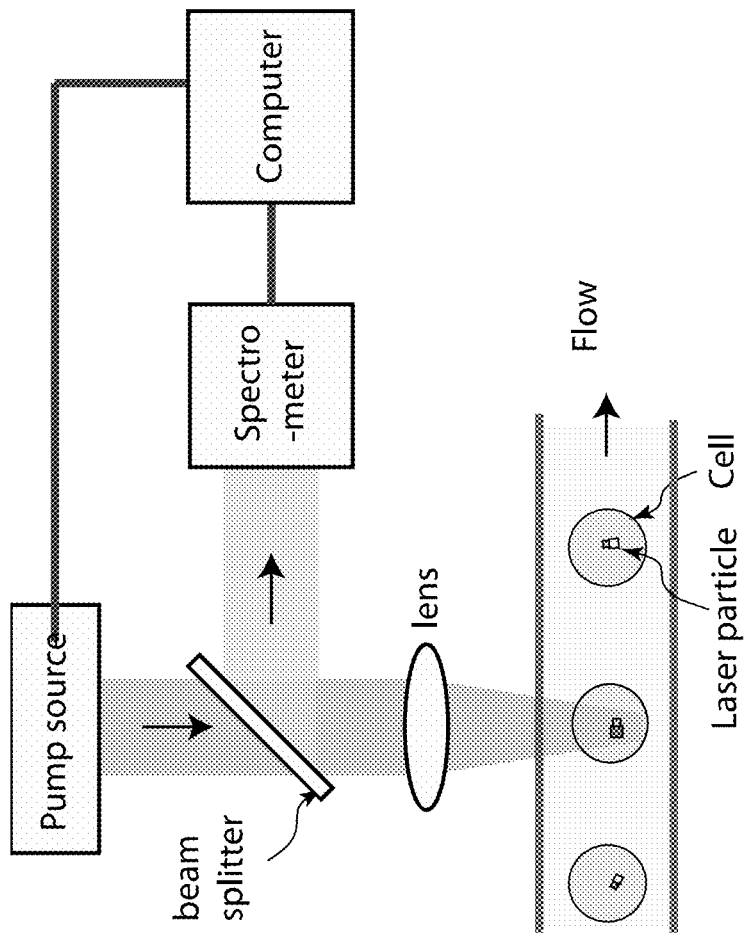
FIG. 19B depicts an apparatus for reading the laser particles in each cell, in accordance with one or more implementations. A sorting apparatus may also be added to sort cells depending on the readout of the laser emission spectra.
Figure 19A:
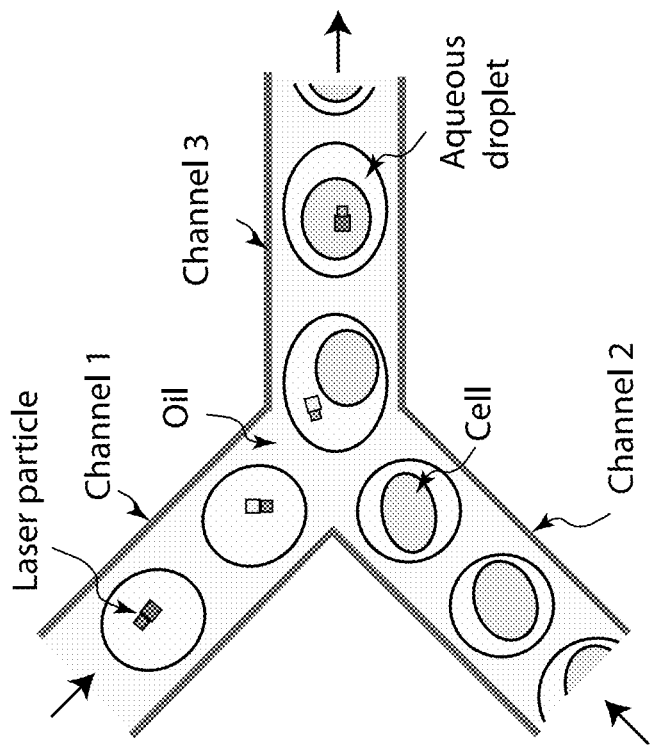
FIG. 19A depicts a schematic of an example microfluidic chip for loading laser particles into cells in controlled manner, in accordance with one or more implementations.

FIG. 19B shows a schematic of an apparatus that employs a microfluidic channel device, pump light source, and a spectrally resolving detection device, which is capable of measuring the output spectrum of laser particles in cells. This apparatus is well suited for the high-throughput readout of the spectral signature or barcode of the intracellular laser at high speed.

Employing a passive or active sorting arrangement, such as pillars and high-voltage electrodes, the apparatus may be operated to sort laser particles or cells carrying or containing laser particles by using the optical information based on the output emission spectra from the laser particles.

Due to their narrow emission spectrum, lasers and optical cavities embedded in cells have great potential for applications in optical tagging of single cells. Cell tagging would enable to distinguish between large number of subpopulations of cells or even studying cells at singe-cell level and for highly multiplexed assays. Current tagging methods include graphical encoding with emitters arranged in specific patterns, physical encoding, lifetime encoding, spectrometric encoding, and mass-based tagging using rare earth elements. Most of these methods are limited to approximately 10 to 100 barcodes. Graphical barcodes enable a larger number of combinations, but they require imaging, which is slow. Spectrometric methods including Brainbow and Multibow are limited by the broad emission of the dyes, quantum dots or fluorescent proteins. The number of unique tags can be increased by multiplexing with intensity and encoding with up to 500 combinations is commercially available. Intensity encoding however requires calibrated instruments and can change due to photobleaching, dye degradation, light scattering and absorption, which could be especially problematic for in vivo studies.

Figure 20:
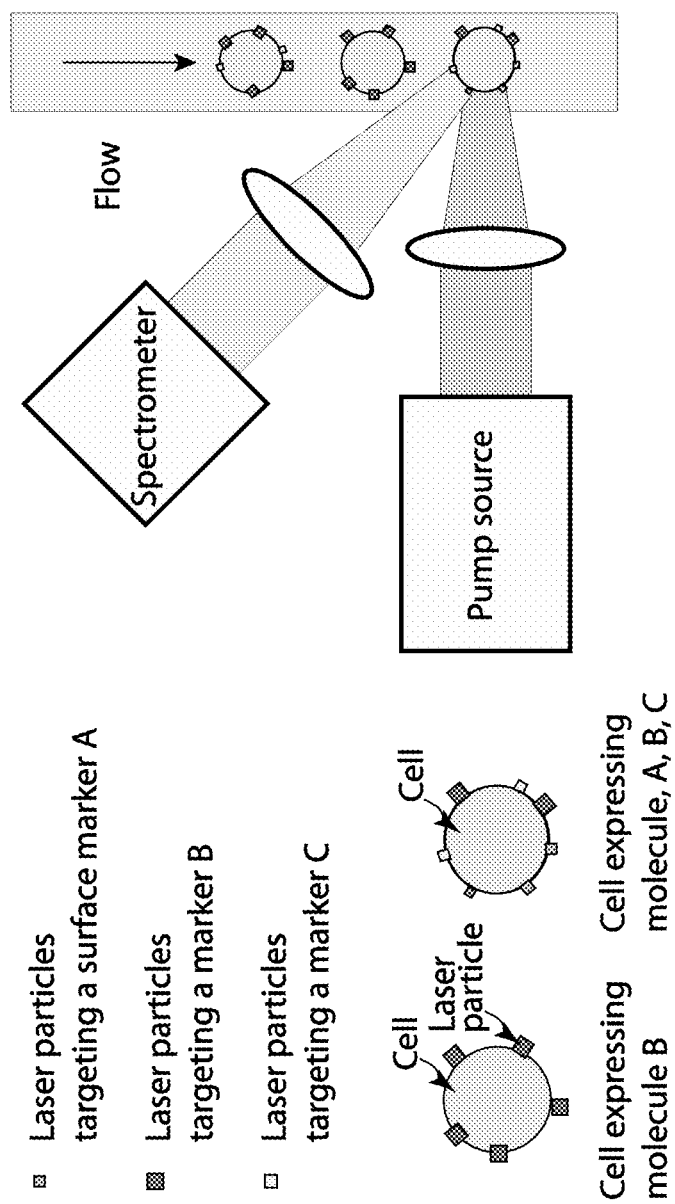
FIG. 20 depicts an example schematic of flow cytometry based on laser particles as luminescent probes targeting specific cellular surface markers, in accordance with one or more implementations.

Conventional fluorescence microscopes and fluorescence-activated cell sorters (FACS) cannot resolve fine spectral lines. For high spectral measurement resolution, a flow cytometer apparatus can be configured by employing a pump source and a high-resolution spectrometer (FIG. 20).

Laser particles with submicron sizes are coated with binding molecules, such as antibodies, peptides, and click molecules. These laser probes are mixed with cells so that the probes bind with target specific biomarkers on the cellular surface or in the cytoplasm (FIG. 20). For each recognizing molecule, laser particles with the same output wavelength are assigned, and different recognizing molecules are attached to laser particles with different wavelengths. Then, the quantity of each type of laser particles can be readily analyzed by measuring the intensity at their corresponding wavelength. The quantity is proportional to the abundance of their target molecules.

To realize miniature laser particles, in certain implementations, photonic semiconductor whispering-gallery-mode disk lasers may be used. Because the refractive index (n=3-3.5) of semiconductors is much higher than that of the cytosol (n=1.33-1.4), semiconductor disk lasers can have a diameter of smaller than the vacuum optical wavelength and a thickness of a fraction of wavelength. Like quantum dots, semiconductor particles do not photo-bleach and biodegrade, making them suitable for long-term tracking.

Millions of identical or incremental particles can be fabricated from a single batch by standard electron beam lithography (FIG. 21A). After reactive ion etching and partial chemical wet etching, a microdisk on a pillar is produced. This structure is well known in the art. Upon optical pumping with 980-nm, 5 ns pulses, the microdisk-on-pillar laser generates narrow laser emission (FIG. 21A).

In example implementations, we have fabricated semiconductor micro-disks with diameters ranging from 0.5 to 3 μm. These micro-disks can have an InAlGaAs quantum well structure built on an InP substrate. The disk shape can first be lithographically carved using electron beam lithography, reactive ion etching, and then disconnected from the substrate by acidic wet etching that removes InP sacrificial layers (FIG. 21B). The final product is a standalone disk laser or "laser particle" (FIG. 21B). The laser particles can be transferred after appropriate filtering to an aqueous solution.

When optically pumped at 1064 nm with sufficient pulse energy (1-100 pJ), almost all the laser particles harvested reached laser thresholds and generated narrowband stimulated emission (FIG. 21C). Most laser particles emit a single mode corresponding WGM modes of/=10-11. Some particles generated two modes characterized by two distinct laser lines separated by 50-60 nm, corresponding to the free spectral range of the disk cavity.

The laser output from a microdisk particle can be measured through a relatively thick biological tissue, such as the murine ear skin, with a high signal to noise ratio (FIG. 21C).

Figure 22A:
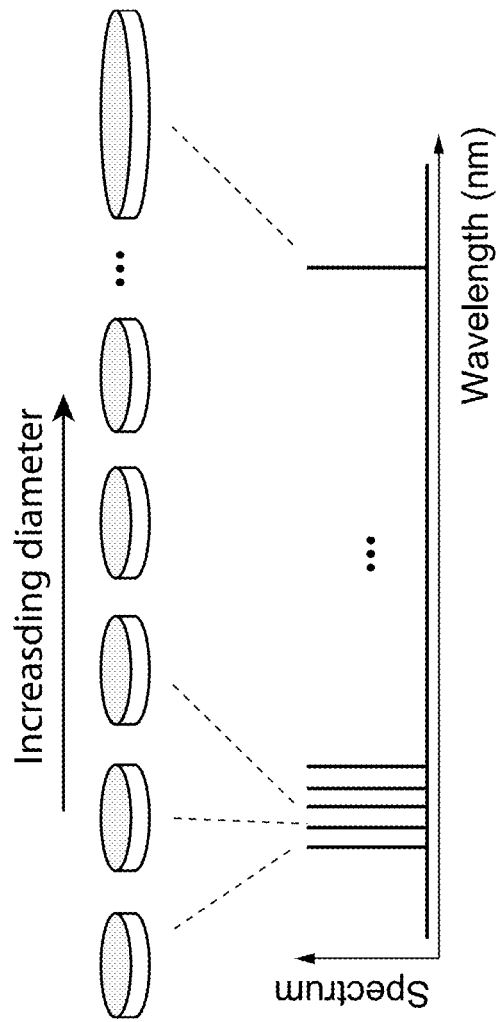
FIG. 22A depicts a method for producing laser particles with different spectral barcode features, in accordance with one or more embodiments. At top, microdisk lasers with incrementally varying diameters are shown. At bottom, laser mode wavelengths distinctly different depending on the size are shown.
Figure 22B:
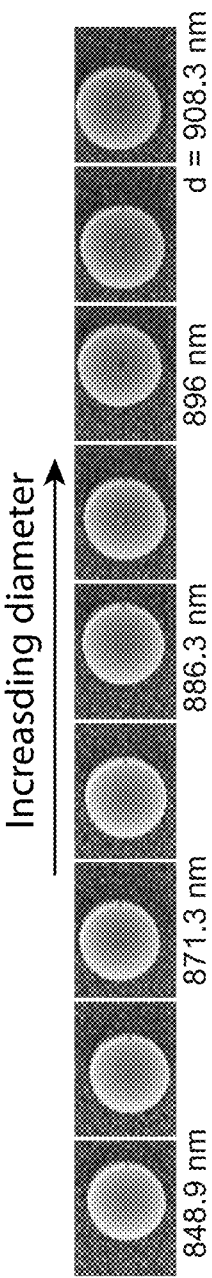
FIG. 22B show various semiconductor microdisks produced by e-beam lithography for different disk diameters.

As described in Eq. (22), the output wavelength of laser disks can be tuned by varying the diameter (FIG. 22A). With electron-beam lithography, it is possible to vary the diameter of disk at a high precision at a step down to 1 nm (FIG. 22B).

Besides diameters, several other variables can be used to tune the output wavelengths. These include different semiconductor materials for the active and clad (shell) regions, strain of the semiconductor materials, the thickness of quantum wells, distance between quantum wells in the case of multiple quantum wells, and the thickness of passivation layers. A grating structure can be formed on the surface of laser particles for mode selection and to achieve single mode oscillation.

Material systems for short wavelengths in the UV, blue, and gree regions are II-VI compounds and III-V nitride systems, such as ZnS, ZnSe, GaN, and AlN. AlGaInP systems, such as $Ga_yIn_{1-y}P$ quantum wells sandwiched in $(Al_xGa_{1-x})_{0.51}In_{0.49}P$ separate confinement barrier layers, can generate visible wavelengths in 600-700 nm. $Al_xGa_{1-x}As$ grown on GaAs lattice are suited to obtain lasing wavelengths in the range of 700-900 nm for double heterostructures. The wavelength region of 900-1100 nm can be converted by the strained $In_xGa_{1-x}As$ sandwiched between AlGaAs or GaAs layers. The range of 1.1 to 1.65 μm is covered by $In_{1-x}Ga_xAs_yP_{1-y}$ grown on InP or $Al_xGa_yIn_{1-x-y}As$—InP system. Other systems include InGaAsN/GaAs quantum well structures.

For another experimental demonstration of laser particles and their intracellular operation, we fabricated microdisk lasers from various semiconductor epitaxial wafers. The wafers include InP/InAlGaAs/InP with different alloy compositions for the InAlGaAs gain layers with a thickness of 200 nm (or 350 nm). The nominal gain center wavelengths of the wafers were 1200, 1275, 1350, and 1425 nm, respectively. We also fabricated microdisk lasers from GaAs/AlGaAs/GaAs (840 nm), and InP/InAlAs/InP (840 nm), as well as quantum well wafers.

Electron-beam lithography has high resolution at 10-nm scales but requires relatively long scan times. For rapid fabrication in large volume, we used optical lithography using a custom-made mask and photoresist. After UV illumination and reactive ion etching, the size of disk columns ranged from 1.5 to 3 μm. The patterned substrate was transferred to an HCl solution for wet etching to remove InP sacrifice layers. After filtering and washing, we obtained stand-alone laser particles in colloidal solution. The yield of the wet-etching/transfer process could be as good as 50% by carefully minimizing the loss of particles. Out of 10 million microdisks on substrate, more than 5 million stand-alone laser particles were collected.

Figure 23:
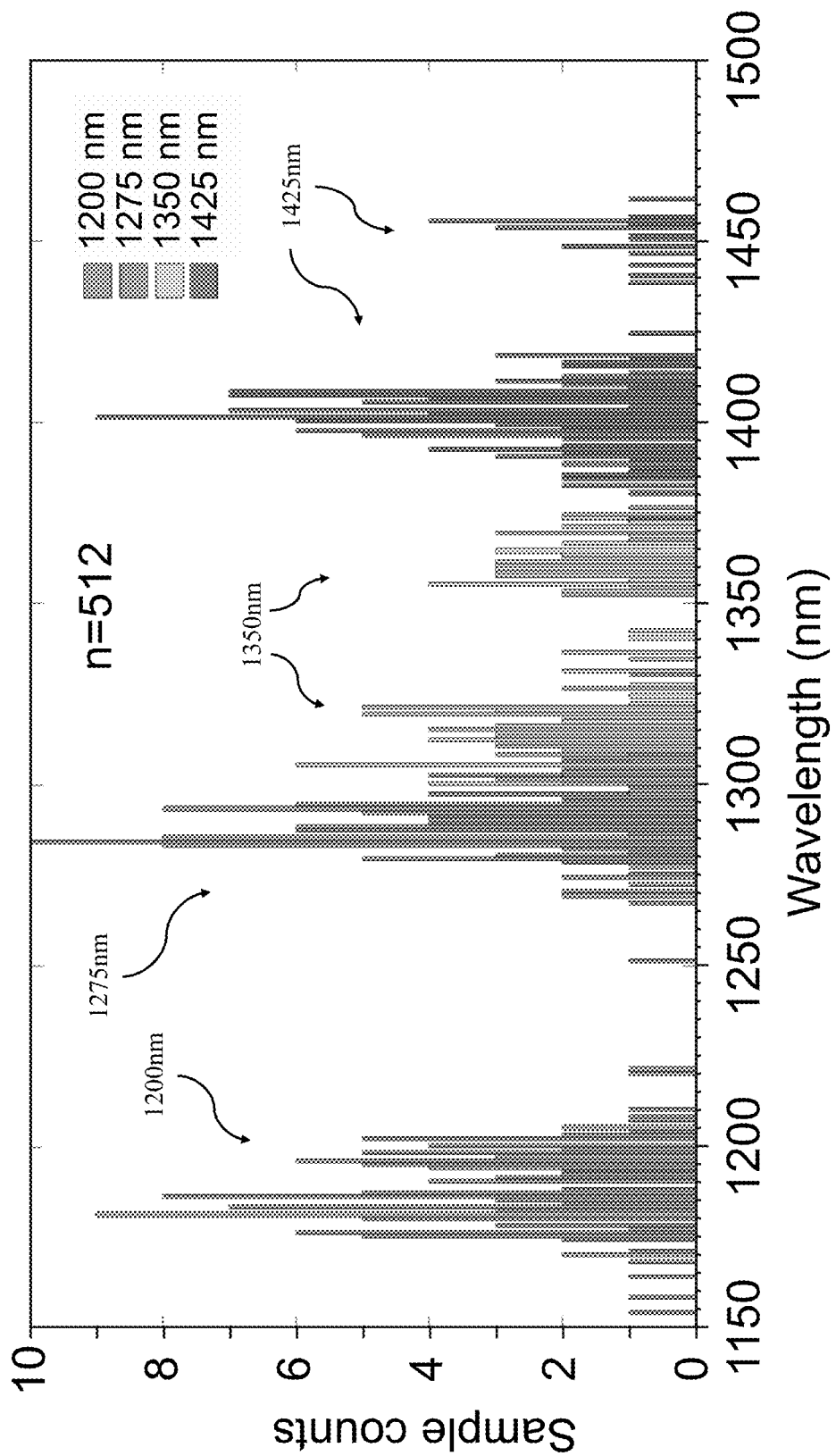
FIG. 23 illustrates a histogram of the output wavelengths of 512 laser disk particles made in accordance with one or more implementation from four different semiconductor wafers with different alloy compositions indicated by color. The bin size is 1 nm.

FIG. 23 shows the distribution of the output wavelengths of 128 laser particles made of three wafers made of slightly different alloy compositions of InAlGaAs. The particles were placed with one of its flat surface in contact with flat glass substrates and the other surface is exposed to the air. The optical pumping was done with nanosecond pulses from a Nd-YAG laser (1064 nm), focused to a typical spot size of 1-2 μm. The nominal size of the laser particles was 2.3 μm, but the actual sizes are not identical because of the finite resolution and random or systemic variations ion the optical lithography steps and other possible factors. As a result, the measured histogram displays a wide range of wavelength over the entire gain spectrum for each wafer. A wide spectral range from 1150 nm to 1500 nm can be completely filled with an interval of 1-2 nm or less by using wafers with appropriate compositions and optimization of the diameter ranges.

Semiconductor materials exposed to the aqueous and biological environment may generate electrochemical effects that can be toxic. At surface, the bond structure is broken. The broken bond makes the surface highly reactive, resulting in surface reconstruction (surface atoms bond among themselves) and surface contamination by the adsorption of O, C, and other atoms and molecules. This can alter the energy levels of semiconductor at the surface, which can result in the leakage of carrier current through the surface to the surrounding environment and generate a number of undesired electrochemical processes such as semiconductor corrosion and water splitting, as well as the degradation of quantum efficiency of the laser particles.

A practical solution to this problem is coating of semiconductor surface with passivating layer so that bulk bonding prevails at the semiconductor surface. The widely used capping materials include $SiO_2$ (FIG. 24A) or similar semiconductors with matching lattice constant but wider band gap. The wide band gap prevents carriers from escaping from the semiconductor. To further reduce the undesirable effects due to surface electrochemistry, the encapsulating material and pump wavelength may be chosen so that the material is not optically excited by the pump light.

Figures 24A, 24B, 24C:
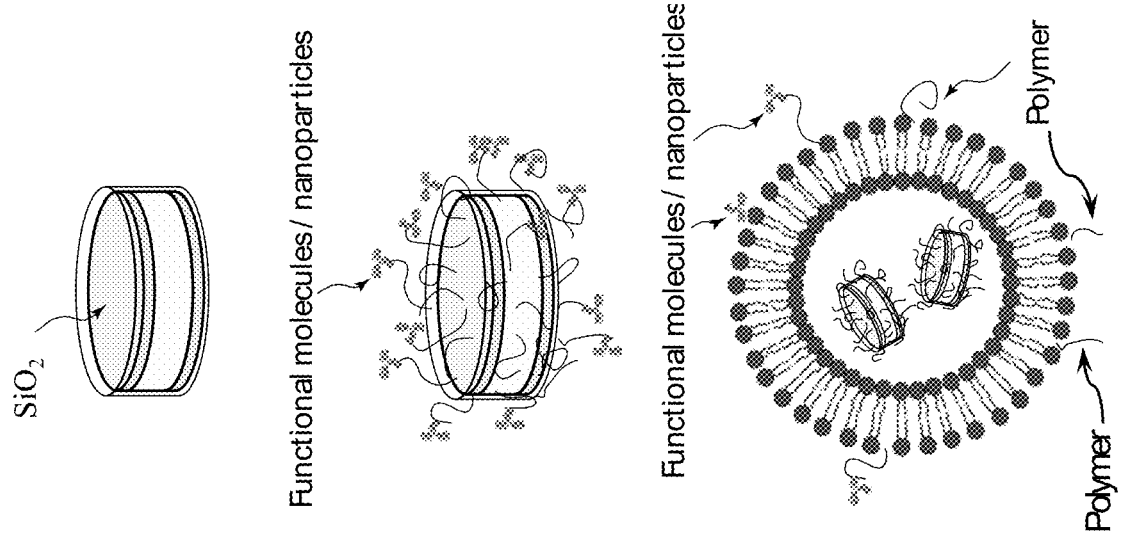
FIG. 24A depicts a preferred embodiment for surface treatment of laser particles to achieve biocompatibility and a strategy for targeted delivery: a semiconductor disk laser (left) and encapsulation with a passivation layer (e.g., $SiO_2$) (right).
FIG. 24B depicts polymer coating (e.g., poly(ethylene glycol)) (left) and optional attachment of functional molecules (right).
FIG. 24C depicts a schematic of liposomal encapsulation of laser particles for systemic delivery, with liposome vehicle (left) and targeted liposome vehicle (right).

Surface coating or surface functionalization with biocompatible polymers, as used in biocompatible quantum dots, can further increase the biocompatibility of laser particles and make them usable in cells and animals for long terms experiments. Laser particles can be coated with such polymers and biocompatible or bio-inert materials (FIG. 24B). Furthermore, bio-recognizing molecules, such as antibodies, proteins, various small molecules, and drugs, as well as inorganic nanoparticles, such as iron oxides, can be attached onto laser particles (FIG. 24B).

Furthermore, laser particles may be encapsulated by liposomes to improve biocompatibility and circulation time (FIG. 24C). The liposome may be further functionalized with biological recognition molecules, such as antibodies, for targeting (FIG. 24C).

Genetically tagged probes are useful, for which we may use hybrid approaches. The target cell group in an animal can be made to over-express certain surface membrane proteins, and the laser particles are coated with their antibodies so that they bind to the cell surface. Second, cells are transfected to produce specific intracellular proteins, and particles are designed to produce a certain emission characteristic only upon binding with the proteins in the target cells.

For biocompatible coating, after the transfer of disks off wafer by immersing in HCl and filtering to remove HCl, we mixed disks (1 million/ml in EtOH) with 0.1 μM MPTMS (3-mercaptopropyl trimethoxysilane) to deposit monolayer of silane on semiconductor surface. Then, $NH_3$, $H_2O$ and TEOS were added to the solution to grow silica shell. The reaction time and TEOS concentration were adjusted to obtain desired silica shell thickness. FIG. 25 shows the SEM images of two InAlGaAs microdisk laser particles coated with silica layers with different thicknesses.

Figure 26:
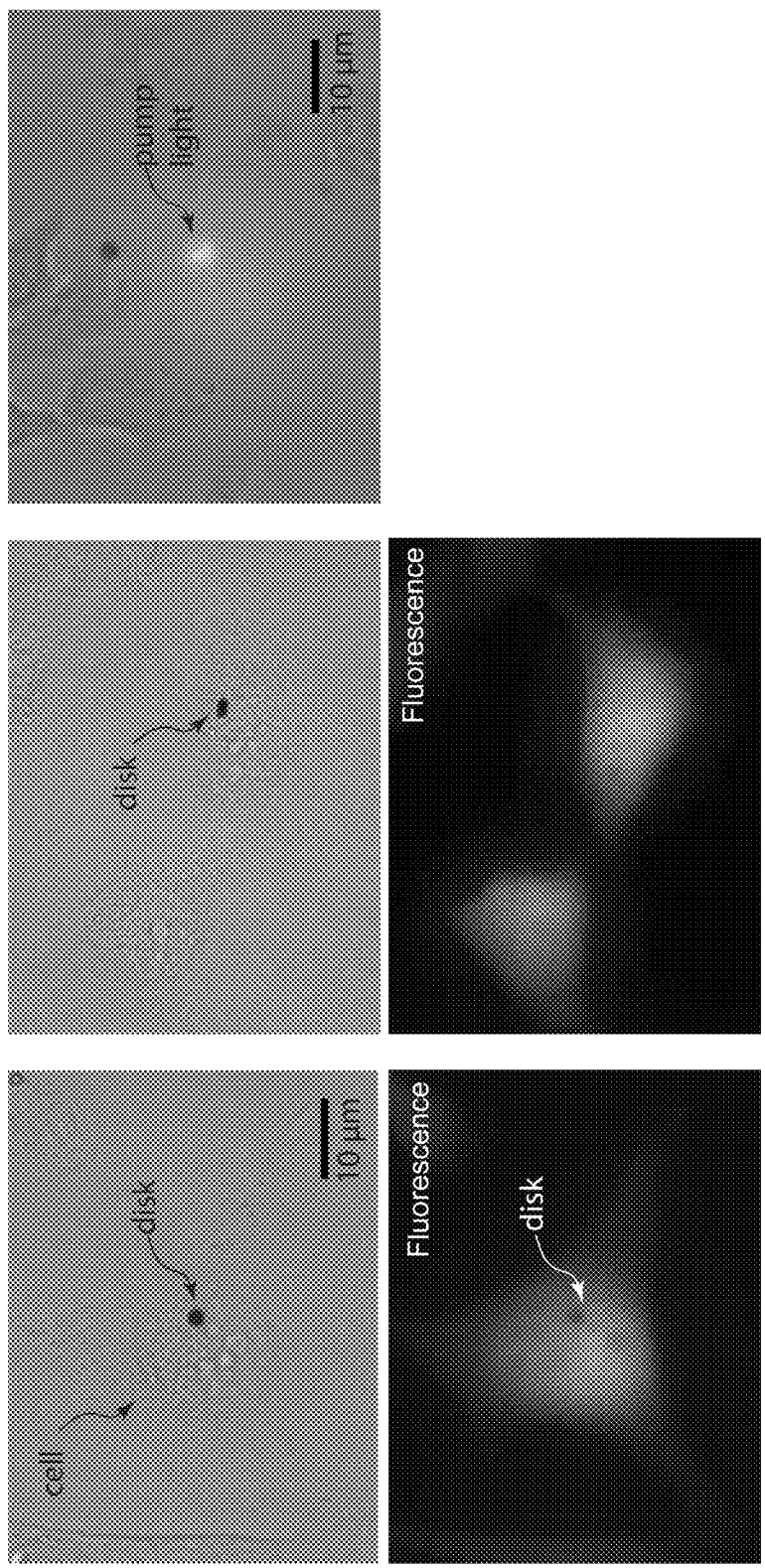
FIG. 26 provides optical images of cells containing example laser particles, in accordance with one or more implementations. Bright field and fluorescence images of GFP-expressing cells are shown. The laser disk is nearly flat along the viewing plane in the first column and tilted from the viewing plane in the second column. In the third column, the bright spot in the microscope image is due to a pump laser beam focused at the region.

Cells were incubated with isolated laser disk particles to internalize them into the cytoplasm. FIG. 26 show various images of HeLa cells with one or two intracellular laser particles in the cytosol outside the nucleus. The number of particles per cell could be varied by controlling the cell density and the concentration of laser particles in cell media ratio, as well as other factors. We found that uncoated or silica-coated laser particles were apparently freely moving inside the cytosol, changing their positions and orientations. We also observed that the radiation force by an optical pump pulse could make the particle to move.

Figure 27:
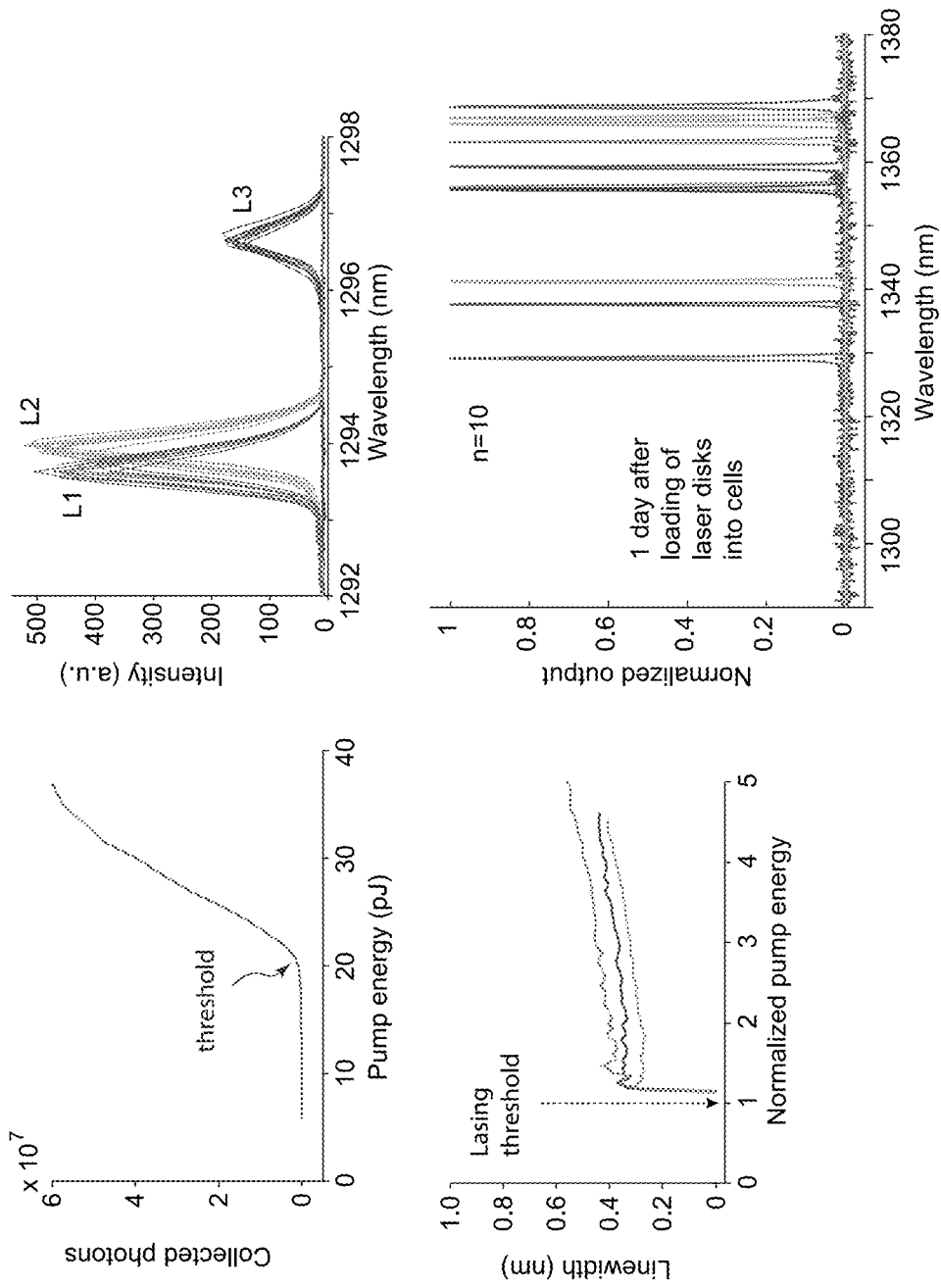
FIG. 27 depicts the characteristics of laser outputs from example laser disk particles in cells in exemplary implementations. At top left, the number of measured photons as a function of the pump energy is shown. The kink in the curve indicates the onset of lasing at a threshold pump energy of about 20 pJ. At top right, output spectra from three laser particles, L1, L2, and L3, measured with a time interval of about 1 hour, are shown. At bottom left, the full-width half-maximum (FWHM) of measured spectra from the three cells as a function of pump energy levels normalized to their respective lasing threshold values is shown. At bottom right, output spectra from 10 different intracellular laser disk particles measured 1 day after they were loaded into different cells are shown.

FIG. 27 shows a typical output-pump-energy curve, stability of the spectra (<1-2 nm), spectral linewidths (0.3-0.6 nm). The narrowband single-peak laser emission from intracellular lasers clearly shows the feasibility of using laser particles for multiplexing and cell tagging (FIG. 27).

Figure 28:
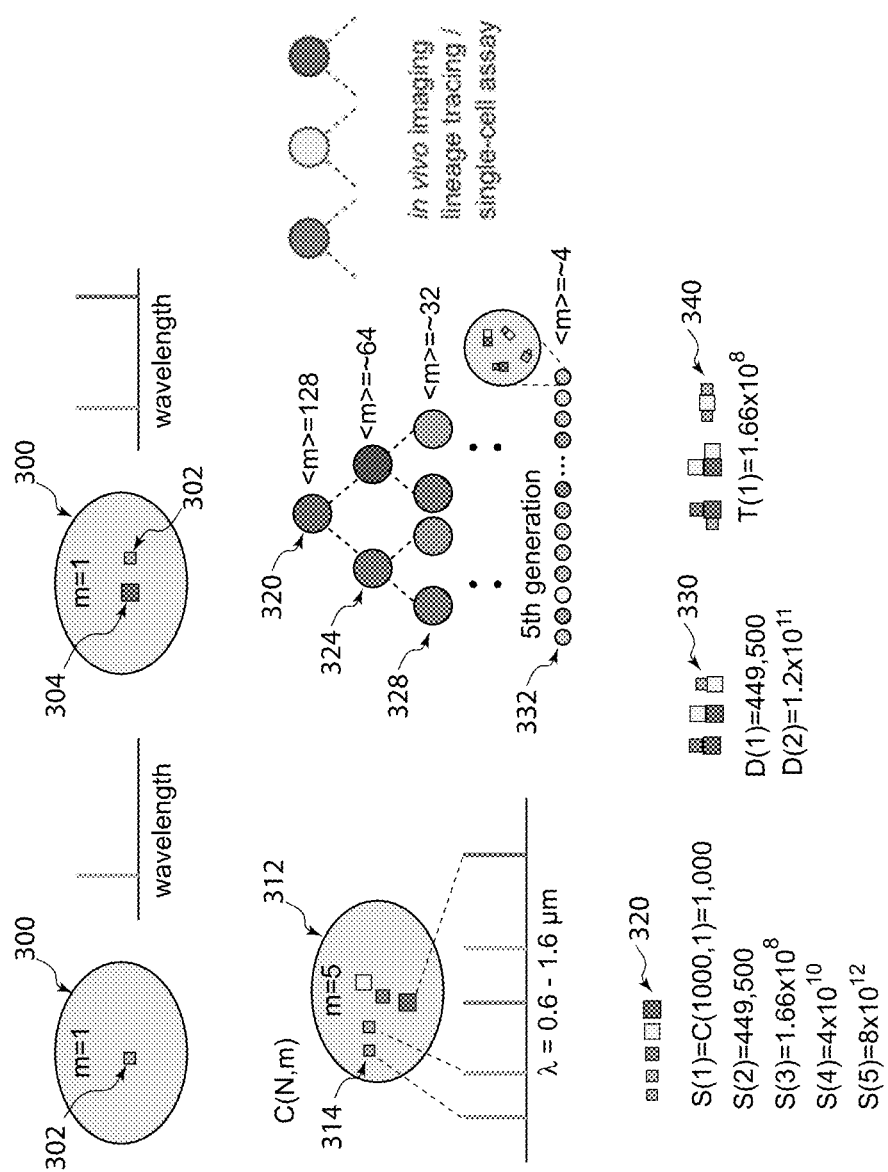
FIG. 28 illustrates principles of cell tagging and tracking based on wavelength division multiplexing of laser particles (squares), in accordance with one or more implementations. A cell containing different numbers of lasers and their output laser lines are depicted. The number of combinations for single laser particles (S; singlet), two-particle duplex (D; doublet), and triplet (T) are illustrated. The number in the parenthesis corresponds to the number, m, of elements per cell. Cells (circles) are traced through their division by tracking the laser probes.

Referring to FIG. 28, consider laser particles, which have spectral widths of less than 1 nm (Q-factor>$10^3$), and their center wavelengths can be anywhere in a wide range over 1000 nm (e.g. 0.6 to 1.6 μm) with a step of 1 nm. There can be one thousand distinctive laser particles filling in one thousand spectral bins (N=1000). When a group of five randomly chosen laser particles are delivered into a cell, the cell is labeled with a unique combination of five laser lines. The number of possible combinations is given by: C(N,m)=N(N−1) . . . (N−m+1)/m!, where m is the number of laser particles per cell. For N=1000 and m=5, we find there are 8 trillion combinations, enough to label the entire cells in a mouse!

Consider two laser particles attached to form a doublet. There are 499,500 (=C(1000,2)=D(1)=S(2)) combinations of doublets. There are 166 million types of triplet lasers (formed by three lasers). These strategies provide virtually an infinite number of labels. A key factor for this massive wavelength-division multiplexing is that N is large. With fluorescence, N is limited to four or 10 at most.

Laser-based tagging allows cell lineage tracing. Initially, cells are loaded each with many particles or large multiplicity of infection, for example, <m>=128 of doublet particles with no overlaps. This allows about 3,500 (D(1)/128) cells to be labeled. Now, these cells divide over time. Since the group of particles is split roughly half and half at each division, after 5th generation there will be on average 4 doublets remaining in a cell. Since the same doublets were only present in their direct ancestors, but not others, it is possible to identify their family tree. By counting the number of particles, the approximate number of passage can also be estimated. The map of proliferation can also be measured.

Figure 29A:
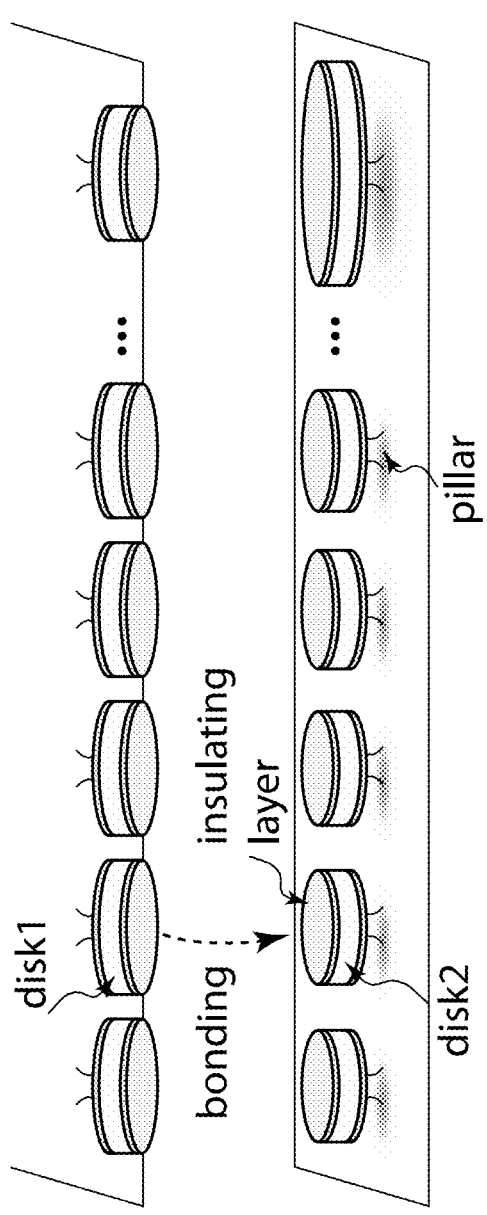
FIG. 29A illustrates an example process to build doublet and triplet particles, in accordance with one or more implementations, depicting bonding of two arrays of laser particles.
Figure 29B:
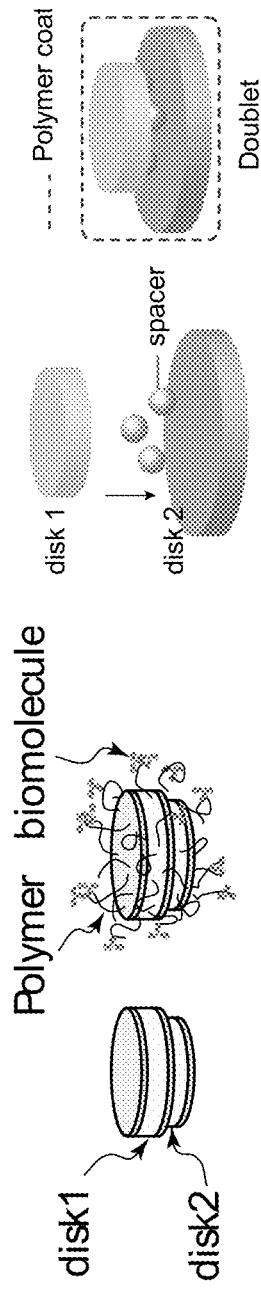
FIG. 29B depicts two doublet particles with biocompatible coating on the doublet particle (left two schematics) and with beads as optically insulating spacers (right two schematics), respectively. The doublets that may be produced by assembly or directly from a multi-layer wafer and further coated with materials such as biocompatible polymers.
Figure 29C:
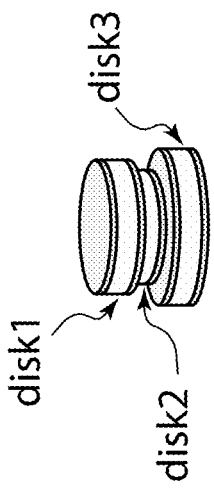
FIG. 29C depicts a schematic of triplet laser particle made of three lasers with dissimilar diameters and different output wavelengths (right), in accordance with one or more implementations.

Doublets and triplets can be formed, taking advantage of the discoidal shape (FIG. 29). There can be many different methods to fabricate doublet and triplets. As one example, an illustration for direct bonding of two semiconductor disks is shown in FIG. 29A. An insulating layer, such as $SiO_2$ layer, may be inserted between disks to avoid optical crosstalk (FIG. 29B). Harvested particles can be further coated with functional molecules or nanoparticles as well as polymers (FIG. 29B).

Alternatively, two laser disks may be coated with two different binding chemicals, such as Tz and TCO click chemistry molecules, respectively, and glued with each other. Another method is to use spacer materials such as polystyrene beads with diameters of 0.3-1 µm. With appropriate chemical glues, doublet (FIG. 29B) and triplet laser particles (FIG. 29C) can be produced.

Besides cell tagging, the ability to observe their proliferation, migrations, and cell-cell and cell-tissue interactions over time in live animals by tracing individual cells would be extremely useful. This is the major advantage over viral labeling techniques, known as DNA barcodes, which cannot be visualized by optical imaging and can be read in vitro only after sacrifice of animal using PCR amplification and sequencing. The laser-tagged cells can be imaged repeatedly in vivo, analyzed by flow cytometry, and sorted for gene profiling and single-cell RNA sequencing. The ability to obtain such comprehensive information from molecular, cellular, tissue, and systems levels over millions to billions of cells in a single animal experiment is unprecedented. It should be noted that the laser probes could be used in conjunction with conventional fluorescence labeling techniques and transgenic reporter mice, as well as DNA barcoding.

Another application area of laser particles is biosensing. Different laser cavities are sensitive to the change in the refractive index change in the surroundings of the cavity, most notably WGM cavities and photonic crystal cavities. Either of these cavities can be operated in lasing regime or just as notch filter to measure the shift in the resonant frequencies. Instead of just measuring the refractive index the surface of the cavity can be functionalized to bind just specific molecules to the surface, in this way specific detection is possible. The WGMs can interact with the environment outside the microsphere through evanescent field. A particle on the surface or near the surface of a microsphere changes the optical path of the light and/or the cavity loss. This causes a shift of the resonant frequencies. The resonating condition in whispering-gallery mode resonator is approximately $2\pi a n_1 = l\lambda$. Here, a is the radius of the resonator, $n_1$ the refractive index, l the mode number, and λ the resonant wavelength of the mode. The attachment of molecules to the surface increases the effective refractive index. The index change alters the resonance wavelength via:

$$\frac{\Delta\lambda}{\lambda} \approx \frac{n_r \Delta n_r}{n_r^2 - 1} = \frac{\alpha_{ex}\sigma}{\varepsilon_0(n_1^2 - n_2^2)a} \quad (44)$$

where $\alpha_{ex}$ is the excess polarizability of the binding molecules, σ is the surface density of the molecules, $\varepsilon_0$ is vacuum perimittivity, $n_1$ and $n_2$ are the refractive indices of the resonator and surrounding medium, respectively. Since the detection of mode shift will be limited by fundamental linewidth of the mode, the smallest surface density can be estimated by using $Q \approx \Delta\lambda/\lambda$. For example, bovine serum albumin (BSA) has $\alpha_{ex}/4\pi\varepsilon_0 = 3.85 \times 10^{-21}$ cm$^3$, and using a 15-µm polystyrene bead ($n_1 = 1.59$) in water ($n_2 = 1.33$) with $Q = 2,000$, a surface density as low as $5.9 \times 10^{12}$ molecules cm$^{-2}$ can be measured, which corresponds to $10^7$ molecules on the surface of the bead.

For example, the Stokes radius of BSA is 3.48 nm, so the effective binding area on the surface of resonator is approximately $3.8 \times 10^{-13}$ cm$^2$. If BSA molecules bind on the surface of 15-µm polystyrene bead without any gap, the total number of BSA is $1.9 \times 10^7$. This can be readily detectable with $Q = 1,000$, and this level of sensitivity is comparable with other label-free methods using surface plasmon resonance.

Spherical microresonators with very high Q-factors are among the most sensitive optical systems. In the case of a microresonator with $Q = 10^8$ and diameter 100 µm the light travels few tens of meters around the sphere and the particle on the surface is sampled more than 100,000 times.

Lasing modes are highly dependent on the geometry of the laser cavity. This can be exploited by making a soft laser cavity and using it as force sensor. Measurement of small forces inside a cell was demonstrated using oil droplet WGM intracellular lasers. When a droplet is subject to uniaxial stress, its shape deforms which is manifested in the emission spectrum as splitting of laser lines. For small forces the shape can be approximated as a spheroid. Lasing is confined to the equatorial plane, which has the lowest optical loss due to minimum curvature. By fitting to a model for non-spherical WGMs, the equatorial and polar semi-axes are calculated giving the average diameter and eccentricity. Flattening stress Δσ is related to the local mean curvature of droplet surface by $\Delta\sigma = 2\gamma\Delta H$, where γ is surface tension and ΔH is the difference in the curvature. For small eccentricity ($\varepsilon^2 \ll 1$) the stress is approximated as $$\Delta\sigma \approx \frac{2\gamma}{a}\varepsilon^2 \quad (45)$$

For example, the lateral stress exerted onto an oil droplet with a diameter of 8 µm in a HeLa cell was measured to be $\Delta\sigma = 500$ pN/µm$^2$ (500 Pa). Due to cellular dynamics the stress changes with time. The mean fluctuation of the internal stress was measured to be ~150 pN/µm$^2$ (Pa). The sensitivity limit of this method determined from the fluctuations in a dead cell is ~20 pN/µm$^2$ (20 Pa), approximately an order of magnitude better than direct image-based analysis.

The force field inside a cell and possibly tissue can also be measured using solid polystyrene beads, however due to their high Young's modulus, the minimum force that can be measured is much higher than the case of droplets. Force was measured during cell uptake of a bead with the minimum measured stress in the order of 100 kPa. The mode splitting due to deformation of the cavity is difficult to separate from the splitting due to local change in the refractive index during bead uptake by the cell.

The sensitivity of resonance peaks to temperature can be estimated from the material properties.

$$\frac{1}{\lambda}\frac{d\lambda}{dT} = \frac{1}{n}\frac{dn}{dT} + \frac{1}{l}\frac{dl}{dT} = \alpha_T + \beta_T \quad (46)$$

where $\alpha_T$ is the coefficient of thermal linear expansion and $\beta_T$ is the coefficient of relative index change of the cavity material. For polystyrene, $\alpha_T \approx 7.5\times10^{-5}$ C.$^{-1}$ and $\beta_T = -8.2\times 10^{-5}$ C.$^{-1}$. Therefore, these two effects almost cancel out each other. Indeed, our measurements show a mode shift of only 3 pm/° C. for a bead immersed in pure water. This corresponds to a diameter error of 60 pm/° C. for a 10 μm bead. This temperature-dependent effect is well within the diameter interval of 2 nm. We note that in mammalian cells in culture or in vivo, the ambient temperature is kept constant at 37° C. within few degrees.

For semiconductors, the contributions of thermal expansion and index change have the same sign. For example, GaAs and InP at 37° C. have $\alpha_T$ of $0.59\times10^{-5}$ C.$^{-1}$ and $0.46\times10^{-5}$ C.$^{-1}$, respectively, and PT at 1.15 μm of $7.8\times 10^{-5}$ C.$^{-1}$ and $7.2\times10^{-5}$ C.$^{-1}$. This yields to a wavelength shift of 60-90 pm/° C. for GaAs and InP lasers.

It is noted that the terms "substantially" (as in substantially different from or substantially the same as), "about," "approximately," etc. relative to specified values may indicate appreciably (or not appreciably) different from, within acceptable manufacturing tolerances, and/or without deviation that would significantly impact intended operational parameters. In certain implementations, acceptable values (that are substantially the same as, substantially different from, about, or approximately a specified value) may have, for example, a +/−1 percent deviation, a +/−5 percent deviation, or a +/−10 percent deviation from the specified value, depending on the specific applications. Other acceptable deviations include, for example, at most 1 percent or at most 5 percent (in the case of substantially the same as, about, or approximately), or at least 5 percent or at least 10 percent (in the case of substantially larger/smaller than).

The present invention has been described in terms of example embodiments, and it should be appreciated that many equivalents, alternatives, variations, additions, and modifications, aside from those expressly stated, and apart from combining the different features of the foregoing versions in varying ways, can be made and are within the scope of the invention. While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the disclosures described herein can be embodied within a form that does not provide all of the features and benefits set forth herein, as some features can be used or practiced separately from others. The scope of certain disclosures disclosed herein is indicated by the appended claims rather than by the foregoing description. All changes which come within the meaning and range of equivalency of the claims are to be embraced within their scope.

The invention claimed is:

1. A microscopy system comprising:
   a pump light source;
   a beam scanner;
   a spectrometer including:
      a resolution of less than 1 nanometer; and
      a spectral acquisition rate of more than 1 kilohertz; and
   a spectral analyzer configured to distinguish spectral peaks of laser output from broadband background due to fluorescence.

2. The microscopy system of claim 1, further comprising a receptacle for receiving a sample containing laser particles.

3. The microscopy system of claim 2, further comprising a sample that contains one or more laser particles each configured to emit a narrowband spectrum.

4. The microscopy system of claim 1, further comprising a computer configured to generate one or more images of a sample based on emission spectra from laser particles contained in the sample.

5. The microscopy system of claim 1, further comprising an arrangement for fluorescence microscopy.

6. The microscopy system of claim 5, wherein the arrangement comprises a light source and a detector configured to detect fluorescence.

7. A flow cytometry system comprising:
   a pump light source;
   a flow channel;
   a spectrometer; and
   a spectral analyzer configured to distinguish spectral peaks of laser output from broadband background due to fluorescence.

8. The flow cytometry system of claim 7, wherein the spectrometer has a resolution of less than 1 nanometer.

9. The flow cytometry system of claim 7, further comprising a receptacle for receiving a sample containing laser particles.

10. The flow cytometry system of claim 7, further comprising a sample that contains one or more laser particles configured to emit narrowband spectra.

11. The flow cytometry system of claim 7, further comprising a computer configured to generate data based on emissions from laser particles contained in a sample.

12. The flow cytometry system of claim 7, further comprising one or more light sources and one or more detectors for fluorescence cytometry.

13. A system comprising:
   a pump light source configured to direct light comprising a predetermined wavelength toward a sample; and
   a detector configured to measure a characteristic of an emission from a laser particle associated with the sample.

14. The system of claim 13, further comprising the laser particle comprising:
   a gain medium including one or more inorganic materials;
   an optical cavity situated about the gain medium, the optical cavity having a refractive index greater than 2; and
   a coating covering at least part of the optical cavity.

15. The system of claim 13, wherein the detector comprises a spectrometer, and
   wherein the system further comprises:
      a spectral analyzer configured to distinguish spectral peaks of laser output from broadband background due to fluorescence.

16. The system of claim 15,
wherein the spectrometer is configured to have:
a resolution of 1 nanometer or less, and
an acquisition rate of more than 1 kilohertz, and
wherein the system further comprises:
a beam scanner.

17. The system of claim 16, further comprising a receptacle for receiving the sample.

18. The system of claim 16, further comprising a computer configured to generate one or more images of the sample based on emission spectra from at least one laser particle contained in the sample.

19. The system of claim 15, further comprising a flow channel.

20. The system of claim 19, further comprising a computer configured to generate flow cytometry data based on emissions from laser particles contained in the sample.

21. The system of claim 15, further comprising a second light source configured to cause fluorescence and a second detector configured to detect fluorescence.

22. The system of claim 21, further comprising
an arrangement for fluorescence microscopy comprising:
the second light source; and
the second detector.

23. The system of claim 21, further comprising
an arrangement for fluorescence cytometry comprising:
the second light source; and
the second detector.

24. The system of claim 13,
wherein the detector comprises an interferometer configured to measure fringes between an injection beam and output from laser particles, and
wherein the system further comprises:
an injection laser configured to control laser particles by injection locking;
a receptacle for receiving a sample containing laser particles.

25. The microscopy system of claim 3, wherein the spectral analyzer is configured to:
receive, over a period of time, a plurality of spectral outputs from the spectrometer, each spectral output indicative of an intensity detected by the spectrometer at each of a plurality of wavelengths;
determine a lifetime of each of a plurality of spectral peaks in the plurality of spectral outputs; and
distinguish one or more spectral peaks due to narrowband emissions from the one or more laser particles from fluorescence based on the respective lifetime of each of the plurality of spectral peaks.

26. The flow cytometry system of claim 9, wherein the spectral analyzer is configured to:
receive, over a period of time, a plurality of spectral outputs from the spectrometer, each spectral output indicative of an intensity detected by the spectrometer at each of a plurality of wavelengths;
determine a lifetime of each of a plurality of spectral peaks in the plurality of spectral outputs; and
distinguish spectral peaks due to narrowband emissions from the laser particles from fluorescence amongst the plurality of spectral peaks based on the respective lifetime of each of the plurality of spectral peaks.

27. The microscopy system of claim 4, wherein the computer is configured to:
identify a plurality of wavelengths associated with the spectral peaks of laser output; and
determine a characteristic associated with each of the laser particles contained in the sample based on the plurality wavelengths.

28. The microscopy system of claim 27, wherein the characteristic associated with the laser particles comprises identifying information of a recognizing molecule associated with each laser particle of the laser particles contained in the sample.

29. The flow cytometry system of claim 11, wherein the computer arrangement is configured to:
identify a wavelength associated with a spectral peak of laser output; and
determine a characteristic associated with a laser particle contained in the sample based on the wavelength, wherein the data comprises characteristics associated with the laser particles contained in the sample.

30. The flow cytometry system of claim 29, further comprising:
a sorting apparatus configured to sort cells associated with the laser particles based on the wavelengths of spectral peaks identified in connection with the cells.

* * * * *

UNITED STATES PATENT AND TRADEMARK OFFICE
CERTIFICATE OF CORRECTION

PATENT NO. : 11,289,879 B2
APPLICATION NO. : 16/895914
DATED : March 29, 2022
INVENTOR(S) : Seok Hyun Yun It is certified that error appears in the above-identified patent and that said Letters Patent is hereby corrected as shown below:

In the Specification

Column 4, Line 6, "pyrromethene" should be --pyromethene--.

Column 16, Line 5, "integer, is" should be --integer, $v_l$ is--.

Column 23, Line 38, "A A.++ e-" should be --A A•+ + e- --.

Column 23, Line 38, "8 + e- 8._" should be --8 + e- 8'- --.

Column 23, Line 39, "A. ++ 8.- A. + 8" should be --A•+ + 8'- A' + 8--.

Column 23, Line 40, "A. A + light" should be --A· A + light--.

Column 34, Line 30, "of/=10-11" should be --of l = 10-11--.

Signed and Sealed this
Twenty-fifth Day of April, 2023

Katherine Kelly Vidal
*Director of the United States Patent and Trademark Office*